(12) United States Patent
Rajashekhar et al.

(10) Patent No.: US 12,219,776 B2
(45) Date of Patent: Feb. 4, 2025

(54) FERROELECTRIC DEVICES INCLUDING A SINGLE CRYSTALLINE FERROELECTRIC LAYER AND METHOD OF MAKING THE SAME

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Kartik Sondhi, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 429 days.

(21) Appl. No.: 17/578,199

(22) Filed: Jan. 18, 2022

(65) Prior Publication Data
US 2023/0232634 A1 Jul. 20, 2023

(51) Int. Cl.
*H10B 51/20* (2023.01)
*H01L 23/48* (2006.01)
(Continued)

(52) U.S. Cl.
CPC ........... *H10B 51/20* (2023.02); *H01L 23/481* (2013.01); *H01L 29/2003* (2013.01); *H01L 29/6684* (2013.01); *H01L 29/78391* (2014.09)

(58) Field of Classification Search
CPC ........ H10B 51/20; H10B 51/30; H10B 51/40; H01L 23/481; H01L 29/2003; H01L 29/6684; H01L 29/78391; H01L 27/0922; H01L 21/823462; H01L 21/8258; H01L 27/088; H01L 2221/6835; H01L 2221/68368; H01L 21/6835; H01L 27/0688; H01L 27/11502; H01L 29/40111;
(Continued)

(56) References Cited

U.S. PATENT DOCUMENTS 6,372,518 B1 4/2002 Nasu et al.
6,582,972 B1 6/2003 Joshi et al.
(Continued)

FOREIGN PATENT DOCUMENTS

CN 108417574 B 8/2018
JP H07-273232 A 10/1995
KR 10-1998-0067045 A 10/1998

OTHER PUBLICATIONS https://technology.discousa.com/solution/sapphire-laser-lift-off/ (Visited Jan. 18, 2022).
(Continued)

*Primary Examiner* — Mohammad A Rahman
(74) *Attorney, Agent, or Firm* — THE MARBURY LAW GROUP PLLC

(57) ABSTRACT

A semiconductor structure includes an active region including a source region, a drain region, and a channel region extending between the source region and the drain region, a gate stack, and a gate dielectric layer located between the gate stack and the active region. The gate stack includes an electrically conductive gate electrode and a single crystalline III-nitride ferroelectric plate located between the electrically conductive gate electrode and the gate dielectric layer, and an entirety of the single crystalline III-nitride ferroelectric plate is single crystalline.

17 Claims, 39 Drawing Sheets

(51) Int. Cl.
  *H01L 29/20* (2006.01)
  *H01L 29/66* (2006.01)
  *H01L 29/78* (2006.01)
(58) Field of Classification Search
  CPC ............... H01L 29/516; H01L 29/7855; H01L 29/66484; H01L 29/66795
  See application file for complete search history.

(56) References Cited

U.S. PATENT DOCUMENTS

| | | | |
|---|---|---|---|
| 10,700,093 | B1 | 6/2020 | Kalitsov et al. |
| 10,957,711 | B2 | 3/2021 | Prasad et al. |
| 11,024,357 | B1 | 6/2021 | Mizusaki et al. |
| 11,107,516 | B1 | 8/2021 | Rabkin et al. |
| 11,527,649 | B1 | 12/2022 | Huang et al. |
| 2002/0110934 | A1 | 8/2002 | Uchiyama et al. |
| 2004/0048455 | A1 | 3/2004 | Karasawa et al. |
| 2004/0101977 | A1 | 5/2004 | Celinska et al. |
| 2006/0049440 | A1 | 3/2006 | Bruchhaus et al. |
| 2006/0281300 | A1 | 12/2006 | Yaegashi |
| 2017/0162250 | A1 | 6/2017 | Slesazeck et al. |
| 2018/0240804 | A1 | 8/2018 | Yoo |
| 2019/0304986 | A1 | 10/2019 | Dong et al. |
| 2020/0105897 | A1 | 4/2020 | Hsu et al. |
| 2020/0203381 | A1 | 6/2020 | Rabkin et al. |
| 2021/0074727 | A1 | 3/2021 | Prasad et al. |
| 2021/0151445 | A1 | 5/2021 | Wagner et al. |
| 2021/0202747 | A1 | 7/2021 | Young et al. |
| 2021/0242225 | A1 | 8/2021 | Manfrini et al. |
| 2021/0242240 | A1 | 8/2021 | Young et al. |
| 2021/0375891 | A1 | 12/2021 | Young et al. |
| 2021/0382933 | A1 | 12/2021 | Li et al. |
| 2021/0391471 | A1 | 12/2021 | Vellianitis |
| 2021/0399137 | A1 | 12/2021 | Wang et al. |
| 2021/0407943 | A1 | 12/2021 | Rajashekhar et al. |
| 2021/0408013 | A1* | 12/2021 | Young .................... H10B 63/84 |
| 2022/0285373 | A1 | 9/2022 | Chen et al. |
| 2023/0106816 | A1* | 4/2023 | Lu .......................... H10B 51/10 257/295 |

OTHER PUBLICATIONS http:/skiathos.physics.auth.gr/elmiclab/en/research.html (visited Jan. 18, 2022).
Zhang, S. et al., "Low Voltage Operating 2D MoS2 Ferroelectric Memory Transistor with Hf1-xZrxO2 Gate Structure," Nanoscale Research Letters (2020), vol. 15, No. 157, pp. 1-9, (2020); https://doi.org/10.1186/s11671-020-03384-z.
Fichtner, S. et al., "Ferroelectricity in AlScN: Switching, Imprint and sub-150 nm Films," *2020 Joint Conference of the IEEE International Frequency Control Symposium and International Symposium on Applications of Ferroelectrics (IFCS-ISAF)*, 2020, pp. 1-4, doi: 10.1109/IFCS-ISAF41089.2020.9234883.
U.S. Appl. No. 16/913,717, filed Jun. 26, 2020, SanDisk Technologies LLC.
U.S. Appl. No. 16/913,766, filed Jun. 26, 2020, SanDisk Technologies LLC.
U.S. Appl. No. 17/406,758, filed Aug. 19, 2021, SanDisk Technologies LLC.
U.S. Appl. No. 17/474,699, filed Sep. 14, 2021, SanDisk Technologies LLC.
U.S. Appl. No. 17/474,760, filed Sep. 14, 2021, SanDisk Technologies LLC.
U.S. Appl. No. 17/562,635, filed Dec. 27, 2021, SanDisk Technologies LLC.
U.S. Appl. No. 17/562,888, filed Dec. 27, 2021, SanDisk Technologies LLC.
USPTO Communication, Notice of Allowance and Fee(s) Due for U.S. Appl. No. 17/578,177, filed Mar. 14, 2024, 14 pages.
Notification of Transmittal of The International Search Report and Written Opinion of the International Searching Authority for International Patent Application No. PCT/US2022/029879, mailed Oct. 20, 2022, 12 pages.
USPTO Communication, Non-Final Office Action for U.S. Appl. No. 17/578,177, filed Oct. 6, 2023, 24 pages.
USPTO Communication, Notice of Allowance and Fee(s) Due for U.S. Appl. No. 17/578,177, filed Feb. 22, 2024, 9 pages.
Dutta, S. et al., "Logic Compatible High-Performance Ferroelectric Transistor Memory," IEEE Electron Device Letters, vol. 43, No. 3, Mar. 2022, pp. 382-385, https://doi.org/10.1109/LED.2022.3148669.
Ferri, K. et al., "Ferroelectrics everywhere: Ferroelectricity in magnesium substituted zinc oxide thin films," J. Appl. Phys. 130, 044101 (2021); https://doi.org/10.1063/5.0053755.
Greenaway, A.L. et al., "Ternary Nitride Materials: Fundamentals and Emerging Device Applications," Annu. Rev. Mater. Res. 2021. 51:591-618, https://doi.org/10.1146/annurev-matsci-080819-012444.
Halter, M. et al., "Back-End, CMOS-Compatible Ferroelectric Field-Effect Transistor for Synaptic Weights," ACS Appl. Mater. Interfaces 2020, 12, 17725-17732, https://pubs.acs.org/action/showCitFormats?doi=10.1021/acsami.0c00877&ref=pdf.
Hayden, J. et al., "Ferroelectricity in boron-substituted aluminum nitride thin films," Physical Review Materials 5, 044412 (2021) DOI: 10.1103/PhysRevMaterials.5.044412.
Liu, X. et al., "Post-CMOS Compatible Aluminum Scandium Nitride/2D Channel Ferroelectric Field-Effect-Transistor Memory," Nano Lett. 2021, 21, 3753-3761, https://pubs.acs.org/action/showCitFormats?doi=10.1021/acs.nanolett.0c05051&ref=pdf.
Pandey, A. et al., "High-efficiency AlGaN/GaN/AlGaN tunnel junction ultraviolet light-emitting diodes," Photonics Research, vol. 8, No. 3, (2020); https://doi.org/10.1364/PRJ.383652.
Ryu, H.Y. et al., "A comparative study of efficiency droop and internal electric field for InGaN blue lighting-emitting diodes on silicon and sapphire substrates," Sci Rep 7, 44814 (2017). https://doi.org/10.1038/srep44814.
Wang, D. et al., "Fully epitaxial, monolithic ScAlN/AlGaN/GaN ferroelectric HEMT," Appl. Phys. Lett. 122, 090601 (2023) https://doi.org/10.1063/5.0143645.
Wang, P. et al., "Fully epitaxial ferroelectric ScAlN grown by molecular beam epitaxy," Appl. Phys. Lett. 118, 223504 (2021) https://doi.org/10.1063/5.0054539.
Wang, D. et al., "Thickness scaling down to 5 nm of ferroelectric ScAlN on CMOS compatible molybdenum grown by molecular beam epitaxy," Appl. Phys. Lett. 122, 052101 (2023) https://doi.org/10.1063/5.0136265.
Yamada, N. et al., "Band Gap-Tunable (Mg, Zn)SnN2 Earth-Abundant Alloys with a Wurtzite Structure," ACS Appl. Electron. Mater. 2021, 3, 4934-4942, https://pubs.acs.org/action/showCitFormats?doi=10.1021/acsaelm.1c00754&ref=pdf.
Yazawa, K. et al., "Reduced coercive field in epitaxial thin film of ferroelectric Wurtzite Al0.7Sc0.3N," Appl. Phys. Lett. 118, 162903 (2021) https://doi.org/10.1063/5.0043613.
Zhu, W. et al., "Strongly temperature dependent ferroelectric switching in AlN, Al1-xScxN, and Al1-xBxN thin films," Appl. Phys. Lett. 119, 062901 (2021) https://doi.org/10.1063/5.0057869.
Rajashekhar, A. et al., "Ferroelectric Devices Including A Single Crystalline Ferroelectric Layer and Method Of Making The Same," U.S. Appl. No. 17/578,177, filed Jan. 18, 2022.

* cited by examiner

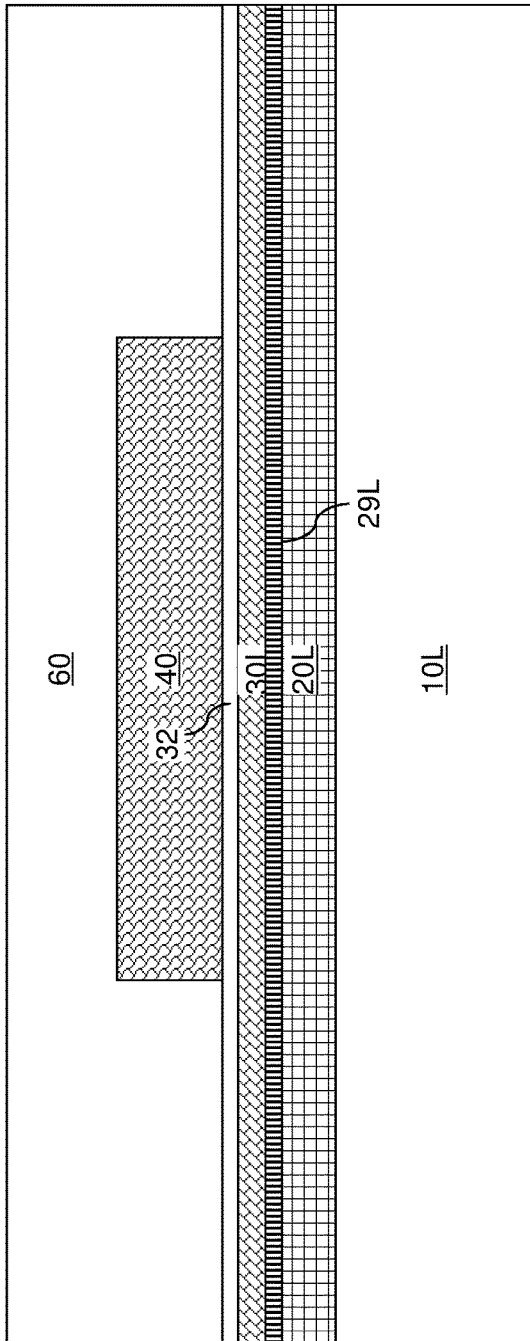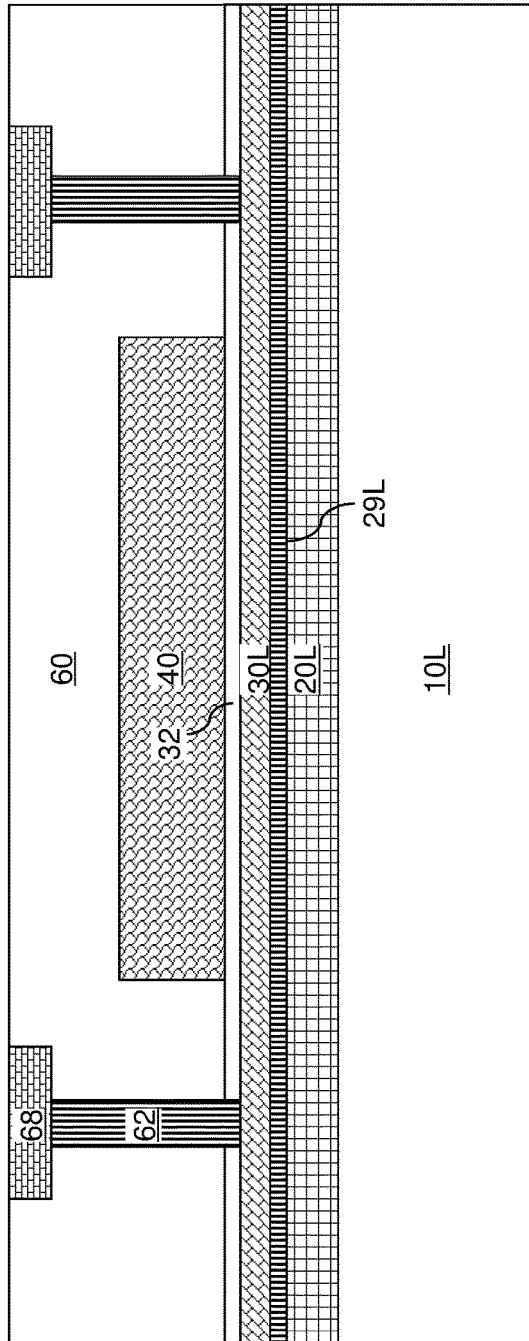

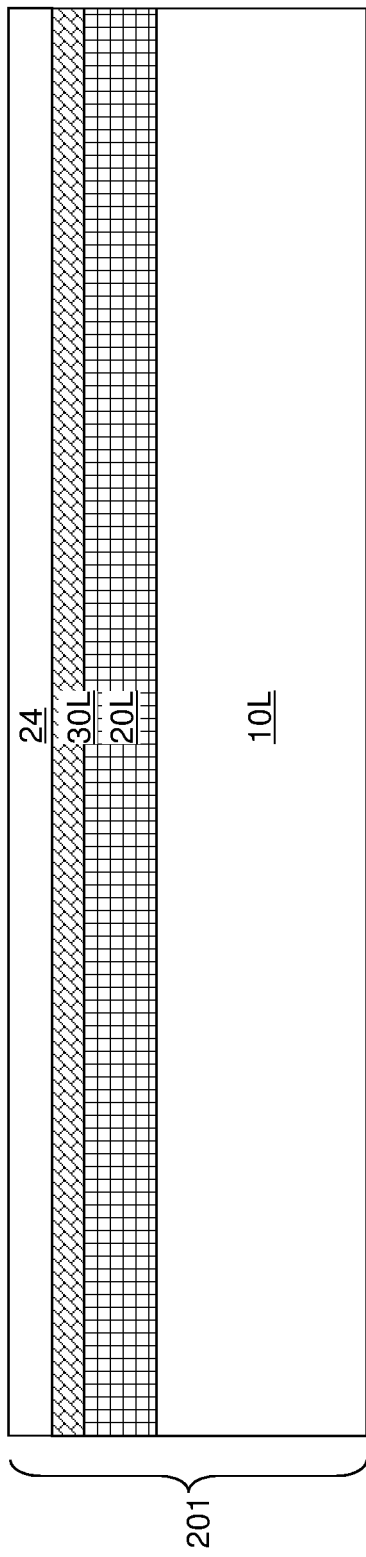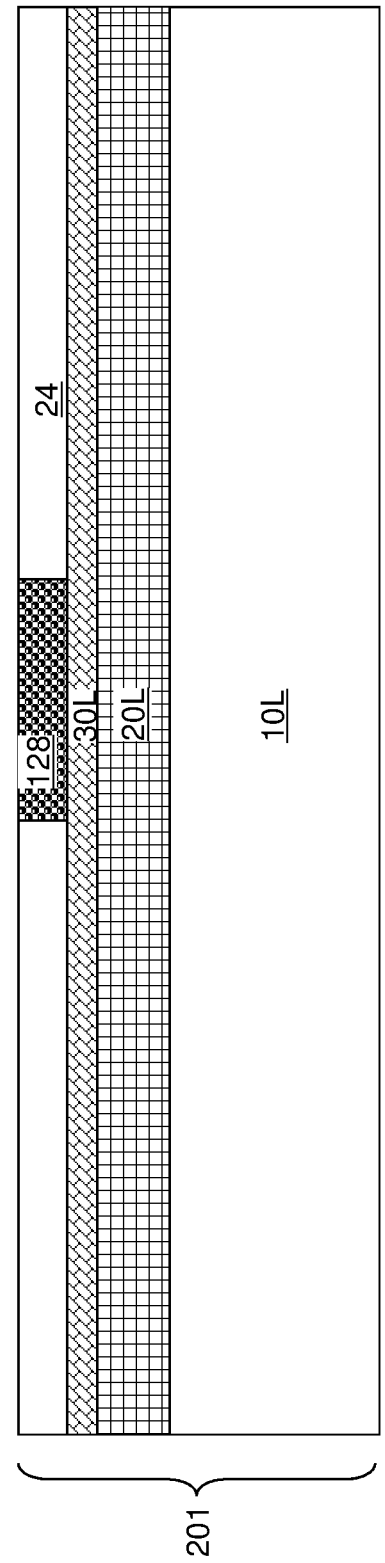

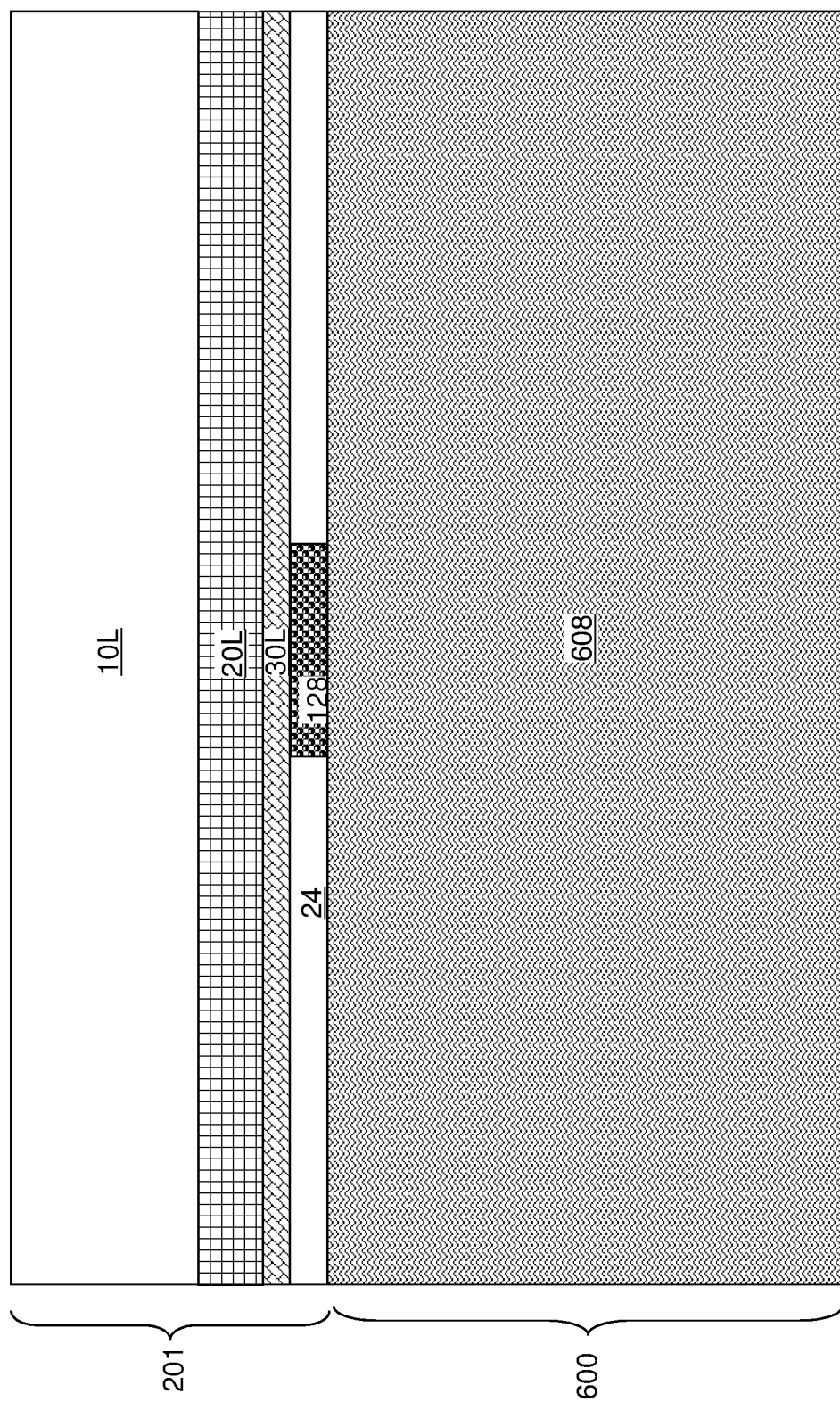

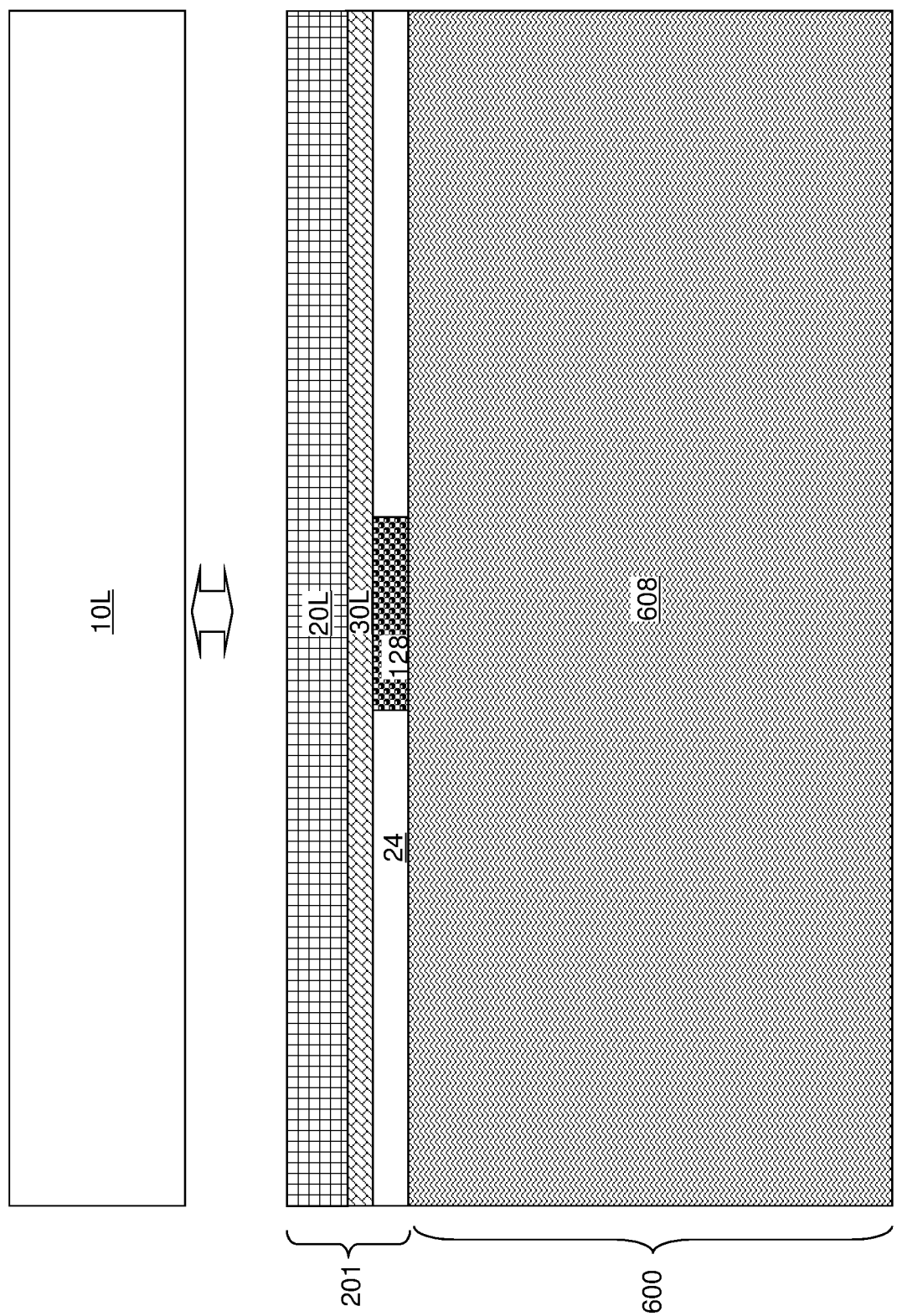

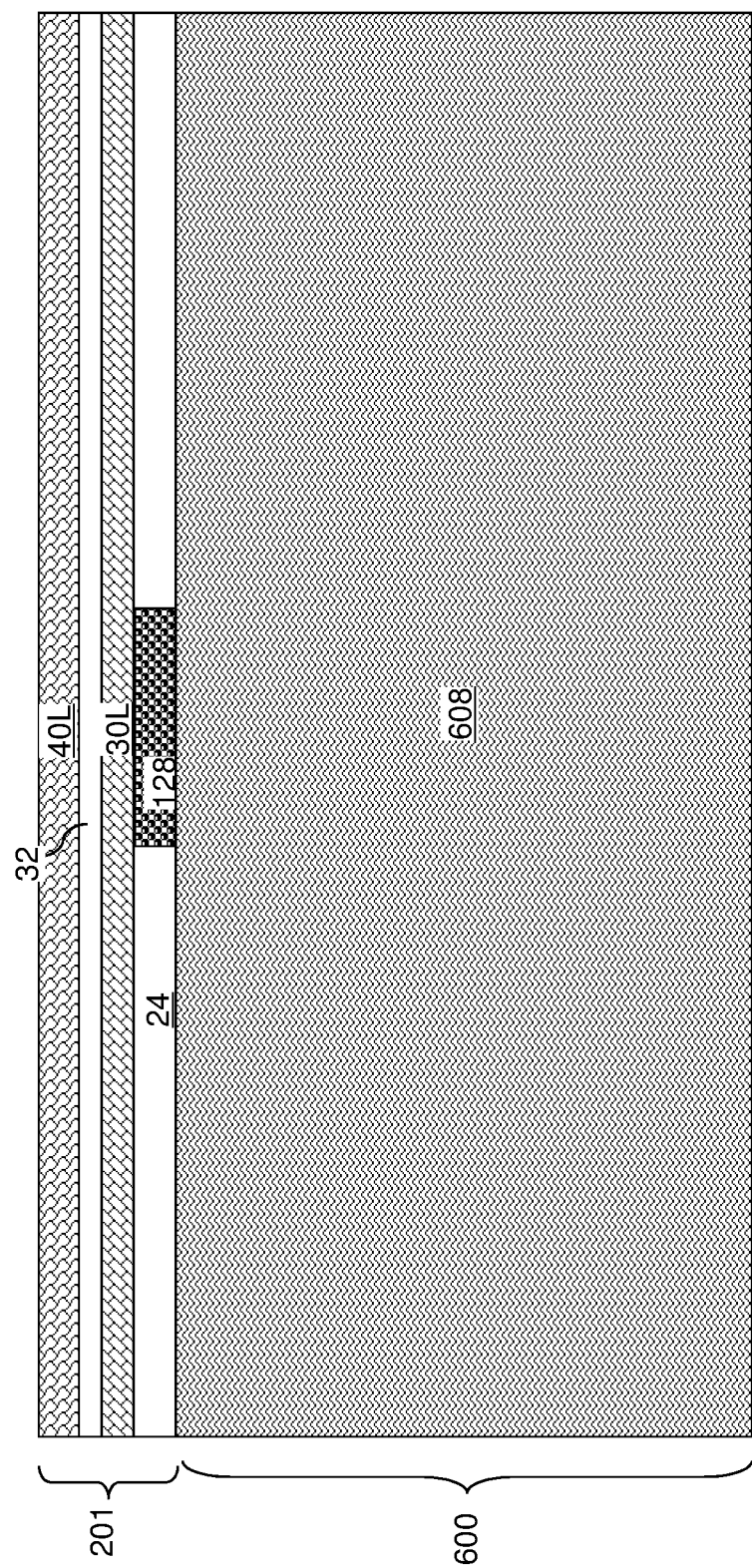

FERROELECTRIC DEVICES INCLUDING A SINGLE CRYSTALLINE FERROELECTRIC LAYER AND METHOD OF MAKING THE SAME

FIELD

The present disclosure relates generally to the field of semiconductor devices, and particularly to ferroelectric devices including a single crystalline ferroelectric layer and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material. A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material.

SUMMARY

According to an embodiment of the present disclosure, a semiconductor structure includes an active region including a source region, a drain region, and a channel region extending between the source region and the drain region, a gate stack, and a gate dielectric layer located between the gate stack and the active region. The gate stack includes an electrically conductive gate electrode and a single crystalline III-nitride ferroelectric plate located between the electrically conductive gate electrode and the gate dielectric layer, and an entirety of the single crystalline III-nitride ferroelectric plate is single crystalline.

According to another embodiment of the present disclosure, a method of forming a semiconductor structure comprises epitaxially growing a single crystalline III-nitride compound semiconductor material layer over a single crystalline carrier substrate, epitaxially growing a single crystalline III-nitride ferroelectric layer in epitaxial alignment with the single crystalline III-nitride compound semiconductor material layer, forming a gate dielectric layer over the single crystalline III-nitride ferroelectric layer, forming an active region including an active region semiconductor material over the gate dielectric layer; forming an electrically conductive gate electrode material layer in proximity to the single crystalline III-nitride ferroelectric layer, the electrically conductive gate electrode material layer being more proximal to the gate dielectric layer than to the active region, and patterning the electrically conductive gate electrode material layer and the single crystalline III-nitride ferroelectric layer into an electrically conductive gate electrode and a single crystalline III-nitride ferroelectric plate, respectively.

According to yet another aspect of the present disclosure, a semiconductor structure comprises an electrically conductive gate electrode embedded within a gate-electrode-level dielectric layer, a layer stack including a single crystalline III-nitride ferroelectric plate, a gate dielectric layer, and an active region overlying the electrically conductive gate electrode, wherein the active region contains a source region, a drain region, and a channel region extending between the source region and the drain region, and a support bonded to the gate-electrode-level dielectric layer.

According to still another aspect of the present disclosure, a method of forming a semiconductor structure comprises epitaxially growing a single crystalline III-nitride compound semiconductor material layer over a single crystalline carrier substrate, epitaxially growing a single crystalline III-nitride ferroelectric layer in epitaxial alignment with the single crystalline III-nitride compound semiconductor material plate, forming an electrically conductive gate electrode over the single crystalline III-nitride ferroelectric layer to form a first semiconductor die, bonding the first semiconductor die to a support; removing the single crystalline carrier substrate and the single crystalline III-nitride compound semiconductor material layer from an assembly comprising the single crystalline III-nitride ferroelectric layer, the electrically conductive gate electrode, and the support, forming a gate dielectric layer and an active region semiconductor material layer over the single crystalline III-nitride ferroelectric layer, and patterning the active region semiconductor material layer into an active region.

BRIEF DESCRIPTION OF THE DRAWINGS

FIG. 7 is a vertical cross-sectional view of the first exemplary structure after deposition of a dielectric matrix layer according to the first embodiment of the present disclosure.

FIG. 8 is a vertical cross-sectional view of the first exemplary structure after formation of connection via structures and first bonding pads and formation of a first semiconductor die according to the first embodiment of the present disclosure.

FIG. 37 is a vertical cross-sectional view of a fourth exemplary structure after formation of a single crystalline III-nitride compound semiconductor material layer, a single crystalline III-nitride ferroelectric layer, and a gate-electrode-level dielectric layer over a single crystalline carrier substrate according to a fourth embodiment of the present disclosure.

FIG. 38 is a vertical cross-sectional view of the fourth exemplary structure after formation of an electrically conductive gate electrode in the gate-electrode-level dielectric layer to provide a first semiconductor die according to the fourth embodiment of the present disclosure.

FIG. 39 is a vertical cross-sectional view of the fourth exemplary structure after bonding a support substrate to the first semiconductor die according to the fourth embodiment of the present disclosure.

FIG. 40 is a vertical cross-sectional view of the fourth exemplary structure after detaching the single crystalline carrier substrate from the single crystalline III-nitride compound semiconductor material layer according to the fourth embodiment of the present disclosure.

FIG. 42 is a vertical cross-sectional view of the fourth exemplary structure after formation of a gate dielectric layer and an active region semiconductor material layer according to the fourth embodiment of the present disclosure.

DETAILED DESCRIPTION

Figure 1:
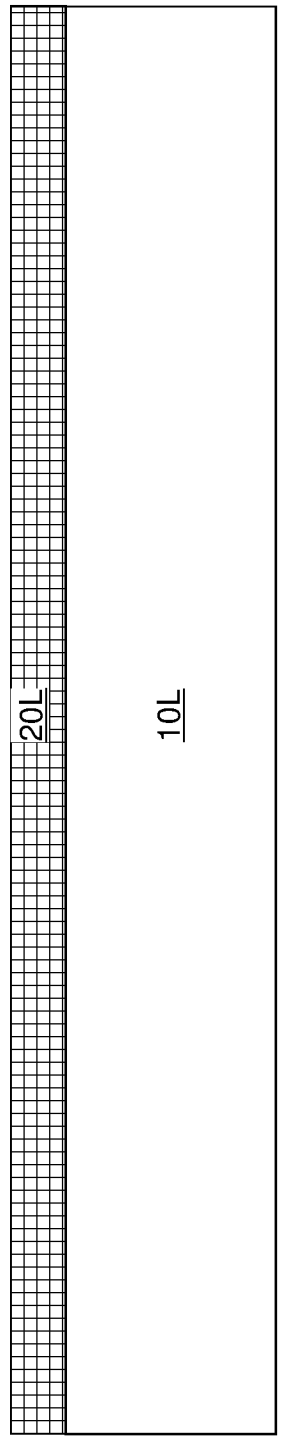
FIG. 1 is a vertical cross-sectional view of a first exemplary structure after epitaxially growing a single crystalline III-nitride compound semiconductor material layer over a single crystalline carrier substrate according to a first embodiment of the present disclosure.

As discussed above, the embodiments of the present disclosure are directed to the field of semiconductor devices, and particularly to ferroelectric devices including a single crystalline Group III-nitride ("III-nitride") ferroelectric layer and methods of manufacturing the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element.

As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

According to an aspect of the present disclosure, ferroelectric memory devices employing a single crystalline III-nitride ferroelectric material layer are provided. The III-nitride ferroelectric material may comprise doped aluminum nitride, where a portion of aluminum is substituted with scandium and/or boron. A single crystalline III-nitride ferroelectric material exhibits improved switching characteristics compared to a polycrystalline III-nitride ferroelectric material because the dipole moments of the single crystalline III-nitride ferroelectric material can be simultaneously switched in a predictable manner under application of external electrical field. In contrast, a polycrystalline III-nitride ferroelectric material inherently generates stochastic switching behavior with a range of external electrical fields that induce transition of dipole moments within each grain. Thus, the device switching characteristics of a ferroelectric memory device including a polycrystalline III-nitride ferroelectric material has inherent stochastic variations. Additionally, a polycrystalline material can potentially give rise to charge leakage along the grain boundaries. Polycrystalline AlN usually adopts a columnar grain microstructure, and hence the defective grain boundaries could act as long and continuous conducting channels.

While a single crystalline III-nitride ferroelectric material can provide superior switching characteristics over a polycrystalline III-nitride ferroelectric material, incorporation of a single crystalline III-nitride ferroelectric material into a memory device is difficult. The embodiment methods of the present disclosure provide substrate transfer schemes which incorporate single crystalline III-nitride ferroelectric material into a ferroelectric memory device.

Referring to FIG. 1, a first exemplary structure according to a first embodiment of the present disclosure is illustrated, which includes a single crystalline carrier substrate 10L and a single crystalline III-nitride compound semiconductor material layer 20L that is formed directly on a top surface of the single crystalline carrier substrate 10L by an epitaxial growth process. The single crystalline carrier substrate 10L may consist essentially of a single crystalline material that can function as a single crystalline growth template for the III-nitride compound semiconductor material of the single crystalline III-nitride compound semiconductor material layer 20L. In an illustrative example, the single crystalline carrier substrate 10L may comprise a commercially available single crystalline c-cut sapphire ($Al_2O_3$) substrate (e.g., sapphire wafer) or a commercially available single crystalline (111) silicon substrate (e.g., silicon wafer). The thickness of the single crystalline carrier substrate 10L may be in a range from 100 microns to 1 mm, although lesser and greater thicknesses may also be employed.

The single crystalline III-nitride compound semiconductor material layer 20L comprises, and/or consists essentially of, a single crystalline III-nitride compound semiconductor material such as GaN, AlN or a III-nitride compound including three or more elements, such as aluminum gallium nitride. If aluminum gallium nitride is used, then it may have a graded composition with a higher gallium content at the interface with the carrier substrate 10L than at the top of layer 20L, and a higher aluminum content at the top of layer 20L than at the interface with the carrier substrate 10L. The single crystalline III-nitride compound semiconductor material can be grown in epitaxial alignment with the single crystalline material of the single crystalline carrier substrate 10L employing an epitaxy process, which may comprise a chemical vapor deposition (CVD), molecular beam epitaxy (MBE), or atomic layer deposition (ALD) process. In one embodiment, the single crystalline III-nitride compound semiconductor material layer 20L comprises a single crystalline gallium nitride layer. The thickness of the single crystalline III-nitride compound semiconductor material layer 20L may be in a range from 50 nm to 2,000 nm, such as from 100 nm to 1,000 nm, although lesser and greater thicknesses may also be employed.

Figure 2:
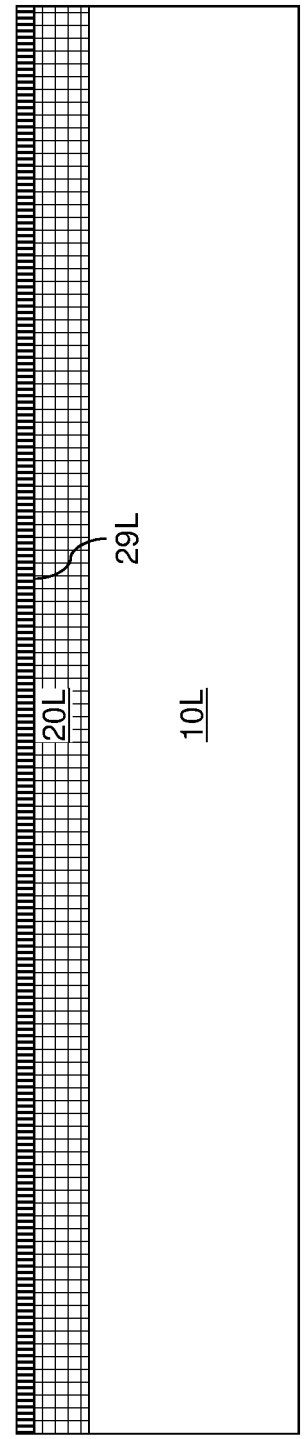
FIG. 2 is a vertical cross-sectional view of the first exemplary structure after formation of an optional single crystalline seed layer according to the first embodiment of the present disclosure.

Referring to FIG. 2, an optional single crystalline seed layer 29L may be optionally formed on the top surface of the single crystalline III-nitride compound semiconductor material layer 20L by performing an epitaxy process. If employed, the single crystalline seed layer 29L includes a single crystalline material that can be grown in epitaxial alignment with the single crystalline III-nitride compound semiconductor material layer 20L. The thickness of the single crystalline seed layer 29L, if present, can be in a range from 5 nm to 1,000 nm, such as from 20 nm to 200 nm, although lesser and greater thicknesses may also be employed.

In one embodiment, the single crystalline seed layer 29L may be a single crystalline metal layer that includes, and/or consists essentially of, an elemental metal that can be grown in epitaxial registry with the III-nitride compound semiconductor material of the single crystalline III-nitride compound semiconductor material layer 20L. In one embodiment, the single crystalline seed layer 29L may consist essentially of an elemental metal selected from molybdenum, tungsten, or platinum.

In another embodiment, the single crystalline seed layer 29L may be an additional single crystalline III-nitride compound semiconductor material layer having a different lattice constant than the single crystalline single crystalline III-nitride compound semiconductor material layer 20L. In one embodiment, the material composition of the single crystalline seed layer 29L may be selected such that the single crystalline seed layer 29L has a greater lattice match (i.e., lesser lattice mismatch) with a single crystalline III-nitride ferroelectric material to be subsequently deposited thereupon than the material of the single crystalline III-nitride compound semiconductor material layer 20L. In one embodiment, the single crystalline seed layer 29L may comprise, and/or may consist essentially of, a single crystalline aluminum nitride layer or a single crystalline aluminum gallium nitride layer, if layer 20L comprises gallium nitride.

Figure 3:
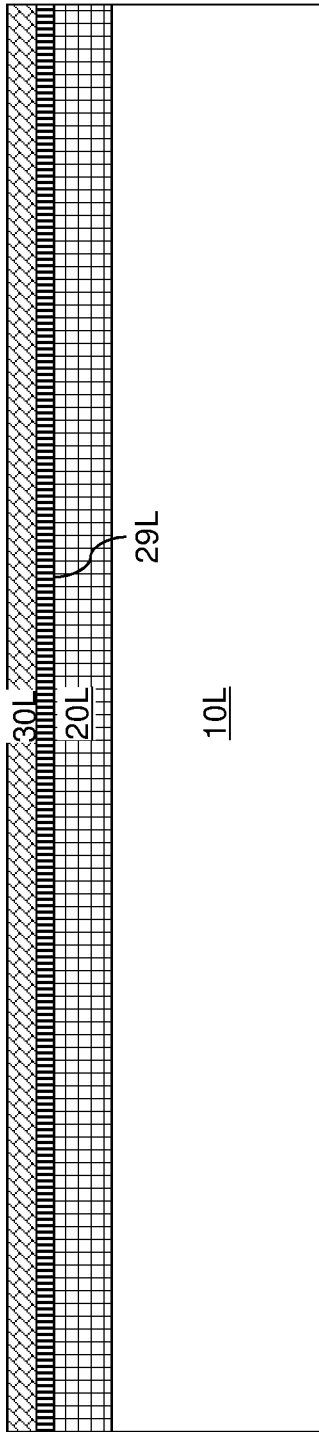
FIG. 3 is a vertical cross-sectional view of the first exemplary structure after epitaxially growing a single crystalline III-nitride ferroelectric layer according to the first embodiment of the present disclosure.

Referring to FIG. 3, a single crystalline III-nitride ferroelectric layer 30L can be grown directly on the top surface of the single crystalline seed layer 29L (if present), or directly on the top surface of the single crystalline III-nitride compound semiconductor material layer 20L (if seed layer 29L is omitted). The single crystalline III-nitride ferroelectric layer 30L can be grown by an epitaxy process in epitaxial alignment with the single crystalline III-nitride compound semiconductor material layer 20L, and in case the single crystalline seed layer 29L is present, in epitaxial alignment within the single crystalline seed layer 29L.

In one embodiment, the single crystalline III-nitride ferroelectric layer 30L consists essentially of a single crystalline III-nitride Wurtzite ferroelectric material that can be epitaxially grown on the single crystalline III-nitride compound semiconductor material or a single crystalline metallic material of the single crystalline seed layer 29L (if present), or directly on the single crystalline III-nitride compound semiconductor material of the single crystalline III-nitride compound semiconductor material layer 20L (if seed layer 29L is omitted). In one embodiment, the single crystalline III-nitride Wurtzite ferroelectric material consists essentially of a material selected from aluminum scandium nitride ("AlScN") or aluminum boron nitride ("AlBN"). In one embodiment, AlScN may have a formula $Al_{1-x}Sc_xN$, where $0.15<x<0.5$, such as $0.2<x<0.45$, and AlBN may have a formula $Al_{1-y}B_yN$, where $0.03<y<0.15$, such as $0.05<y<0.1$. In one embodiment, the single crystalline III-nitride Wurtzite ferroelectric material consists essentially of AlScN. The thickness of the single crystalline III-nitride ferroelectric layer 30L may be in a range from 2 nm to 100 nm, such as from 4 nm to 20 nm, although lesser and greater thicknesses may also be employed.

Figure 4:
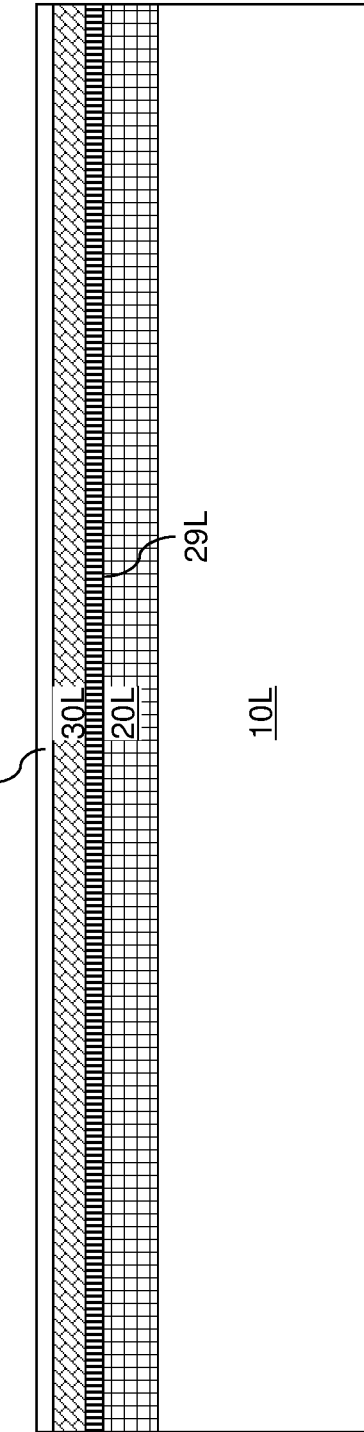
FIG. 4 is a vertical cross-sectional view of the first exemplary structure after formation of a gate dielectric layer according to the first embodiment of the present disclosure.

Referring to FIG. 4, a gate dielectric layer 32 can be deposited on a horizontal top surface of the single crystalline III-nitride ferroelectric layer 30L by depositing a gate dielectric material. The gate dielectric material may comprise silicon oxide, silicon oxynitride, and/or at least one dielectric metal oxide (such as aluminum oxide, a transition metal oxide, or an oxide of a Lanthanide element). The gate dielectric layer 32 may be deposited by chemical vapor deposition, physical vapor deposition, atomic layer deposition, or a combination thereof. The thickness of the gate dielectric layer 32 may be in a range from 1 nm to 20 nm, such as from 1.5 nm to 12 nm and/or from 2 nm to 6 nm, although lesser and greater thicknesses may also be employed.

Figure 5:
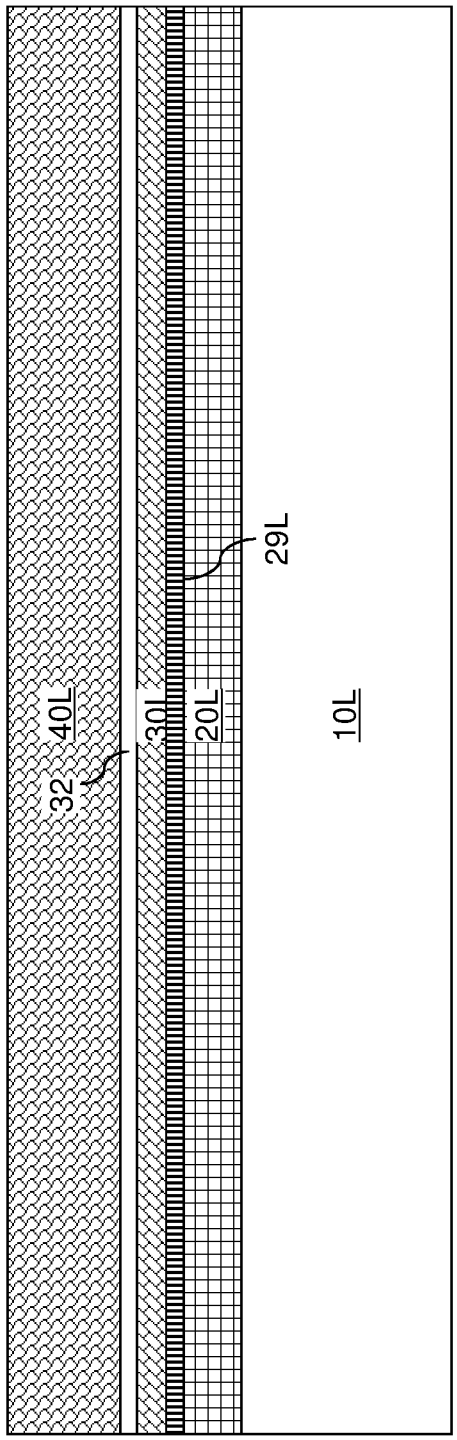
FIG. 5 is a vertical cross-sectional view of the first exemplary structure after formation of an active region semiconductor material layer according to the first embodiment of the present disclosure.

Referring to FIG. 5, an active region semiconductor material layer 40L can be deposited over the gate dielectric layer 32. The active region semiconductor material layer 40L includes a semiconductor material that can be employed for an active region of a field effect transistor. As used herein, an active region refers collectively to a combination of a source region, a drain region, and channel region of a field effect transistor. Specifically, the active region semiconductor material layer 40L may include any semiconductor material that may be employed as a channel material of a field effect transistor.

In one embodiment, the active region semiconductor material layer 40L includes a semiconductor material that is capable of providing electrical conductivity in a range from 1.0 S/m to $1.0 \times 10^5$ S/m upon suitable doping with electrical dopants (which may be p-type dopants or n-type dopants). Exemplary semiconducting materials that may be used for the active region semiconductor material layer 40L include, but are not limited to, silicon, a silicon-germanium alloy, a two-dimensional semiconductor material, a III-nitride compound semiconductor material, a II-V semiconductor material, or a semiconducting metal oxide material. Examples of the III-nitride compound semiconductor material include, but are not limited to, GaN, GaAs or ternary or quaternary compounds thereof. Examples of the two-dimensional semiconductor material include, but are not limited to, molybdenum sulfide or graphite. Examples of the semiconducting metal oxide material include, but are not limited to, indium gallium zinc oxide (IGZO), and various other doped variants derived therefrom. The active region semiconductor material layer 40L may include an amorphous semiconductor material, a polycrystalline semiconductor material or a single crystalline semiconductor material. The active region semiconductor material layer 40L may be deposited by physical vapor deposition or atomic layer deposition. The thickness of the active region semiconductor material layer 40L may be in a range from 2 nm to 500 nm, such as from 10 nm to 200 nm and/or from 30 nm to 100 nm, although lesser and greater thicknesses may also be used.

Figure 6:
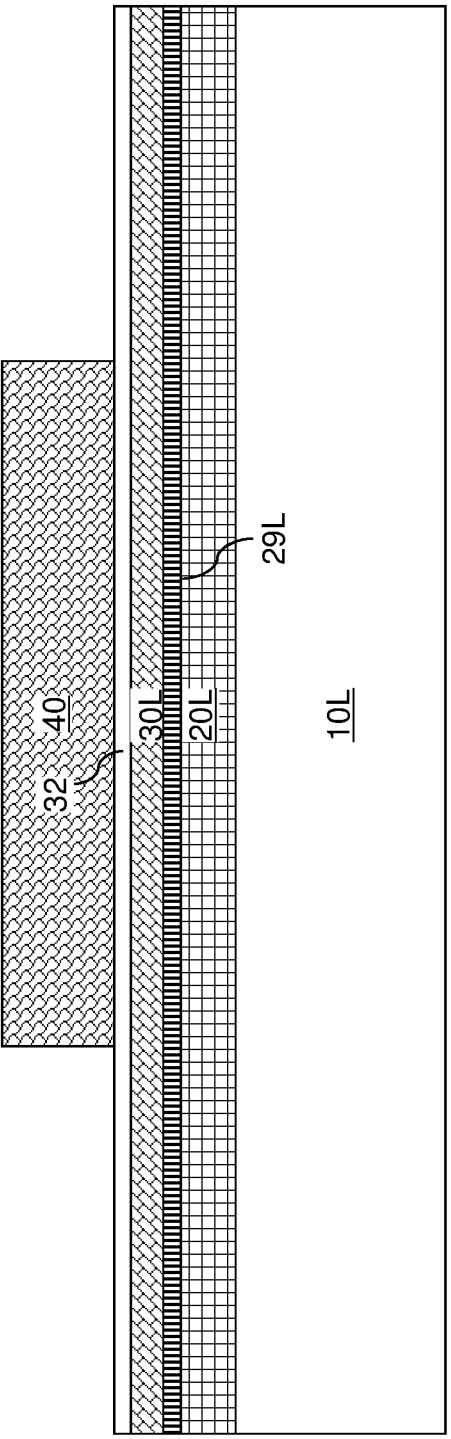
FIG. 6 is a vertical cross-sectional view of the first exemplary structure after patterning the active region semiconductor material layer into an active region according to the first embodiment of the present disclosure.

Referring to FIG. 6, a photoresist layer (not shown) can be applied over the top surface of the active region semiconductor material layer 40L, and can be lithographically patterned to form at least one discrete patterned photoresist material portion. An anisotropic etch process can be performed to transfer the pattern in the photoresist layer through the active region semiconductor material layer 40L. A patterned portion of the active region semiconductor material layer 40L comprises an active region 40. In one embodiment, the active region 40 may have a rectangular shape. The lateral dimensions of the active region 40 may be selected based on the length and the width of a field effect transistor to be subsequently formed. The active region 40 includes an active region semiconductor material, and can be formed over the gate dielectric layer 32. The photoresist layer can be subsequently removed, for example, by ashing.

Referring to FIG. 7, a dielectric material layer can be deposited over the active region 40 to form a dielectric matrix layer 60. The dielectric matrix layer 60 may comprise a self-planarizing semiconductor material such as flowable oxide (FOX), or may comprise a planarizable dielectric material such as undoped silicate glass (e.g., silicon oxide) or a doped silicate glass. The dielectric matrix layer 60 may be formed with a planar horizontal surface (for example, employing a spin coating process), or may be planarized to provide a planar horizontal surface (for example, by performing a chemical mechanical polishing ("CMP") process). The distance between the planar horizontal surface of the dielectric matrix layer 60 and the top surface of the active region 40 may be in a range from 300 nm to 10,000 nm, such as from 600 nm to 5,000 nm, although lesser and greater distances may also be employed.

Referring to FIG. 8, optional connection via structures 62 and first bonding pads 68 can be formed in the dielectric matrix layer 60. For example, via cavities vertically extending through the dielectric matrix layer 60 and the gate dielectric layer 32 can be formed employing a combination of a first lithographic patterning process and a first anisotropic etch process, and pad cavities adjoined to an upper portion of a respective via cavity may be formed employing a combination of a second lithographic patterning process and a second anisotropic etch process. At least one conductive material, such as at least one metallic material, can be deposited in the via cavities and the pad cavities, and excess portions of the at least one conductive material can be removed from above the horizontal plane including the top surface of the dielectric matrix layer 60. Each portion of the at least one conductive material filling a via cavity constitutes a connection via structure 62. Each portion of the at least one conductive material filling a pad cavity constitutes a first bonding pad 68. An array of connection via structures 62 and an array of first bonding pads 68 may be formed in the dielectric matrix layer 60. The first exemplary structure may comprise a first semiconductor die 101 that is configured to be bonded to a support substrate or to another semiconductor die. As will be described in more detail below with regard to the second embodiment, the connection via structures 62 and first bonding pads 68 may be omitted.

Figure 9:
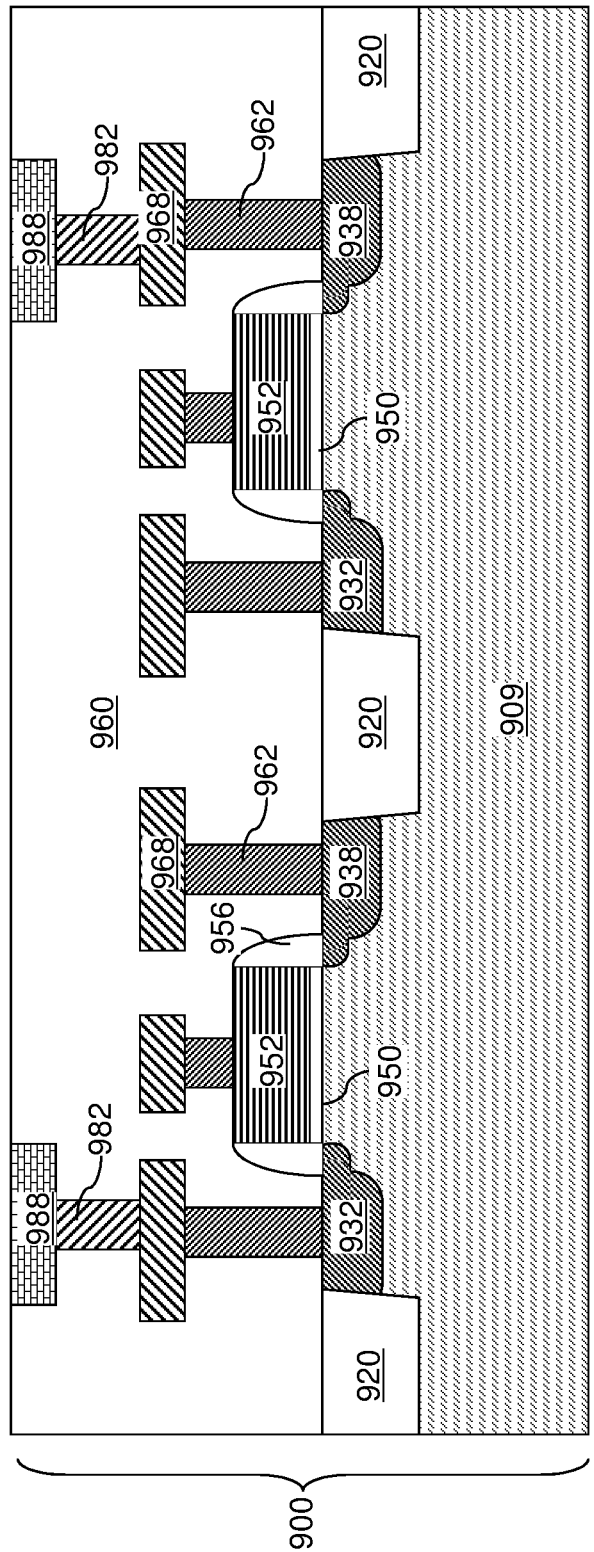
FIG. 9 is a vertical cross-sectional view of a second semiconductor die including semiconductor devices and second bonding pads according to the first embodiment of the present disclosure.

Referring to FIG. 9, a second semiconductor die 900 can be provided. In one embodiment, the second semiconductor die 900 includes semiconductor devices formed on a semiconductor substrate 909. In one embodiment, the semiconductor substrate 909 may comprise a single crystalline semiconductor material, such as a single crystalline silicon. In one embodiment, the semiconductor substrate 909 may comprise a commercially available single crystalline substrate such as a silicon wafer. In one embodiment, the semiconductor substrate 909 may have a thickness in a range from 100 microns to 1 mm.

In one embodiment, a shallow trench isolation structure 920 including a dielectric isolation material such as silicon oxide may be formed in an upper portion of the semiconductor substrate 909. Field effect transistors can be formed on the semiconductor substrate 909. Each field effect transistor may comprise a source region 932, a drain region 938, a gate dielectric 950, and a gate electrode 952, and may optionally comprise a dielectric gate spacer 956. The field effect transistors may be arranged in a CMOS configuration. The field effect transistors may function as driver transistors for the ferroelectric devices memory devices in the first semiconductor die 101. The second semiconductor die 900 may comprise interconnect-level dielectric material layers 960 and metal interconnect structures (962, 968, 982) embedded therein. The metal interconnect structures (962, 968, 982) may comprise metal via structures (962, 982) and metal lines 968. In one embodiment, second bonding pads 988 may be formed in the topmost layer among the interconnect-level dielectric material layers 960. The second semiconductor die 900 may function as a support substrate that is subsequently bonded to the first semiconductor die 101 and provides mechanical support to the first semiconductor die 101.

Figure 10:
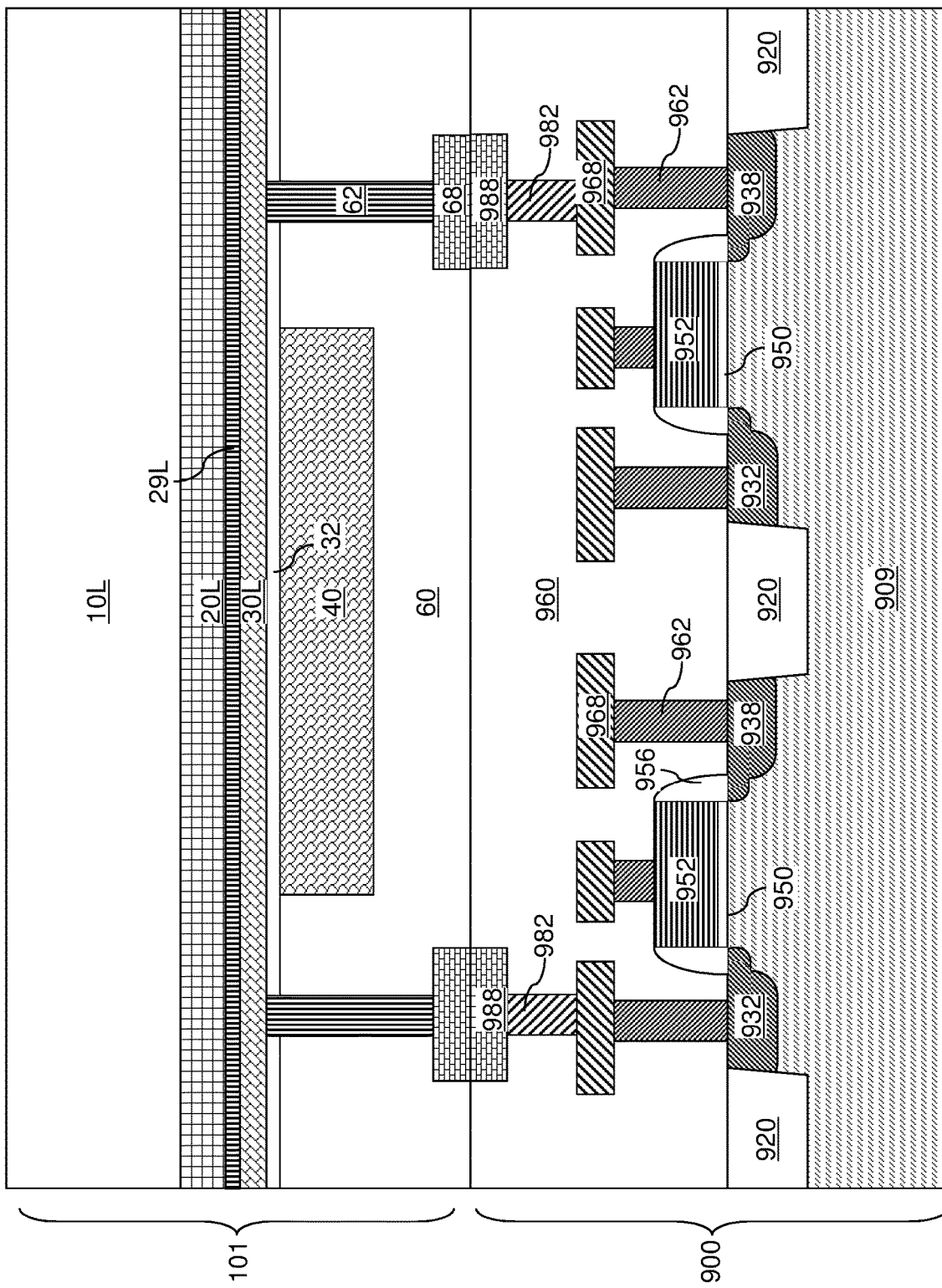
FIG. 10 is a vertical cross-sectional view of the first exemplary structure after bonding the second semiconductor die to the first semiconductor die according to the first embodiment of the present disclosure.

Referring to FIG. 10, the second semiconductor die 900 can be bonded to a support comprising the first semiconductor die 101. In one embodiment, the second bonding pads 988 may be arranged in a mirror image pattern of the pattern of the first bonding pads 68, and the second bonding pads 988 can be bonded to the first bonding pads 68 employing metal-to-metal bonding such as copper-to-copper bonding. The first exemplary structure includes a bonded assembly of the first semiconductor die 101 and the second semiconductor die 900. As will be described below with respect to FIG. 21, in a second embodiment, the first semiconductor die 101 may be bonded to a support comprising a handle substrate instead of to the second semiconductor die 900.

Figure 11:
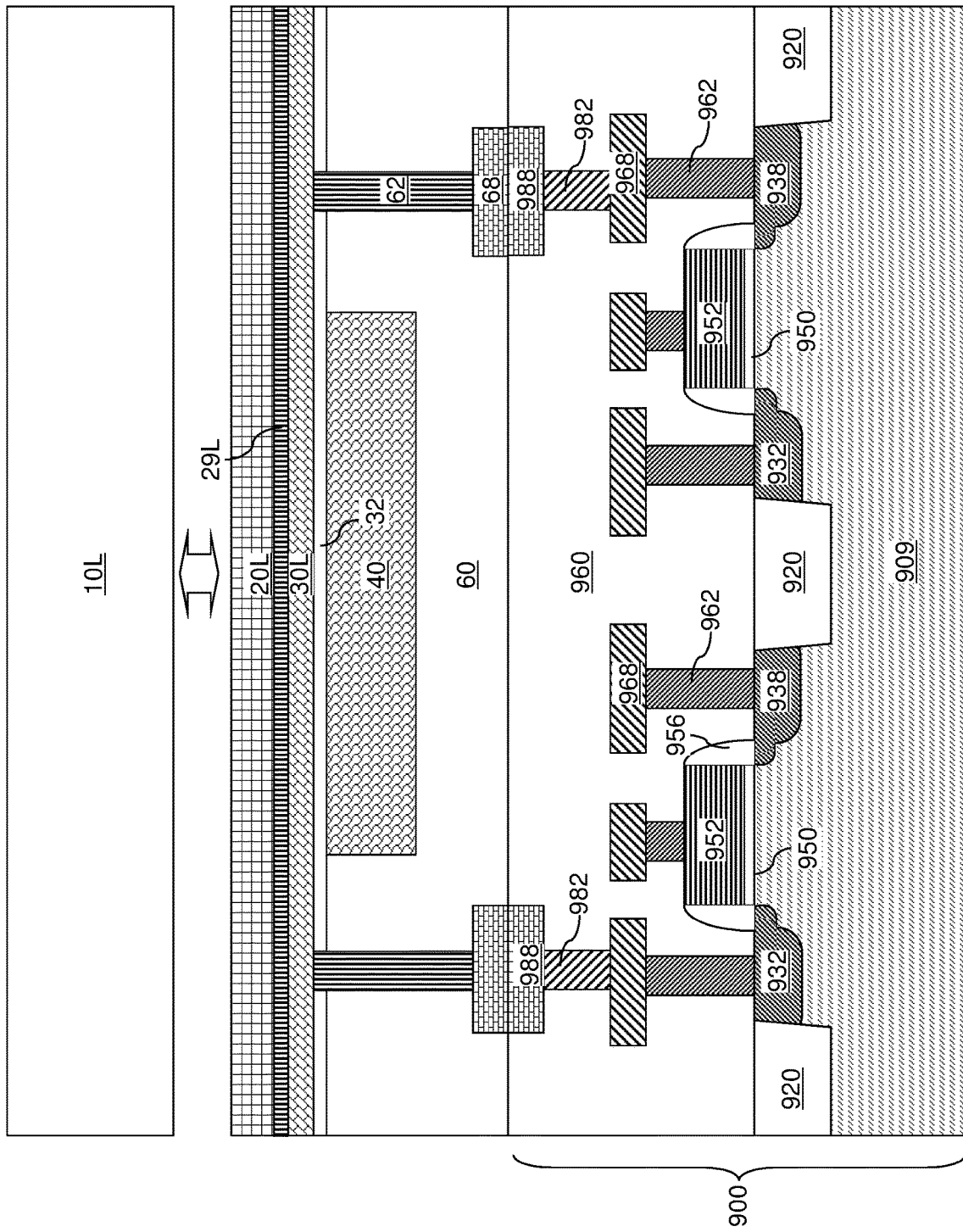
FIG. 11 is a vertical cross-sectional view of the first exemplary structure after detaching the single crystalline carrier substrate from the single crystalline III-nitride compound semiconductor material layer according to the first embodiment of the present disclosure.

Referring to FIG. 11, the single crystalline carrier substrate 10L can be detached from the single crystalline III-nitride compound semiconductor material layer 20L. In one embodiment, laser lift-off process may be used to detach the substrate 10L from layer 20L. In the laser lift-off process, a laser beam that passes through the material of the single crystalline carrier substrate 10L and is absorbed by the material of the single crystalline III-nitride compound semiconductor material layer 20L. The laser beam may ablate and/or melt an interface portion of the single crystalline III-nitride compound semiconductor material layer 20L. The laser irradiation permits detachment of the single crystalline carrier substrate 10L from the remaining portion of the single crystalline III-nitride compound semiconductor material layer 20L. In an illustrative example, the single crystalline carrier substrate 10L may comprise single crystalline sapphire and the single crystalline III-nitride compound semiconductor material layer 20L may comprise gallium nitride, and an ultraviolet laser beam may be irradiated from the backside of the single crystalline carrier substrate 10L through the single crystalline carrier substrate 10L onto a backside interface portion of the single crystalline III-nitride compound semiconductor material layer 20L to ablate and/or melt the backside surface portion of the single crystalline III-nitride compound semiconductor material layer 20L. The single crystalline carrier substrate 10L is detached from the single crystalline III-nitride compound semiconductor material layer 20L either during the laser irradiation or by applying a mechanical separation force after the laser irradiation. In an alternative embodiment, a sacrificial layer may be located between the carrier substrate 10L (e.g., a silicon wafer) and layer 20L. The sacrificial layer may be removed by selective etching to separate the carrier substrate 10L from layer 20L. Generally, the single crystalline carrier substrate 10L can be removed from an assembly including the single crystalline III-nitride compound semiconductor material layer 20L, the active region 40, the dielectric matrix layer 60, and the support substrate (such as the second semiconductor die 900).

Figure 12:
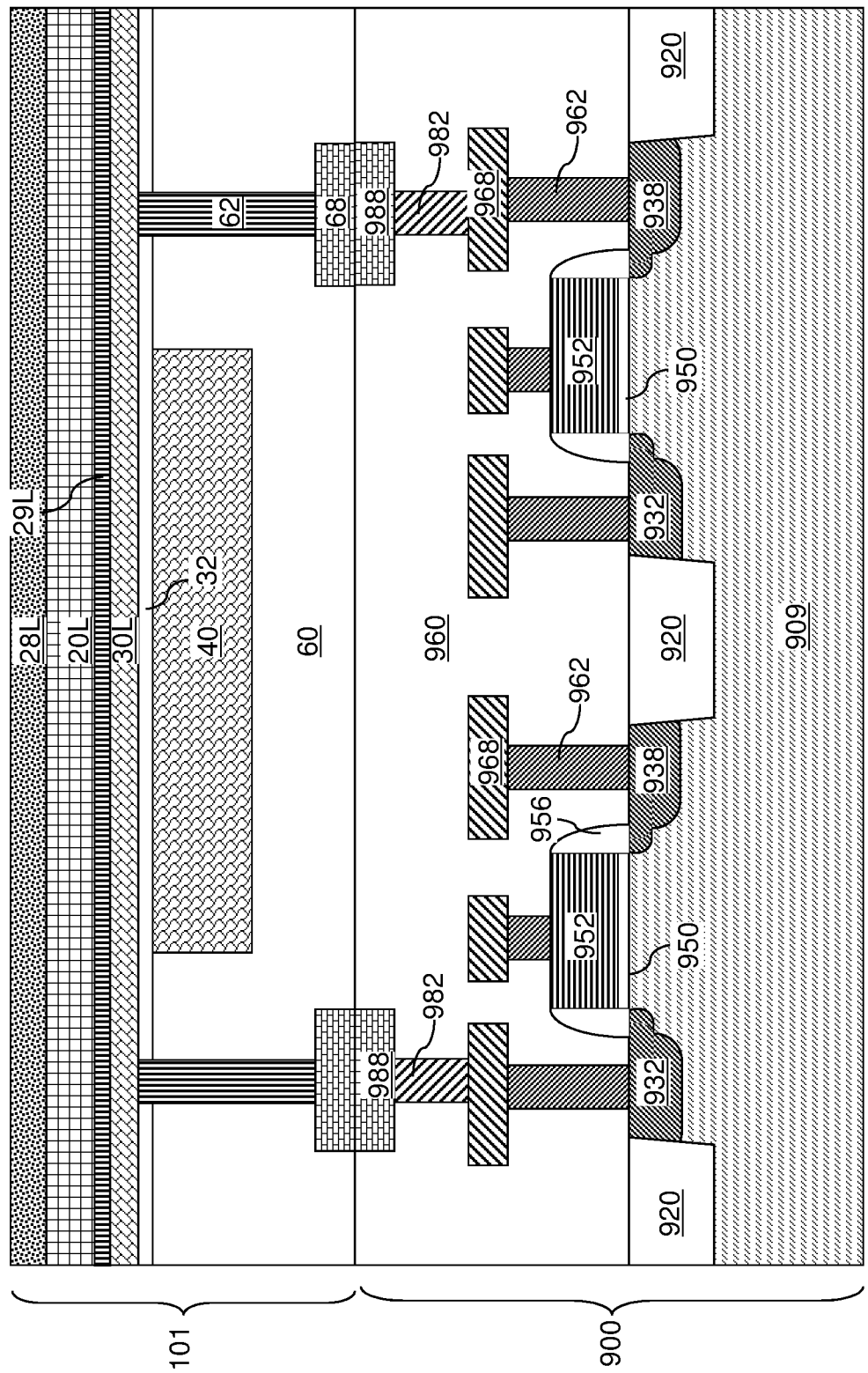
FIG. 12 is a vertical cross-sectional view of the first exemplary structure after formation of an electrically conductive gate electrode material layer according to the first embodiment of the present disclosure.

Referring to FIG. 12, an electrically conductive gate electrode material layer 28L can be formed directly on a physically exposed horizontal surface (which is herein referred to as a distal horizontal surface) of the single crystalline III-nitride compound semiconductor material layer 20L. The electrically conductive gate electrode material layer 28L may comprise a single crystalline, polycrystalline or amorphous electrically conductive material, which may comprise, and/or consist essentially of, an elemental metal, an intermetallic alloy of at least two elemental metals, or a conductive metallic alloy such as TiN, TaN, or WN. The electrically conductive gate electrode material layer 28L may be deposited by physical vapor deposition or chemical vapor deposition. The thickness of the electrically conductive gate electrode material layer 28L may be in a range from 10 nm to 300 nm, such as from 30 nm to 100 nm, although lesser and greater thicknesses may also be employed. Generally, the electrically conductive gate electrode material layer 28L can be formed in proximity to the single crystalline III-nitride ferroelectric layer 30L such that the electrically conductive gate electrode material layer 28L is more proximal to the gate dielectric layer 32 than to the active region 40.

Figure 13:
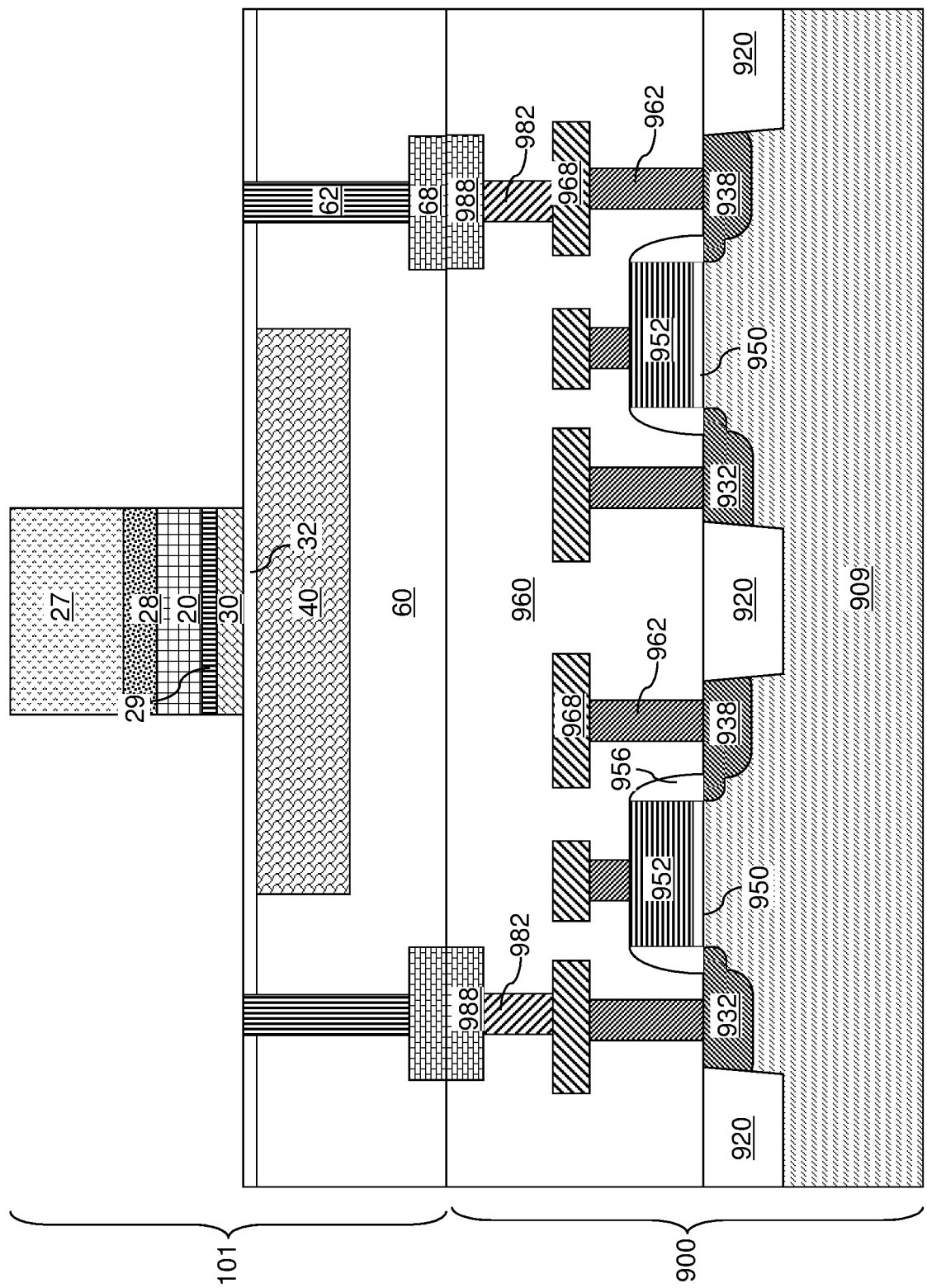
FIG. 13 is a vertical cross-sectional view of the first exemplary structure after patterning a gate stack according to the first embodiment of the present disclosure.

Referring to FIG. 13, a photoresist layer 27 can be applied over the electrically conductive gate electrode material layer 28L, and can be lithographically patterned to form patterned photoresist material portions. One of the patterned photoresist material portions can straddle the active region 40 in the shape of a gate electrode to be subsequently formed. An anisotropic etch process can be performed to sequentially etch through unmasked portions of the electrically conductive gate electrode material layer 28L, the single crystalline III-nitride compound semiconductor material layer 20L, the optional single crystalline seed layer 29L, and the single crystalline III-nitride ferroelectric layer 30L. In one embodiment, the final step of the anisotropic etch process may etch the material of the single crystalline III-nitride ferroelectric layer 30L selective to the material of the gate dielectric layer 32.

A patterned portion of the electrically conductive gate electrode material layer 28L comprises an electrically conductive gate electrode 28. A patterned portion of the single crystalline III-nitride compound semiconductor material layer 20L comprises a single crystalline III-nitride compound semiconductor material plate 20. A patterned portion of the single crystalline seed layer 29L comprises a single crystalline seed plate 29, which is an optional component. A patterned portion of the single crystalline III-nitride ferroelectric layer 30L comprises a single crystalline III-nitride ferroelectric plate 30.

A gate stack (30, 29, 20, 28) can be formed over the gate dielectric layer 32. The gate stack may comprise, from bottom to top, a single crystalline III-nitride ferroelectric plate 30, an optional single crystalline seed plate 29, a single crystalline III-nitride compound semiconductor material plate 20, and an electrically conductive gate electrode 28. Sidewalls of each layer within the gate stack (30, 29, 20, 28) can be vertically coincident, i.e., may be located within a same set of vertical planes. In other words, sidewalls of the single crystalline III-nitride ferroelectric plate 30, sidewalls of the single crystalline seed plate 29, sidewalls of the single crystalline III-nitride compound semiconductor material plate 20, and sidewalls of the electrically conductive gate electrode 28 may be located within a same set of vertical planes.

Figure 14:
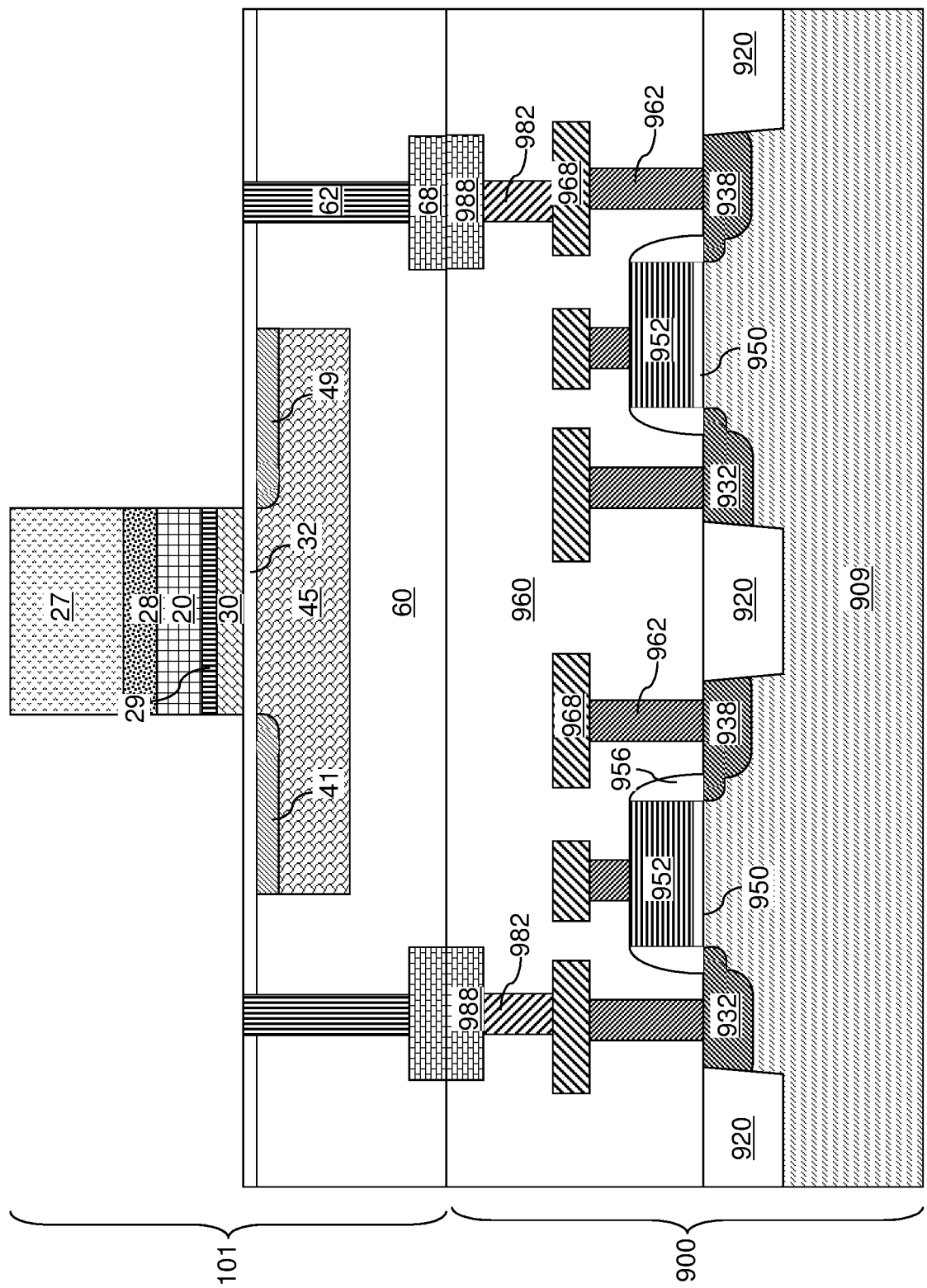
FIG. 14 is a vertical cross-sectional view of the first exemplary structure after formation of source/drain extension regions according to the first embodiment of the present disclosure.

Referring to FIG. 14, electrical dopants (i.e., p-type dopants or n-type dopants) can be implanted into unmasked surface portions of the active region 40. In one embodiment, the active region 40 as provided at the processing steps of FIG. 6 may include dopants of a first conductivity type at a dopant concentration in a range from $1.0 \times 10^{14}/cm^3$ to $3.0 \times 10^{17}/cm^3$, and the implanted dopants may have a doping of a second conductivity type that is the opposite of the first conductivity type. The implanted portions of the active region 40 may comprise a source extension region 41 and a drain extension region 49 having a doping of the second conductivity type. The source extension region 41 and the drain extension region 49 may include dopants of the second conductivity type at an atomic concentration in a range from $1.0 \times 10^{18}/cm^3$ to $3.0 \times 10^{20}/cm^3$, although lesser and greater atomic concentrations may also be employed. The unimplanted portion of the active region 40 comprises a channel region 45. The photoresist layer 27 can be subsequently removed, for example, by ashing. Optionally, a hard mask layer (e.g., silicon oxide or silicon nitride layer) may be located under the photoresist layer 27 to prevent ions from being implanted into the gate stack.

Figure 15:
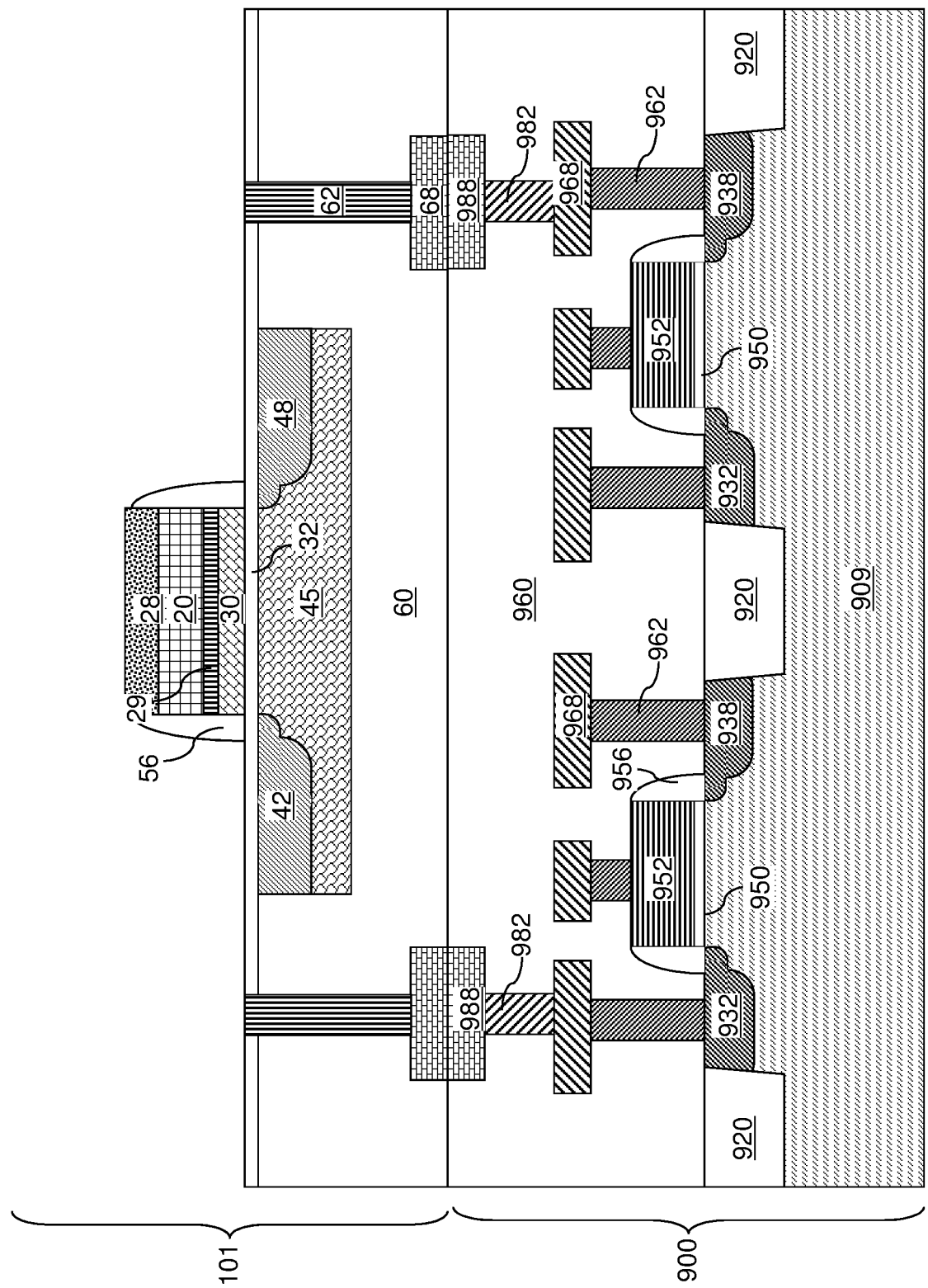
FIG. 15 is a vertical cross-sectional view of the first exemplary structure after formation of a gate spacer, a source region, a drain region, and a channel region according to the first embodiment of the present disclosure.

Referring to FIG. 15, a dielectric spacer material layer can be conformally deposited over the gate stack (30, 29, 20, 28) and the gate dielectric layer 32, and can be anisotropically etched to form a dielectric gate spacer 56 around the gate stack (30, 29, 20, 28). The dielectric gate spacer 56 may comprise silicon oxide, silicon nitride, a dielectric metal oxide, or a combination thereof. The maximum lateral thickness of the dielectric gate spacer 56 (as measured at the bottom surface of the dielectric gate spacer 56) may be in a range from 3 nm to 200 nm, such as from 10 nm to 100 nm, although lesser and greater lateral thicknesses may also be employed.

Additional dopants of the second conductivity type may be implanted into portions of the active region 40 that are not masked by the gate stack (30, 29, 20, 28) or the dielectric gate spacer 56. Deep source/drain regions can be formed in the implanted portions of the active region 40. The deep source/drain regions may include a deep source region that combines with the source extension region 41 to form a source region 42, and a deep drain region that combines with the drain extension region 49 to form a drain region 48. The maximum dopant concentration of dopants of the second conductivity type in the source region 42 and the drain region 48 may be the same as the maximum dopant concentration in the deep source region and the deep drain region, and may be in a range from $1.0 \times 10^{19}/cm^3$ to $3.0 \times 10^{21}/cm^3$, although lesser and greater maximum atomic concentrations may also be employed.

Figure 16:
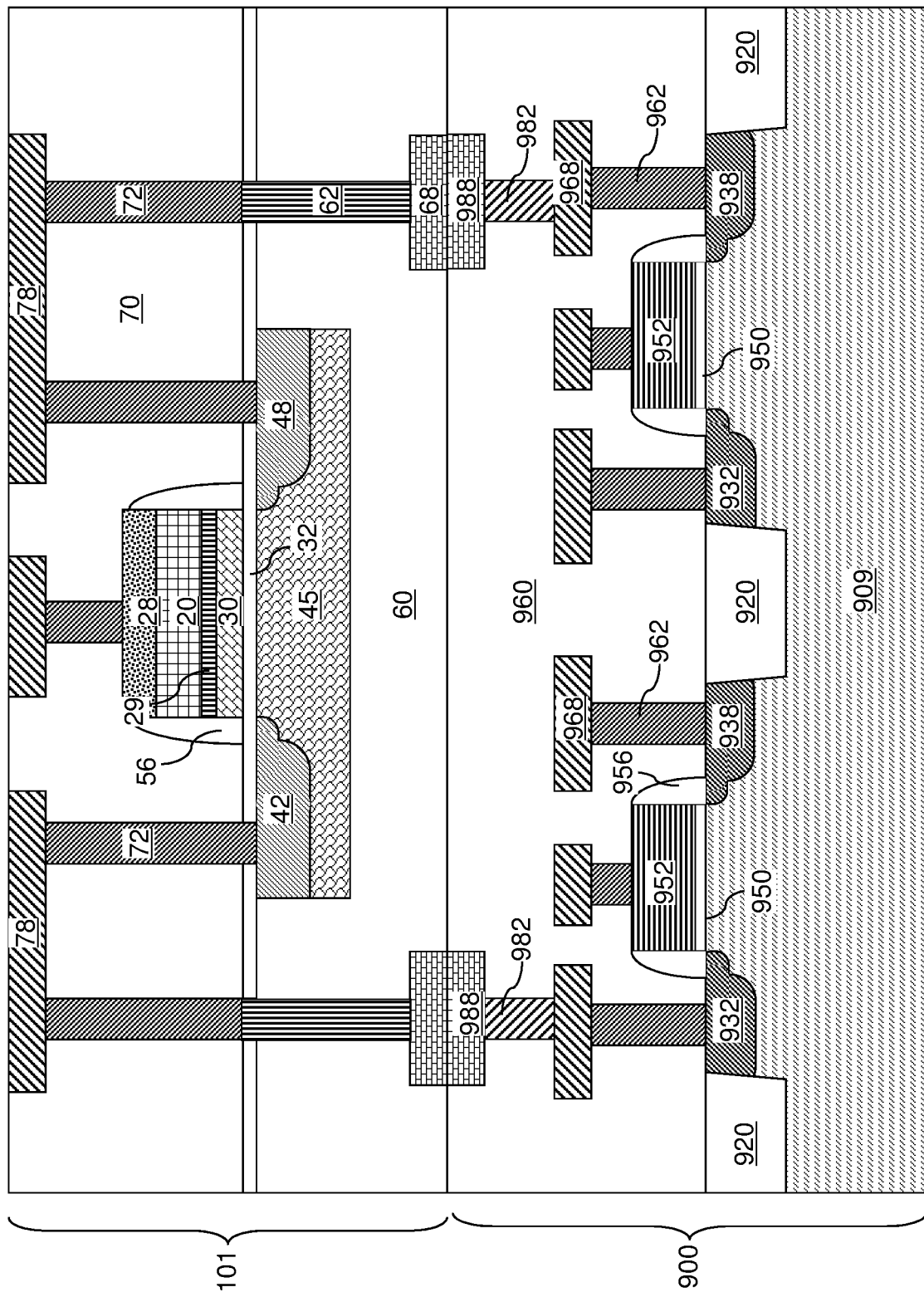
FIG. 16 is a vertical cross-sectional view of the first exemplary structure after formation of a contact-level dielectric layer and various metal interconnect structures according to the first embodiment of the present disclosure.

Referring to FIG. 16, a dielectric material layer can be deposited over the gate stack (30, 29, 20, 28) to form a contact-level dielectric layer 70. The contact-level dielectric layer 70 may comprise a self-planarizing semiconductor material such as flowable oxide (FOX), or may comprise a planarizable dielectric material such as undoped silicate glass or a doped silicate glass. The contact-level dielectric layer 70 may be formed with a planar horizontal surface (for example, employing a spin coating process), or may be planarized to provide a planar horizontal surface (for example, by performing a chemical mechanical polishing process). The distance between the planar horizontal surface of the contact-level dielectric layer 70 and the top surface of the active region 40 may be in a range from 100 nm to 1,000 nm, such as from 200 nm to 600 nm, although lesser and greater distances may also be employed.

Contact via structures 72 and metal lines 78 can be formed in the contact-level dielectric layer 70. For example, via cavities vertically extending through the contact-level dielectric layer 70 and the gate dielectric layer 32 can be formed employing a combination of a first lithographic patterning process and a first anisotropic etch process, and line cavities adjoined to an upper portion of a respective via cavity may be formed employing a combination of a second lithographic patterning process and a second anisotropic etch process. In one embodiment, a subset of the via cavities may be formed such that top surfaces of the connection via structures 62 are physically exposed at the bottom of each via cavity within the subset of the via cavities. At least one conductive material, such as at least one metallic material, can be deposited in the via cavities and the line cavities, and excess portions of the at least one conductive material can be removed from above the horizontal plane including the top surface of the contact-level dielectric layer 70. Each portion of the at least one conductive material filling a via cavity constitutes a contact via structure 72. Each portion of the at least one conductive material filling a line cavity constitutes a metal line 78. Contact via structures 72 and metal lines 78 may be formed in the contact-level dielectric layer 70.

The first exemplary structure comprises a semiconductor structure including a ferroelectric field effect transistor. The semiconductor structure comprises an optional single crystalline seed plate 29 interposed between, and in epitaxial alignment with each of, the single crystalline III-nitride ferroelectric plate 30 and the single crystalline III-nitride compound semiconductor material plate 20.

In one embodiment, the single crystalline seed plate 29 comprises a single crystalline metal layer including an elemental metal selected from molybdenum, tungsten, or platinum. In another embodiment, the single crystalline seed plate 29 comprises an additional single crystalline III-nitride compound semiconductor material plate having a different lattice constant than the single crystalline single crystalline III-nitride compound semiconductor material plate 20. In one embodiment, the single crystalline seed plate 29 comprises a single crystalline aluminum nitride layer. In one embodiment, the gate stack comprises a single crystalline III-nitride compound semiconductor material plate 20 in epitaxial alignment with the single crystalline III-nitride ferroelectric plate 30. In one embodiment, the single crystalline III-nitride compound semiconductor material plate 20 comprises a single crystalline gallium nitride layer.

In one embodiment, the active region (42, 48, 45) includes a source region 42, a drain region 48, and a channel region 45 extending between the source region 42 and the drain region 48. In one embodiment, a gate dielectric layer 32 is located over the active region. A single crystalline III-nitride ferroelectric plate 30 can be in contact with the gate dielectric layer 32. An entirety of the single crystalline III-nitride ferroelectric plate 30 can be single crystalline. In one embodiment, sidewalls of the single crystalline III-nitride compound semiconductor material plate 20 are vertically coincident with sidewalls of the single crystalline III-nitride ferroelectric plate 30.

In one embodiment, the semiconductor structure also comprises a dielectric matrix layer 60 embedding the active region. A top surface of the active region can be located within a same horizontal plane as a top surface of the dielectric matrix layer 60. The gate dielectric layer 32 contacts the top surface of the active region and the top surface of the dielectric matrix layer 60.

In one embodiment, the dielectric matrix layer 60, the active region, and the gate stack are located within a first semiconductor die 101. In one embodiment, the first semiconductor die 101 comprises first bonding pads 68 embedded within the dielectric matrix layer 60. In one embodiment, the semiconductor structure also comprises a second semiconductor die 900 including semiconductor devices and second bonding pads 988 that are bonded to the first bonding pads 68.

Figure 17:
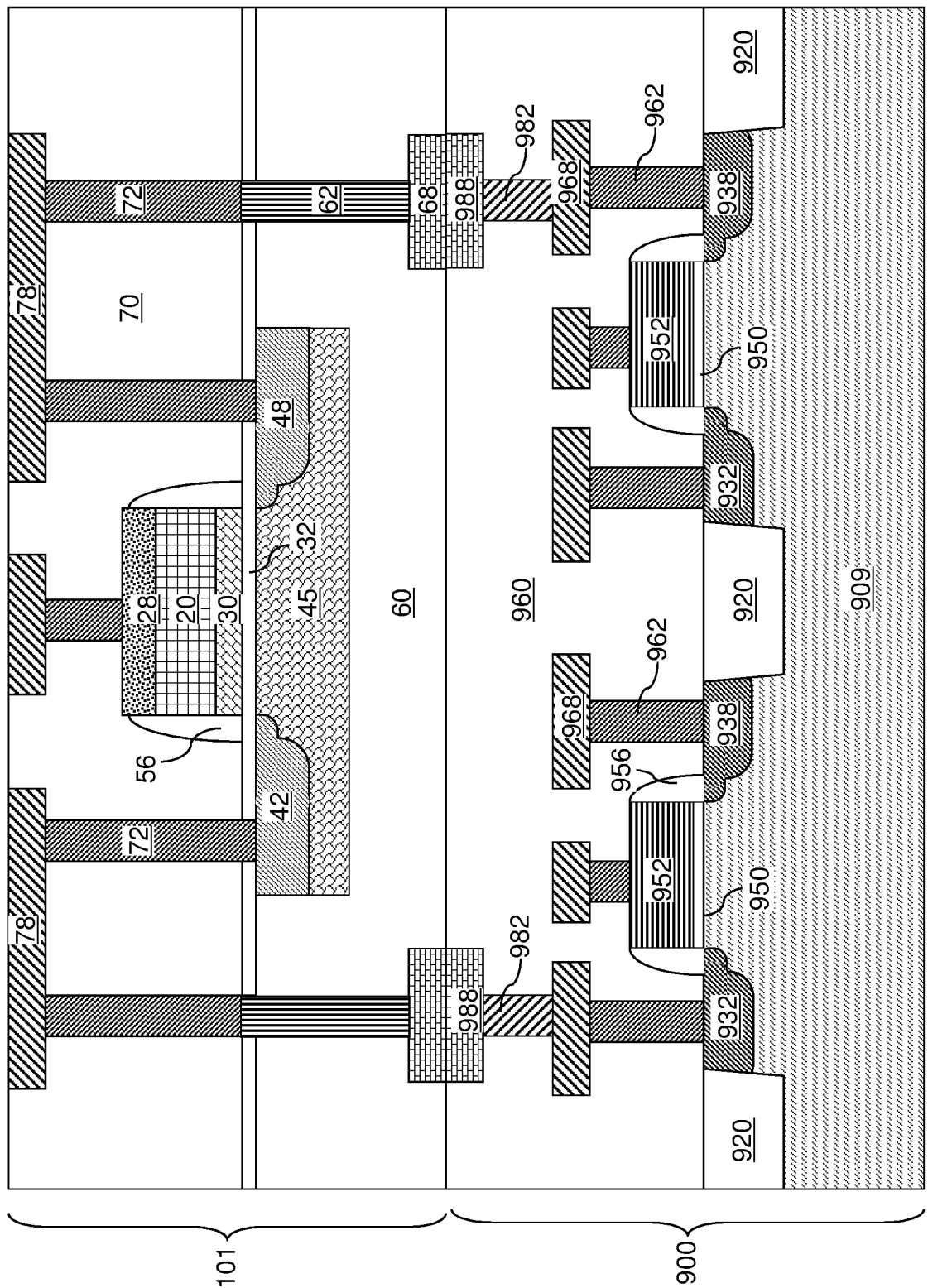
FIG. 17 is a vertical cross-sectional view of the first alternative embodiment of the first exemplary structure according to the first embodiment of the present disclosure.

Referring to FIG. 17, a first alternative embodiment of the first exemplary structure can be derived the from the first exemplary structure by omitting formation of the single crystalline seed layer 29L at the processing steps of FIG. 2. Accordingly, the single crystalline seed plate 29 is omitted in the first alternative embodiment of the first exemplary structure. Thus, a top surface of the single crystalline III-nitride ferroelectric plate 30 may contact the bottom surface of the single crystalline III-nitride compound semiconductor material plate 20.

Figure 18:
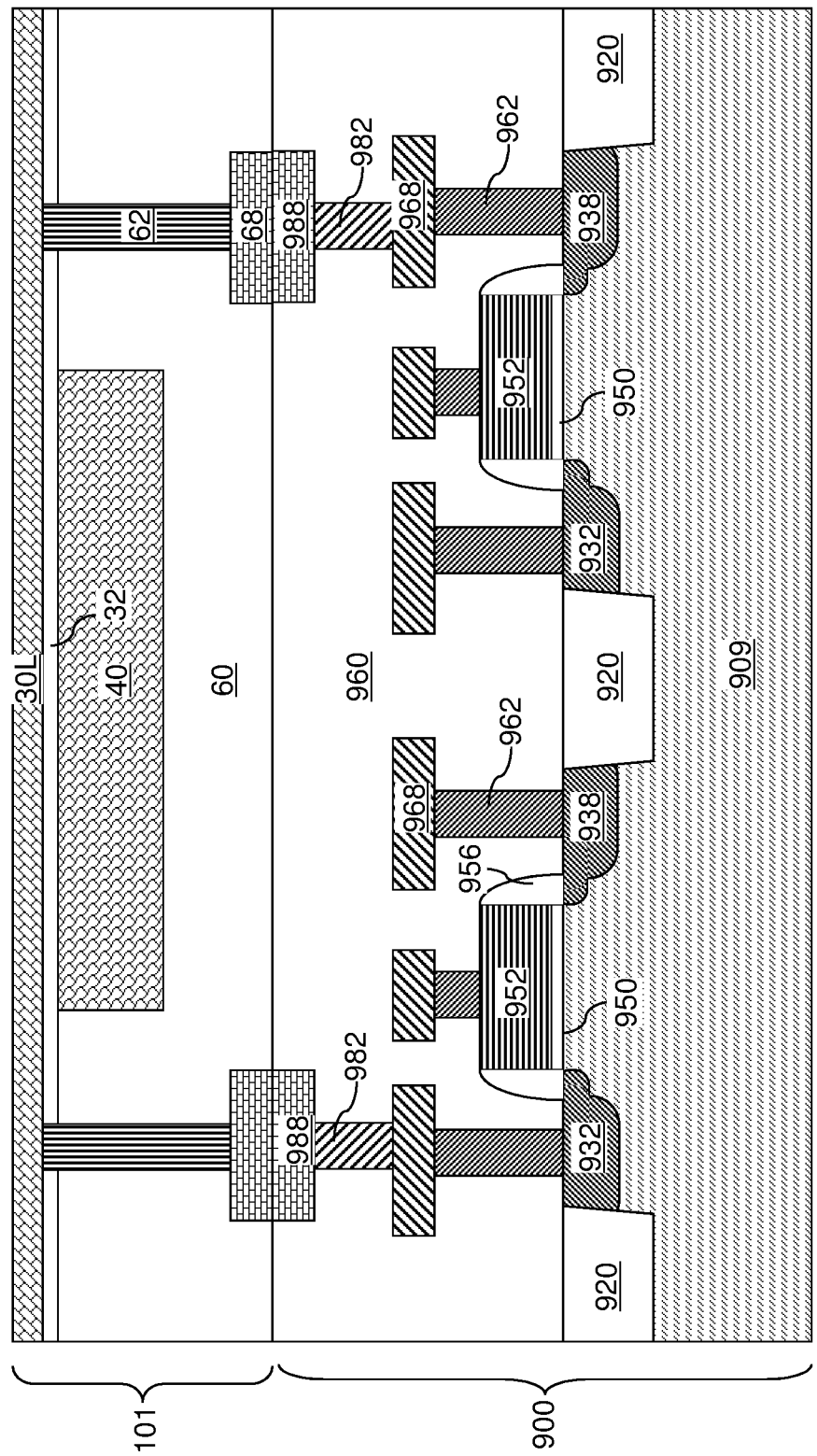
FIG. 18 is a vertical cross-sectional view of a second alternative embodiment of the first exemplary structure after removal of the single crystalline III-nitride compound semiconductor material layer according to the first embodiment of the present disclosure.

Referring to FIG. 18, a second alternative embodiment of the first exemplary structure can be derived from the first exemplary structure of FIG. 11 by removing the single crystalline III-nitride compound semiconductor material layer 20L and the optional single crystalline seed layer 29L. Anisotropic etch processes and/or isotropic etch process may be employed to remove the single crystalline III-nitride compound semiconductor material layer 20L and the optional single crystalline seed layer 29L selective to the material of the single crystalline III-nitride ferroelectric layer 30L.

Figure 19:
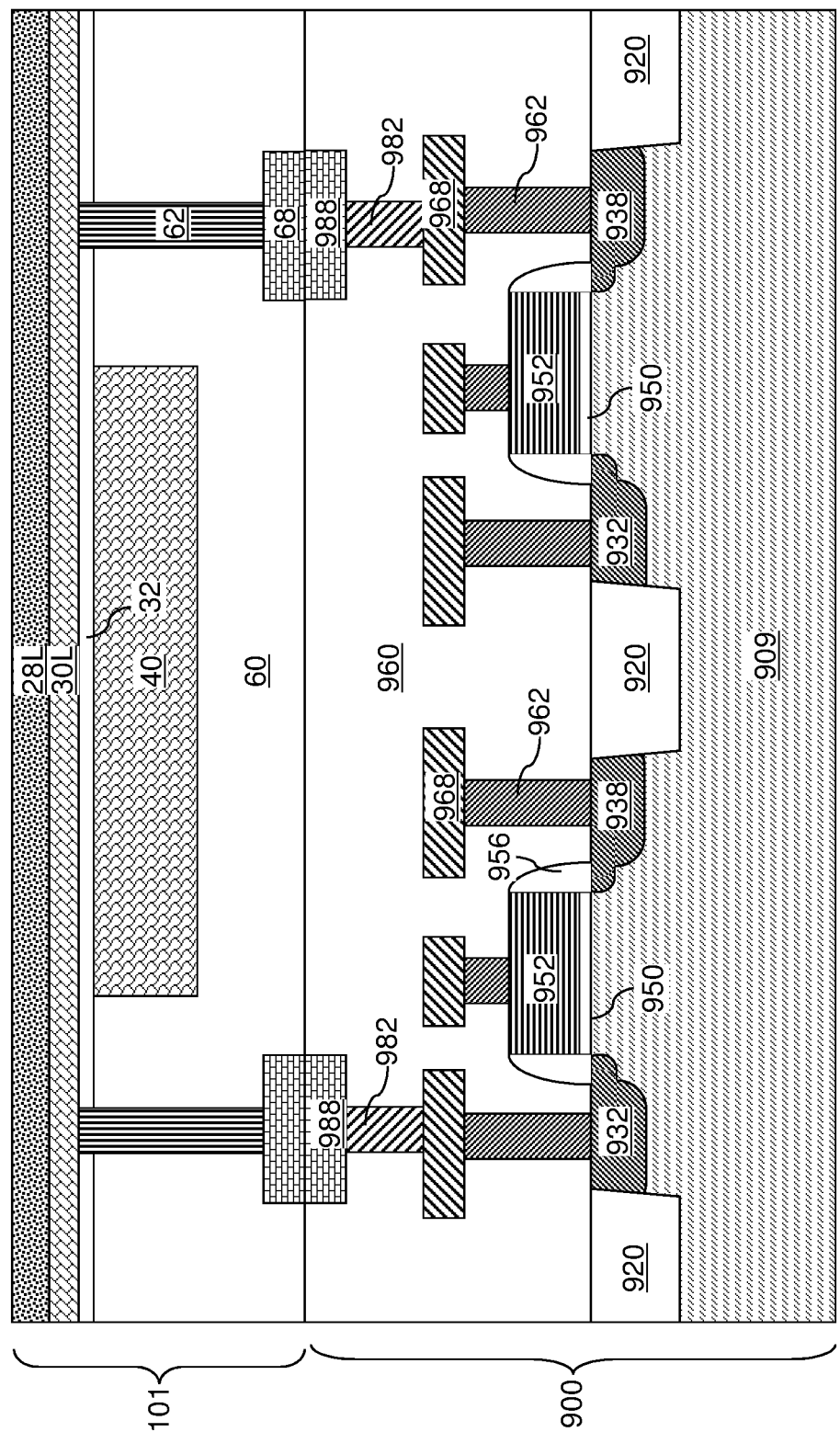
FIG. 19 is a vertical cross-sectional view of the second alternative embodiment of the first exemplary structure after formation of an electrically conductive gate electrode material layer according to the first embodiment of the present disclosure.

Referring to FIG. 19, the processing steps of FIG. 12 may be performed to deposit an electrically conductive gate electrode material layer 28L. The electrically conductive gate electrode material layer 28L can be deposited directly on the physically exposed top surface of the single crystalline III-nitride ferroelectric layer 30L.

Figure 20:
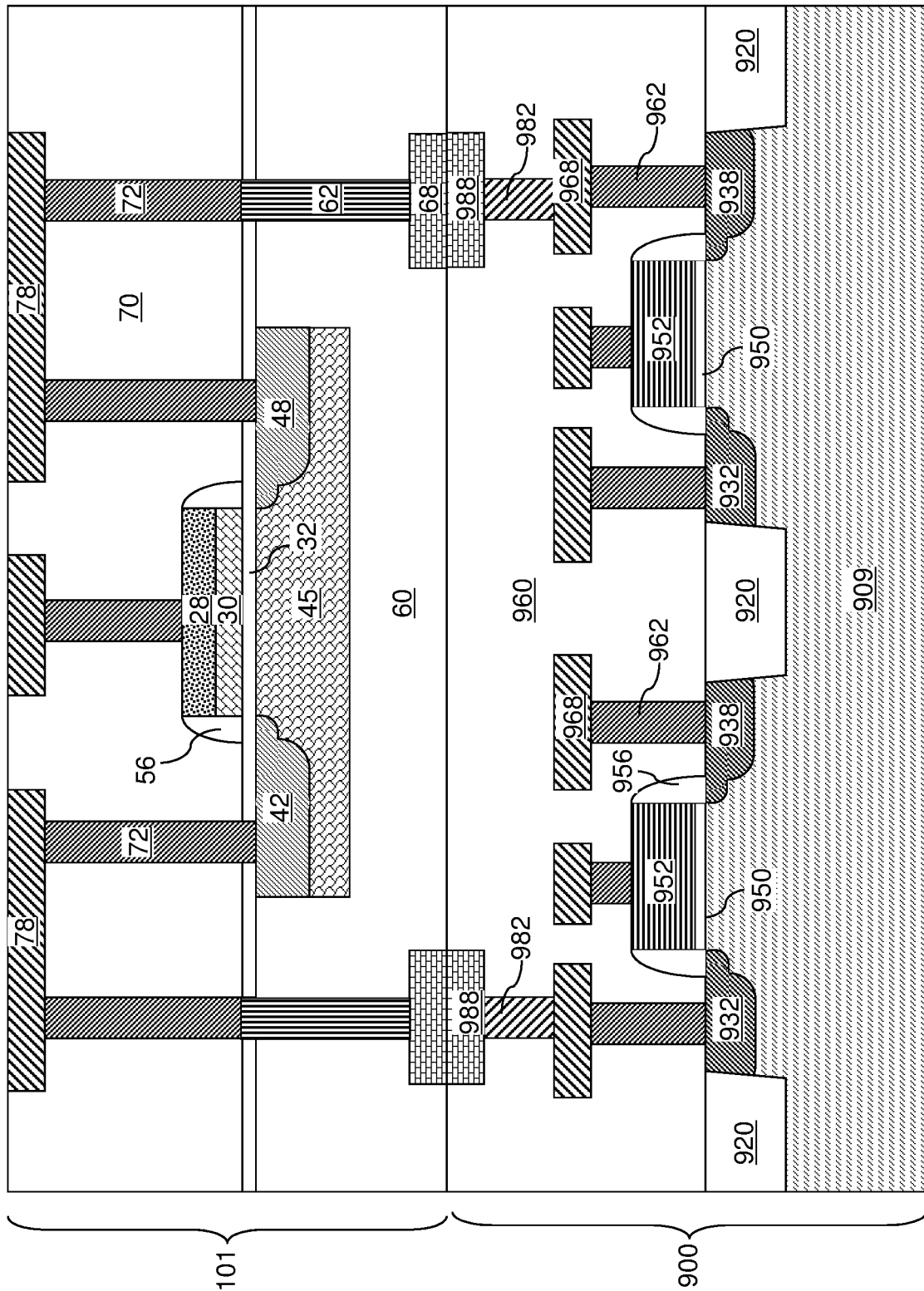
FIG. 20 is a vertical cross-sectional view of the second alternative embodiment of the first exemplary structure after formation of a contact-level dielectric layer and various metal interconnect structures according to the first embodiment of the present disclosure.

Referring to FIG. 20, the processing steps of FIG. 13 can be performed, with any needed changes in view all the omission of the semiconductor material layer 20L and the single crystalline seed layer 29L, to form a gate stack (30, 28). The processing steps of FIGS. 14 and 15 may be performed to form a source region 42, a drain region 48, and an optional dielectric gate spacer 56. An active region may include the source region 42, the drain region 48, and the channel region 45. The processing steps of FIG. 16 may be performed to form a contact-level dielectric layer 70, contact via structures 72, and metal lines 78. A single crystalline III-nitride ferroelectric plate 30 can be in contact with the gate dielectric layer 32 and an electrically conductive gate electrode 28. The entirety of the single crystalline III-nitride ferroelectric plate 30 is single crystalline.

Figure 21:
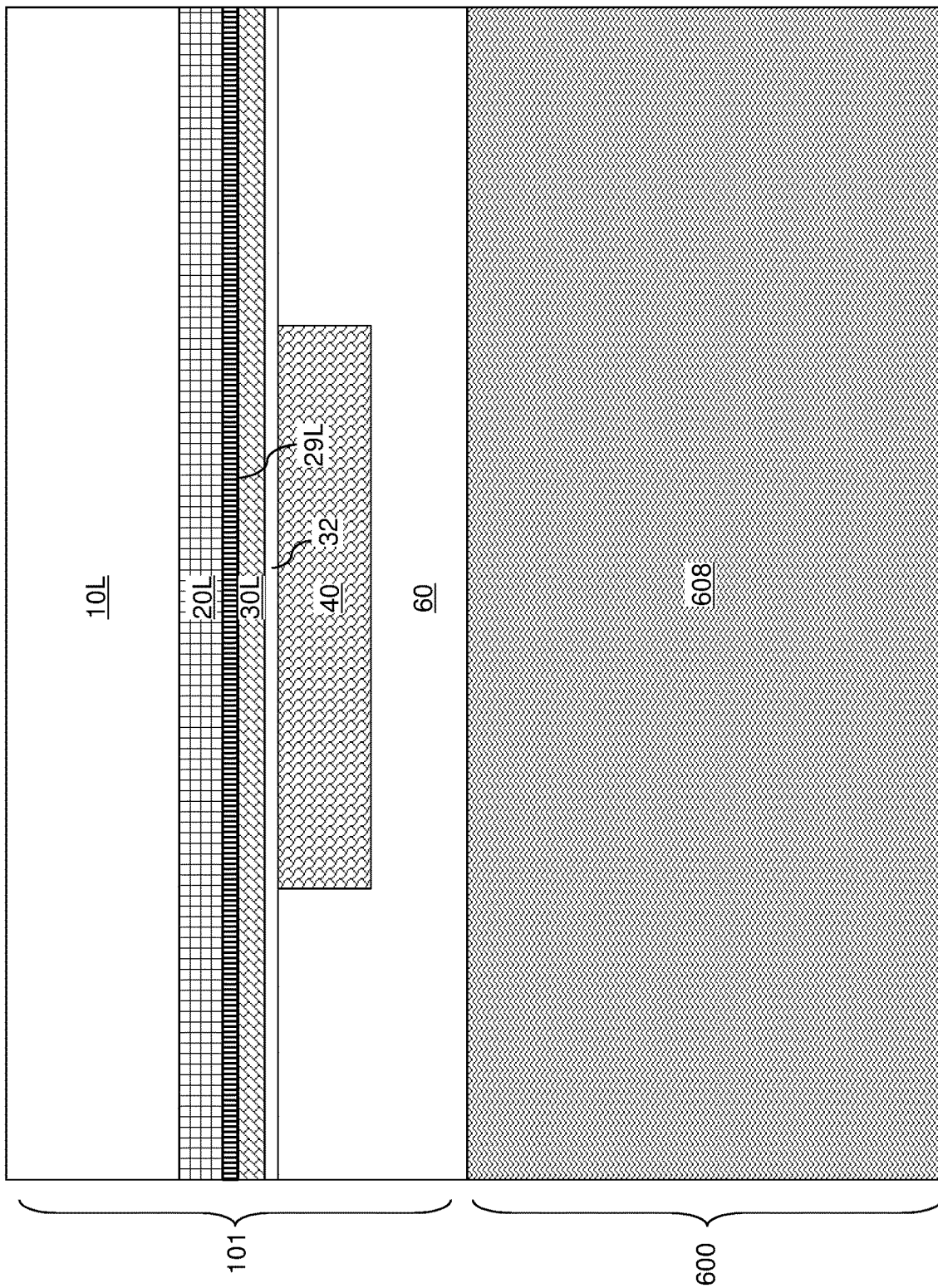
FIG. 21 is a vertical cross-sectional view of a second exemplary structure after attaching the first semiconductor die to a support substrate according to a second embodiment of the present disclosure.

Referring to FIG. 21, a second exemplary structure according to a second embodiment of the present disclosure can be derived from the first exemplary structure of FIG. 7 by attaching the first exemplary structure of FIG. 7 to a support comprising a handle substrate 600. In one embodiment, that handle substrate 600 may comprise, and/or may consist of, a handle substrate material layer 608. In one embodiment, the handle substrate 600 may be a dielectric (e.g., glass, plastic or ceramic) handle substrate, a semiconductor (e.g., silicon wafer) handle substrate, or a conductive (e.g., metal) handle substrate. The thickness of the handle substrate 600 may be in a range from 100 microns to 1 mm, although lesser and greater thicknesses may also be employed. The first exemplary structure of FIG. 7 may be attached to the handle substrate 600 by dielectric-to-dielectric bonding, by dielectric-to-semiconductor bonding, or by dielectric-to-metal bonding.

Figure 22:
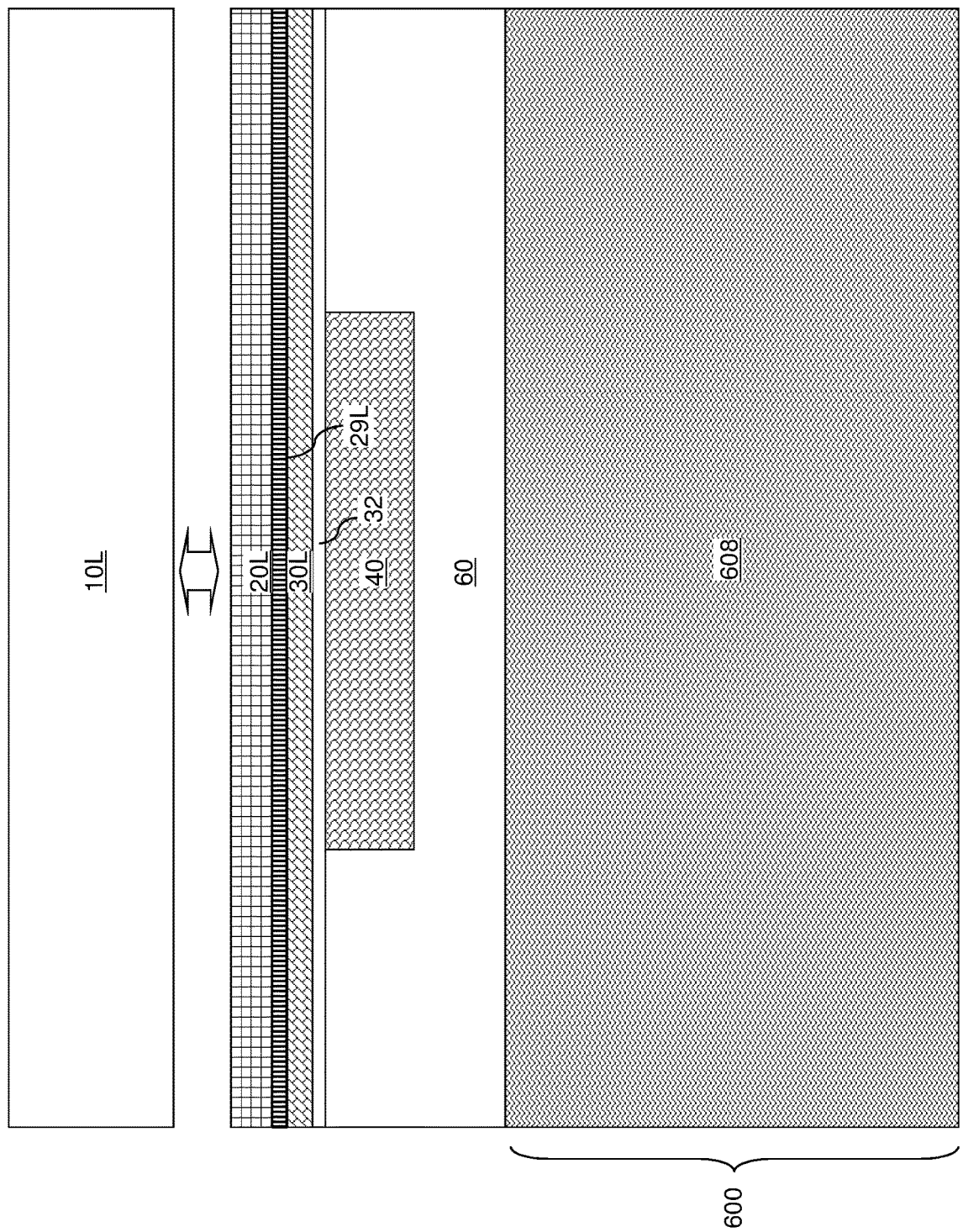
FIG. 22 is a vertical cross-sectional view of the second exemplary structure after detaching the single crystalline carrier substrate from the single crystalline III-nitride compound semiconductor material layer according to the second embodiment of the present disclosure.

Referring to FIG. 22, the processing steps of FIG. 11 may be performed to detach the single crystalline carrier substrate 10L from the single crystalline III-nitride compound semiconductor material layer 20L. As discussed above, a laser lift-off process may be used to separate the single crystalline III-nitride compound semiconductor material layer 20L from the carrier substrate 10L. Alternatively, a sacrificial layer may be selectively etched to separate the carrier substrate 10L from layer 20L as described above.

Figure 23:
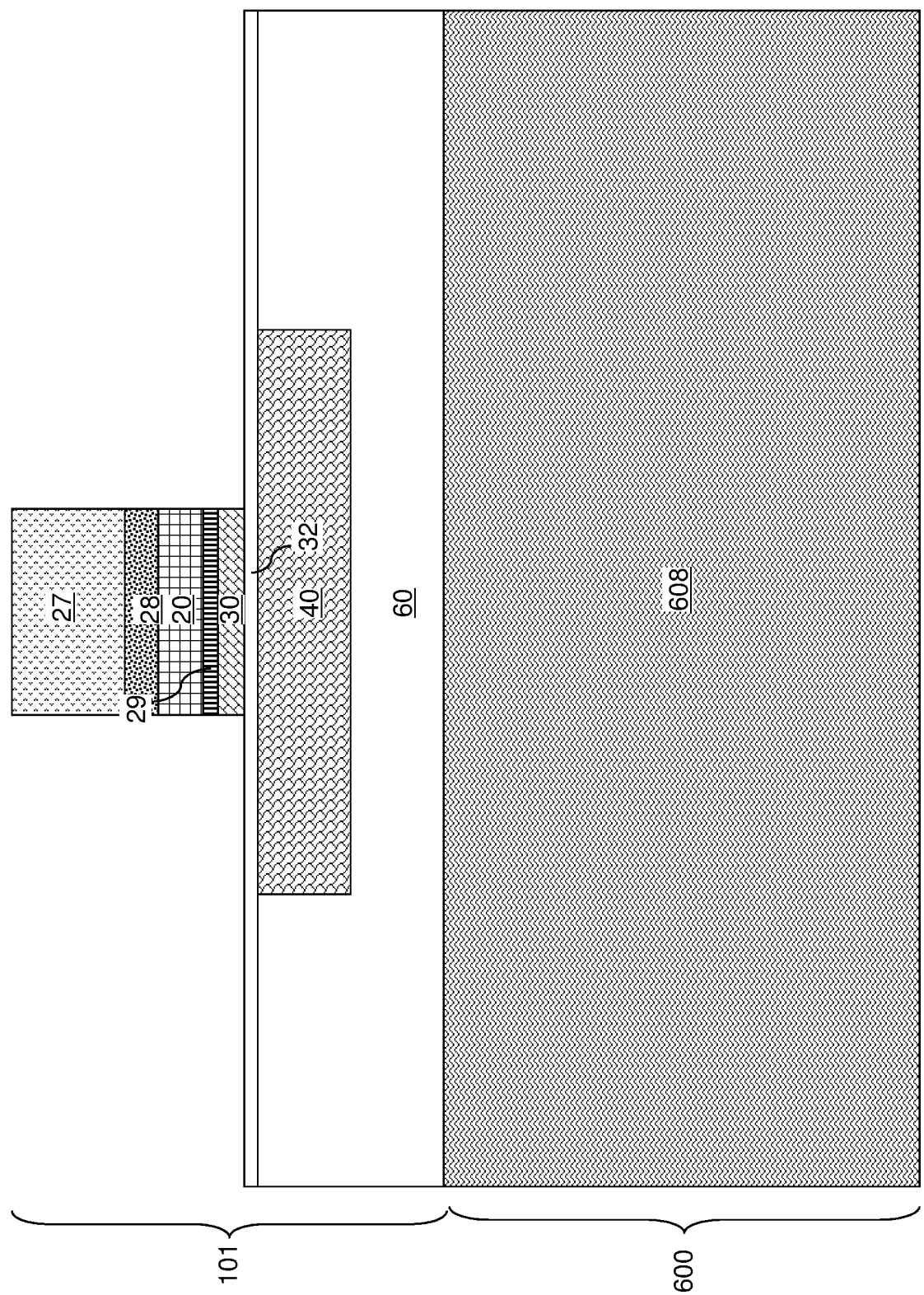
FIG. 23 is a vertical cross-sectional view of the second exemplary structure after patterning a gate stack according to the second embodiment of the present disclosure.

Referring to FIG. 23, the processing steps of FIG. 12 may be performed to deposit an electrically conductive gate electrode material layer 28L on the physically exposed in backside surface of the single crystalline III-nitride compound semiconductor material layer 20L. The processing steps of FIG. 13 may be performed to pattern the electrically conductive gate electrode material layer 28L, the single crystalline III-nitride compound semiconductor material layer 20L, the optional single crystalline seed layer 29L, and the single crystalline III-nitride ferroelectric layer 30L. A gate stack (30, 29, 20, 28) can be formed over the gate dielectric layer 32. The gate stack may comprise, from bottom to top, a single crystalline III-nitride ferroelectric plate 30, a single crystalline seed plate 29, a single crystalline III-nitride compound semiconductor material plate 20, and an electrically conductive gate electrode 28. Sidewalls of each layer within the gate stack (30, 29, 20, 28) can be vertically coincident, i.e., may be located within a same set of vertical planes.

Figure 24:
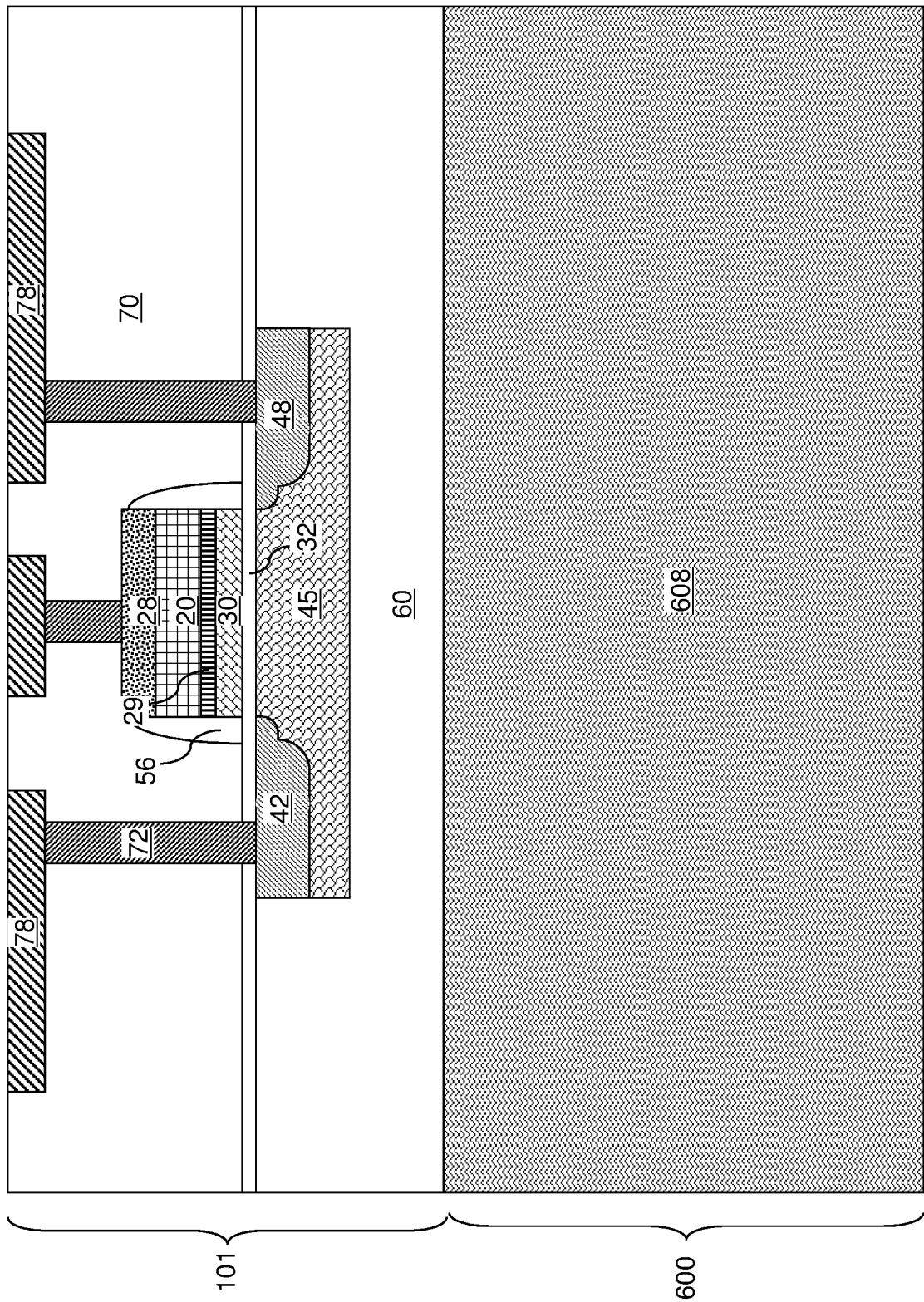
FIG. 24 is a vertical cross-sectional view of the second exemplary structure after formation of a contact-level dielectric layer and various metal interconnect structures according to the second embodiment of the present disclosure.

Referring to FIG. 24, the processing steps of FIGS. 14, 15, and 16 may be performed to form a source region 42, a drain region 48, a channel region 45, a dielectric gate spacer 56, a contact-level dielectric layer 70, contact via structures 72, and metal lines 78. The contact via structures 72 and the metal lines 78 can provide electrical contact to the source region 42, the drain region 48, and the electrically conductive gate electrode 28. In the second exemplary structure, a support substrate 600 is bonded to the dielectric matrix layer 60. In one embodiment, the support substrate 600 can have a uniform material composition and a uniform thickness throughout.

Figure 25:
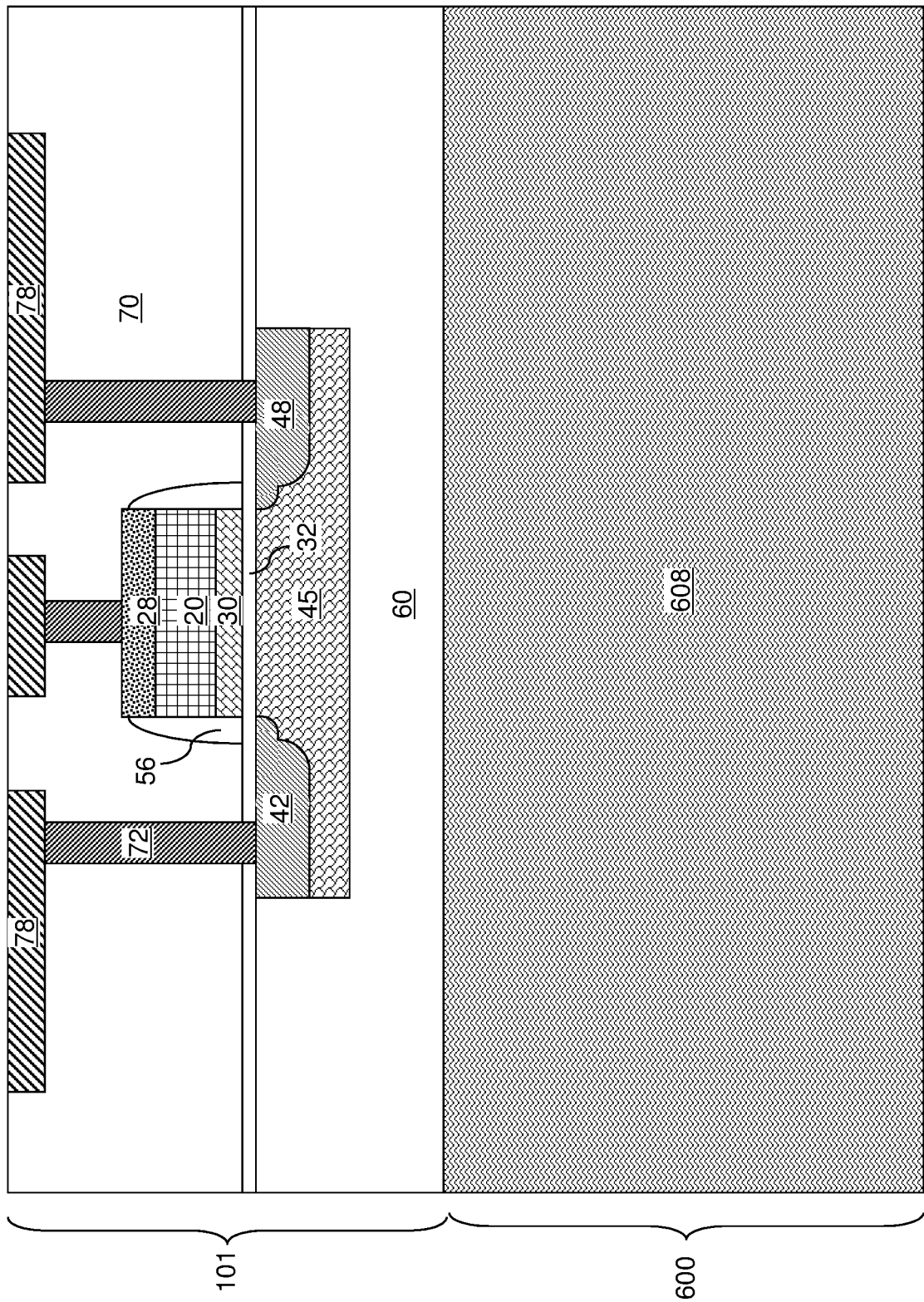
FIG. 25 is a vertical cross-sectional view of a first alternative embodiment of the second exemplary structure according to the second embodiment of the present disclosure.

Referring to FIG. 25, a first alternative embodiment of the second exemplary structure can be derived the from the second exemplary structure by omitting formation of the single crystalline seed layer 29L. Accordingly, the single crystalline seed plate 29 is omitted in the first alternative embodiment of the first exemplary structure. Thus, a top surface of the single crystalline III-nitride ferroelectric plate 30 may contact the bottom surface of the single crystalline III-nitride compound semiconductor material plate 20.

Figure 26:
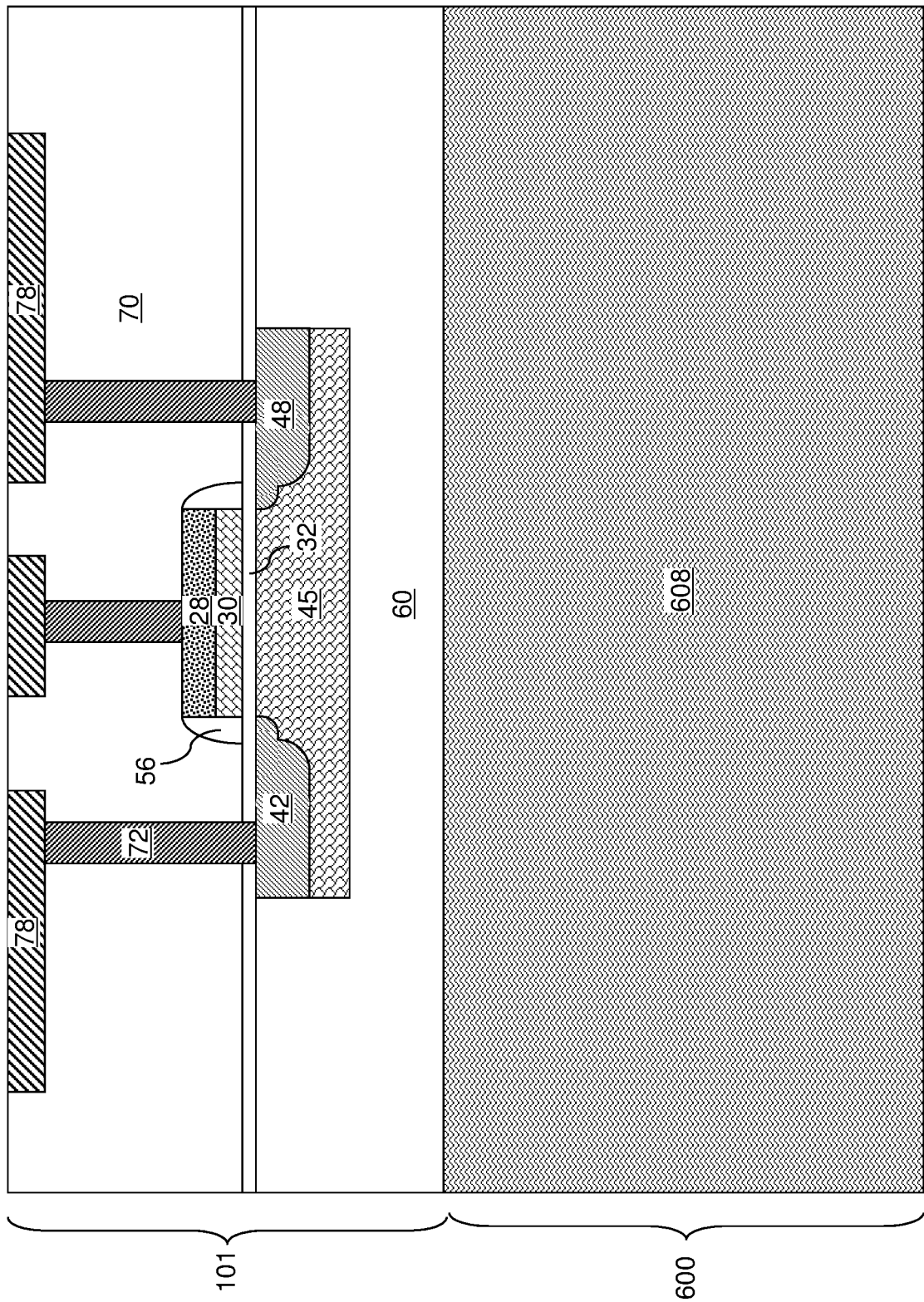
FIG. 26 is a vertical cross-sectional view of a second alternative embodiment of the second exemplary structure according to the second embodiment of the present disclosure.

Referring to FIG. 26, a second alternative embodiment of the second exemplary structure can be derived from the second exemplary structure by removing the single crystalline III-nitride compound semiconductor material layer 20L and the single crystalline seed layer 29L after the processing steps of FIG. 22 and a prior to deposition of the electrically conductive gate electrode material layer 28L. Accordingly, the single crystalline seed plate 29 and the single crystalline III-nitride compound semiconductor material plate 20 are omitted in the second alternative embodiment of the second exemplary structure. Thus, a top surface of the single crystalline III-nitride ferroelectric plate 30 may contact the bottom surface of the gate electrode 28.

Referring collectively to FIGS. 1-26 and according to various embodiments of the present disclosure, a semiconductor structure includes an active region including a source region 42, a drain region 48, and a channel region 45 extending between the source region and the drain region, a gate stack (28, 30), and a gate dielectric layer 32 located between the gate stack and the active region (42, 45, 48). The gate stack includes an electrically conductive gate electrode 28 and a single crystalline III-nitride ferroelectric plate 30 located between the electrically conductive gate electrode 28 and the gate dielectric layer 32, and an entirety of the single crystalline III-nitride ferroelectric plate 30 is single crystalline.

In one embodiment, sidewalls of the single crystalline III-nitride ferroelectric plate 30 are vertically coincident with sidewalls of the electrically conductive gate electrode 28. In one embodiment, the gate stack comprises a single crystalline III-nitride compound semiconductor material plate 20 in epitaxial alignment with the single crystalline III-nitride ferroelectric plate 30.

In one embodiment, the semiconductor structure comprises a single crystalline seed plate 29 interposed between, and in epitaxial alignment with each of, the single crystalline III-nitride ferroelectric plate 30 and the single crystalline III-nitride compound semiconductor material plate 20. In one embodiment, the single crystalline seed plate 29 comprises a single crystalline metal layer including an elemental metal selected from molybdenum, tungsten, or platinum. In one embodiment, the single crystalline seed plate 29 comprises an additional single crystalline III-nitride compound semiconductor material plate having a different lattice constant than the single crystalline single crystalline III-nitride compound semiconductor material plate 20. In one embodiment, the single crystalline seed plate 29 comprises a single crystalline aluminum nitride layer.

In one embodiment, the single crystalline III-nitride compound semiconductor material plate 20 comprises a single crystalline gallium nitride layer. In one embodiment, sidewalls of the single crystalline III-nitride compound semiconductor material plate 20 are vertically coincident with sidewalls of the single crystalline III-nitride ferroelectric plate 30.

In one embodiment, the single crystalline III-nitride ferroelectric plate 30 consists essentially of a single crystalline Wurtzite ferroelectric material. In one embodiment, the single crystalline Wurtzite ferroelectric comprising aluminum scandium nitride or aluminum boron nitride. In one embodiment, the single crystalline Wurtzite ferroelectric material consists essentially of aluminum scandium nitride having a formula $Al_{1-x}Sc_xN$, where $0.15 < x < 0.5$.

In one embodiment, the semiconductor structure comprises a dielectric matrix layer 60 embedding the active region, wherein a top surface of the active region is located within a same horizontal plane as a top surface of the dielectric matrix layer 60, and wherein the gate dielectric layer 32 contacts the top surface of the active region and the top surface of the dielectric matrix layer 60.

In one embodiment, the dielectric matrix layer 60, the active region, and the gate stack are located within a first semiconductor die 101, the first semiconductor die 101 comprises first bonding pads 68 embedded within the dielectric matrix layer 60, and the semiconductor structure further comprises a second semiconductor die 900 including semiconductor devices and second bonding pads 988 that are bonded to the first bonding pads 68. In another embodiment, the semiconductor structure further comprises a handle substrate 600 bonded to the dielectric matrix layer 60.

Figure 27:
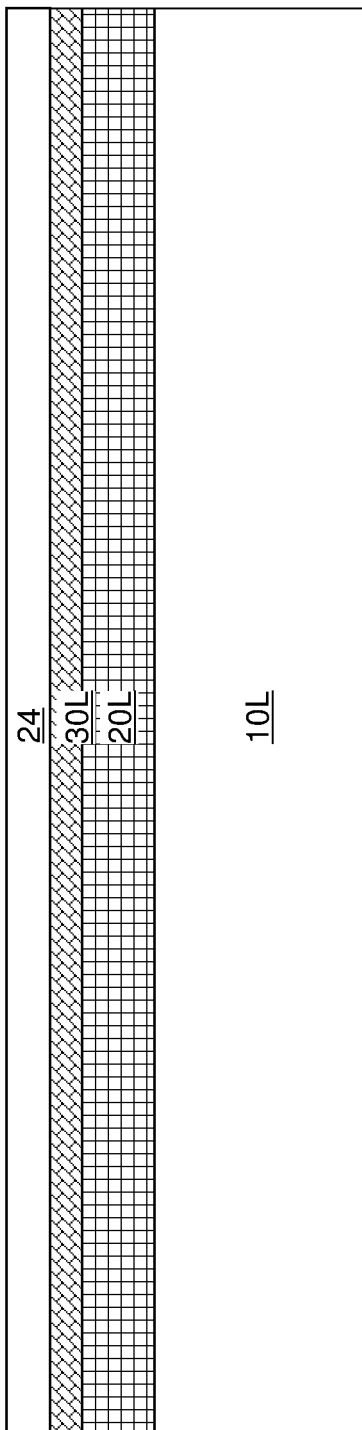
FIG. 27 is a vertical cross-sectional view of a third exemplary structure after formation of a single crystalline III-nitride compound semiconductor material layer, a single crystalline III-nitride ferroelectric layer, and a gate-electrode-level dielectric layer over a single crystalline carrier substrate according to a third embodiment of the present disclosure.

Referring to FIG. 27, a third exemplary structure according to a third embodiment of the present disclosure may be derived from the first exemplary structure of FIG. 3 by forming a gate-electrode-level dielectric layer 24 over the single crystalline III-nitride ferroelectric layer 30L. The single crystalline seed layer 29L is optional, and may, or may not, be present in the third exemplary structure. The gate-electrode-level dielectric layer 24 comprises a dielectric material such as undoped silicate glass (e.g., silicon oxide) or a doped silicate glass. The thickness of the gate-electrode-level dielectric layer 24 may be in a range from 200 nm to 10,000 nm, such as from 500 nm to 5,000 nm, although lesser and greater thicknesses may also be employed.

Figure 28:
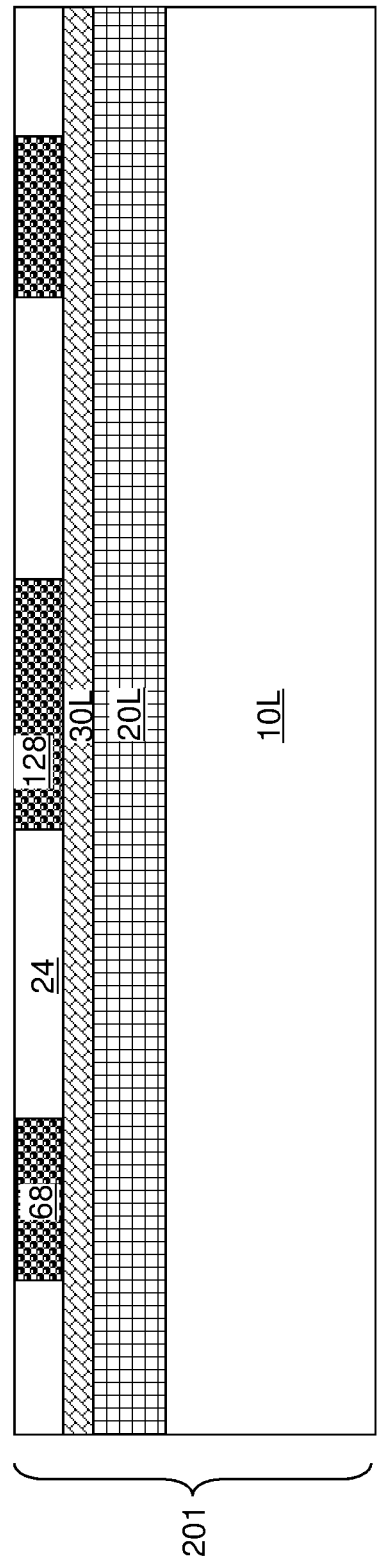
FIG. 28 is a vertical cross-sectional view of the third exemplary structure after formation of an electrically conductive gate electrode and first bonding pads in the gate-electrode-level dielectric layer according to the third embodiment of the present disclosure.

Referring to FIG. 28, cavities are formed in the gate-electrode-level dielectric layer 24, for example, by applying and patterning of photoresist layer over the gate-electrode-level dielectric layer 24, and by transferring the pattern in the photoresist layer into the gate-electrode-level dielectric layer 24. The cavities may include a gate electrode cavity and the pad cavities. The gate electrode cavity may have a shape of a gate electrode to be subsequently formed, and the pad cavities may have a shape of a respective bonding pad to be subsequently formed. The third exemplary structure may comprise a first semiconductor die 201.

At least one conductive material, such as at least one metallic material, may be deposited in the gate electrode cavity and the pad cavities. The at least one conductive material may comprise an elemental metal, an intermetallic alloy of at least two elemental metals, or a metallic compound of the at least one metal and a nonmetallic element (such as a metallic nitride or a metallic carbide). Excess portions of the at least one conductive material can be removed from above the horizontal plane including the top surface of the gate-electrode-level dielectric layer 24 by performing a planarization process. The planarization process may employ a chemical mechanical polishing process and/or a recess etch process. Remaining portions of the at least one conductive material comprise an electrically conductive gate electrode 128 that is formed in the gate electrode cavity, and first bonding pads 68 that are formed in the pad cavities. The electrically conductive gate electrode 128 may have the same material composition and the same thickness as the first bonding pads 68.

In an alternative embodiment, instead of using a damascene process to form the electrically conductive gate electrode 128 and the first bonding pads 68, the order of steps may be reversed. In the alternative embodiment, at least one conductive material layer is deposited on the single crystalline III-nitride ferroelectric layer 30L, followed by photolithographic patterning and etching of at least one conductive material layer to form the electrically conductive gate electrode 128 and the first bonding pads 68. After forming the electrically conductive gate electrode 128 and the first bonding pads 68, the gate-electrode-level dielectric layer 24 is formed in the spaces between the electrically conductive gate electrode 128 and the first bonding pads 68. The gate-electrode-level dielectric layer 24 may be planarized by CMP or etch back to have a top surface level with the top surfaces of the electrically conductive gate electrode 128 and the first bonding pads 68 to arrive at the exemplary structure shown in FIG. 28. Generally, the first semiconductor die 201 may comprise an electrically conductive gate electrode 28 that is formed over the single crystalline III-nitride ferroelectric layer 30L.

Figure 29:
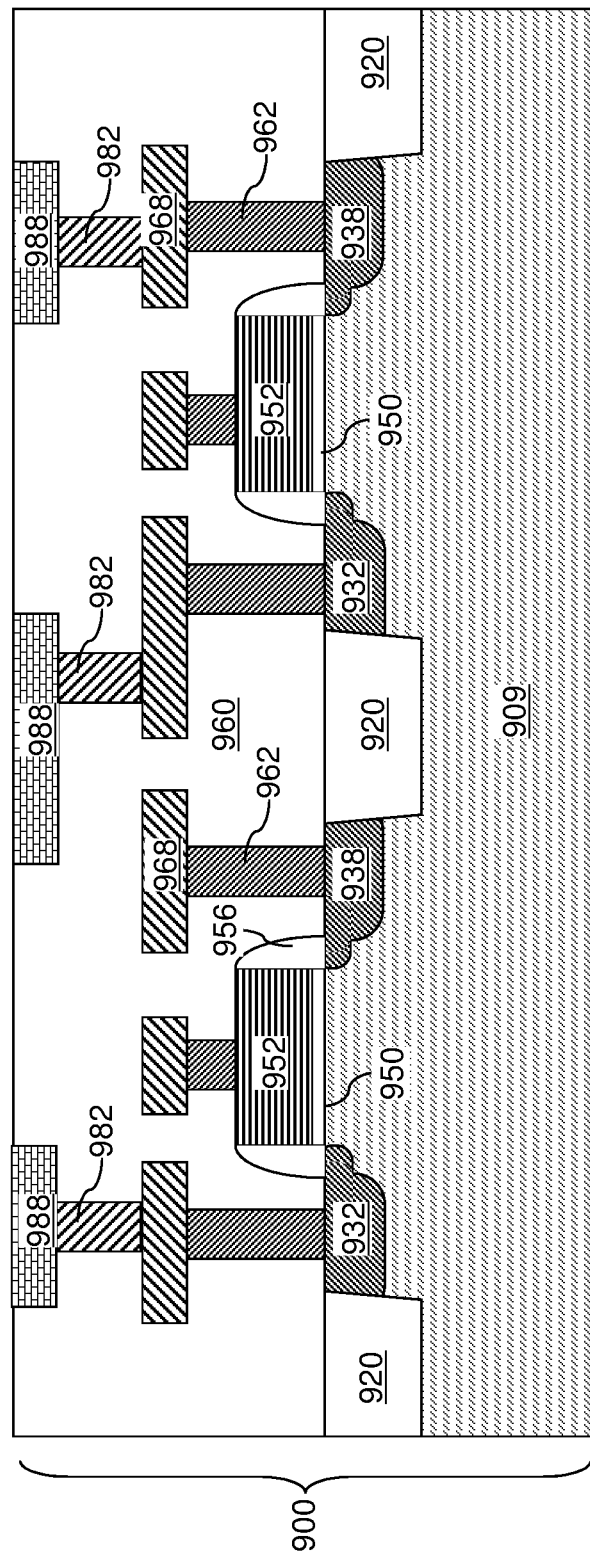
FIG. 29 is a vertical cross-sectional view of a second semiconductor die according to the third embodiment of the present disclosure.

Referring to FIG. 29, a support comprising a semiconductor die 900 can be provided. The semiconductor die 900 of the third embodiment may be the same as the semiconductor die 900 illustrated in FIG. 9 with optional modifications in the pattern of the second bonding pads 988. In this case, the pattern of the second bonding pads 988 may be a mirror image pattern of the pattern of the first bonding pads 68 and the electrically conductive gate electrode 128 of the first a semiconductor die 201.

Generally, the semiconductor die 900 may include a semiconductor devices located on a semiconductor substrate and second bonding pads 988 embedded in dielectric material layers (herein referred to as interconnect-level dielectric material layers 960) located on the semiconductor devices and configured to be bonded with the first bonding pads 68. The semiconductor die 900 may include an additional second bonding pad 988 that is configured to the bonded with the electrically conductive gate electrode 128. Alternatively, an intermediate bonding pad, such as copper bonding pad, may be present between the additional second bonding pad 988 and the electrically conductive gate electrode 128.

Figure 30:
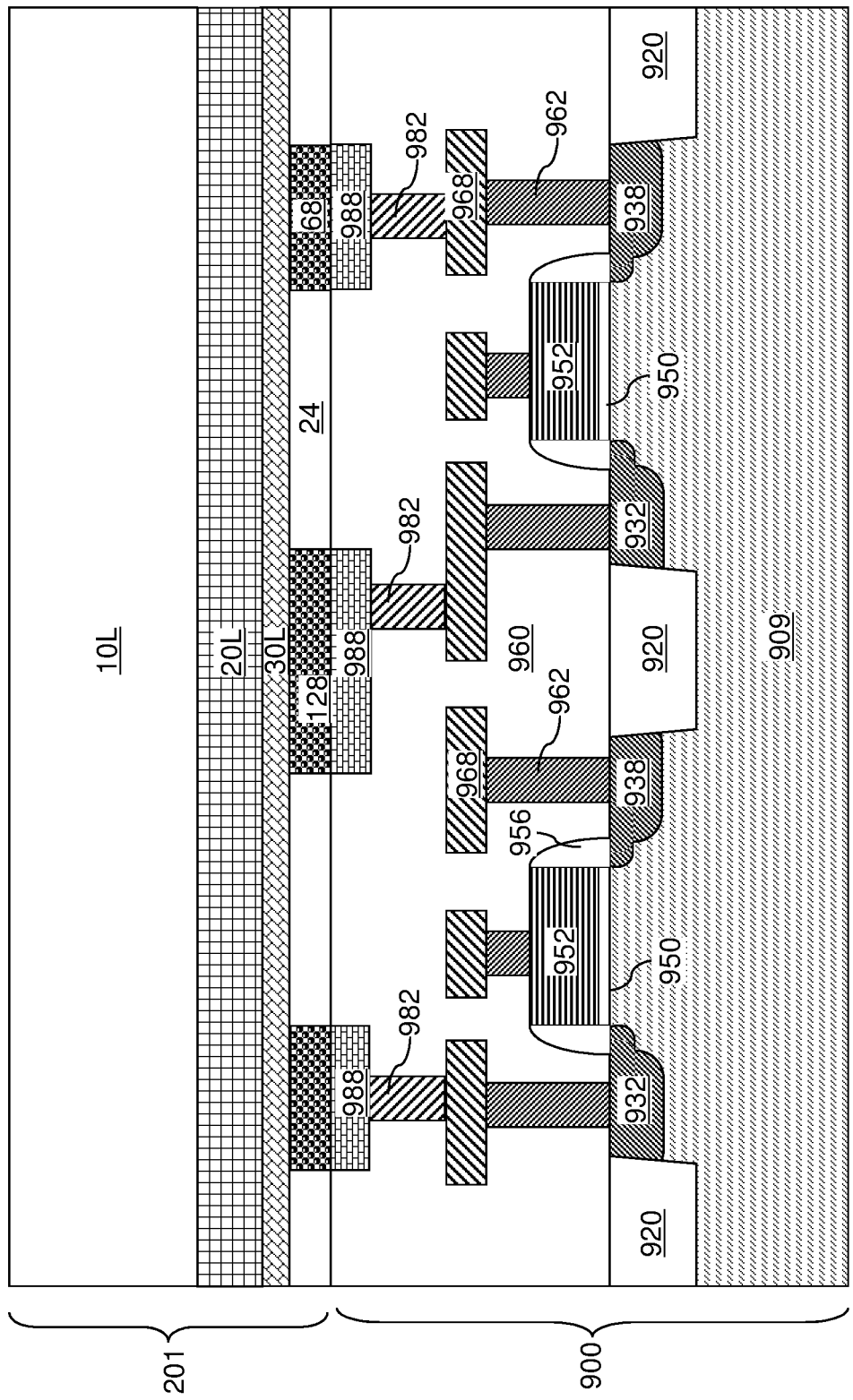
FIG. 30 is a vertical cross-sectional view of the third exemplary structure after bonding the second semiconductor die to the first semiconductor die according to the third embodiment of the present disclosure.

Referring to FIG. 30, the second semiconductor die 900 can be bonded to the first semiconductor die 201. The first bonding pads 68 and the electrically conductive gate electrode 128 can be bonded directly or indirectly to the second bonding pads 988 employing metal-to-metal bonding, such as copper-to-copper bonding. In one embodiment, the gate-electrode-level dielectric layer 24 can be in direct contact with the interconnect-level dielectric material layers 960, and comprises a horizontal surface located within a horizontal plane including bonding interfaces between the first bonding pads 68 and the second bonding pads 988. In one embodiment, the second semiconductor die 900 contains an additional second bonding pad 988 that is bonded directly or indirectly to the electrically conductive gate electrode 128. In one embodiment, the additional second bonding pad 988 may be electrically connected to one of the semiconductor devices in the second semiconductor die 900 through a subset of metal interconnect structures (962, 968, 982) embedded within the interconnect-level dielectric material layers 960. In an illustrative example, the electrically conductive gate electrodes 128 and the additional second bonding pad 988 may be electrically connected to a driver field effect transistor on the semiconductor substrate 909 of the second semiconductor die 900.

Figure 31:
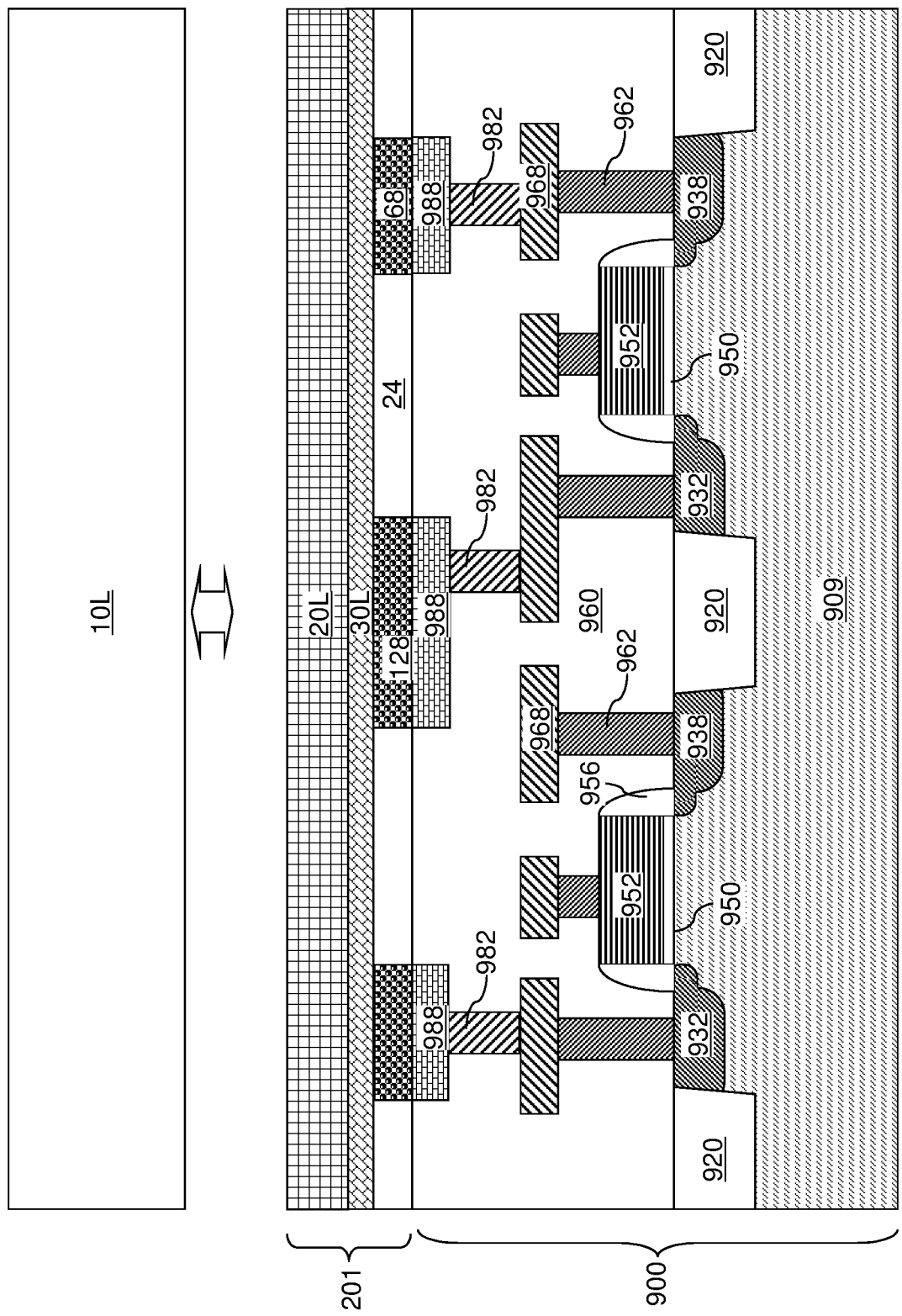
FIG. 31 is a vertical cross-sectional view of the third exemplary structure after detaching the single crystalline carrier substrate from the single crystalline III-nitride compound semiconductor material layer according to the third embodiment of the present disclosure.
Figure 32:
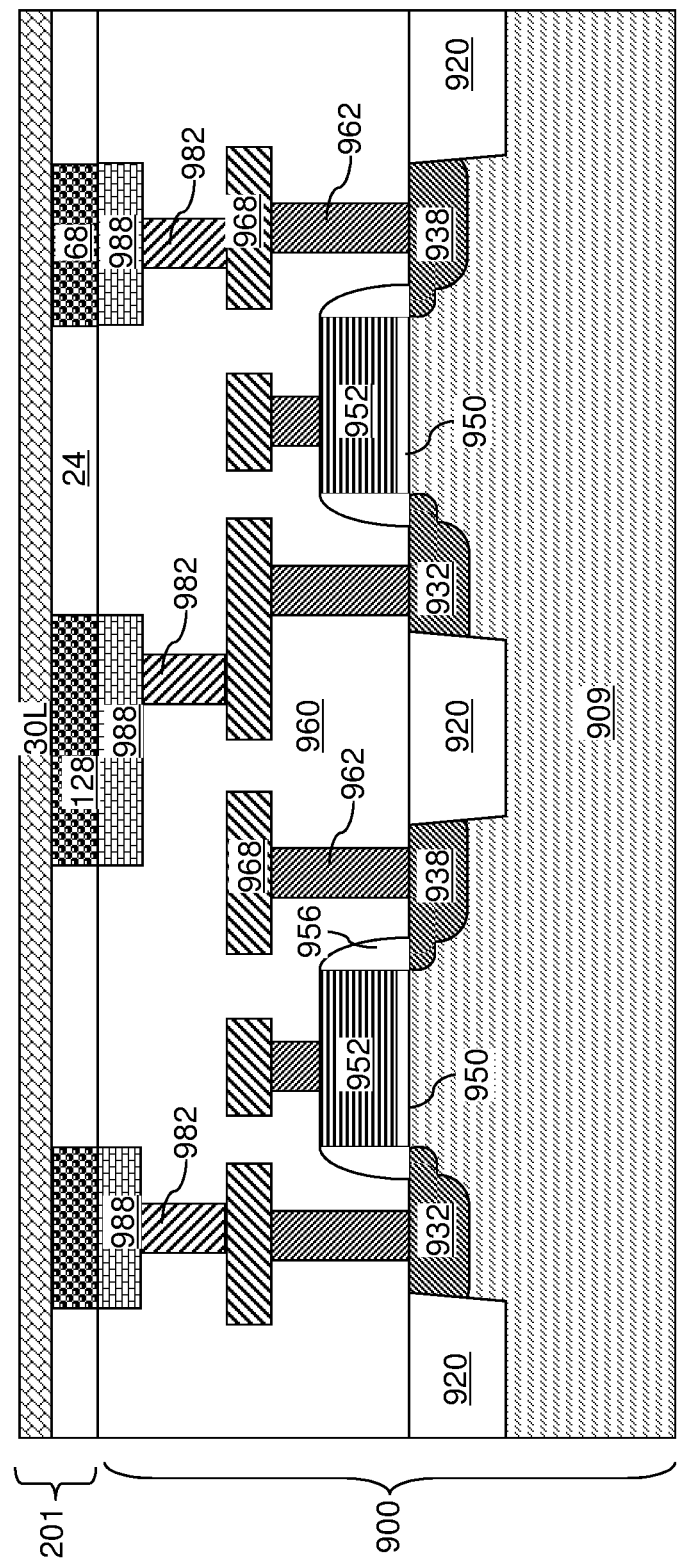
FIG. 32 is a vertical cross-sectional view of the third exemplary structure after removal of the single crystalline III-nitride compound semiconductor material layer according to the third embodiment of the present disclosure.

Referring to FIG. 31, the single crystalline carrier substrate 10L can be detached from the single crystalline III-nitride compound semiconductor material layer 20L. In one embodiment, the above described laser lift-off process may be used to detach the single crystalline carrier substrate 10L from the single crystalline III-nitride compound semiconductor material layer 20L. Alternatively, a sacrificial layer may be selectively etched to separate the carrier substrate 10L from layer 20L as described above. In one embodiment, the single crystalline carrier substrate 10L may be removed from the assembly including the single crystalline III-nitride compound semiconductor material layer 20L, the single crystalline III-nitride ferroelectric layer 30L, the first electrically conductive electrode 128, the first bonding pads 68, and the support (such as the second semiconductor die 900) by detaching the single crystalline carrier substrate 10L from the single crystalline III-nitride compound semiconductor material layer 20L.

Figure 33:
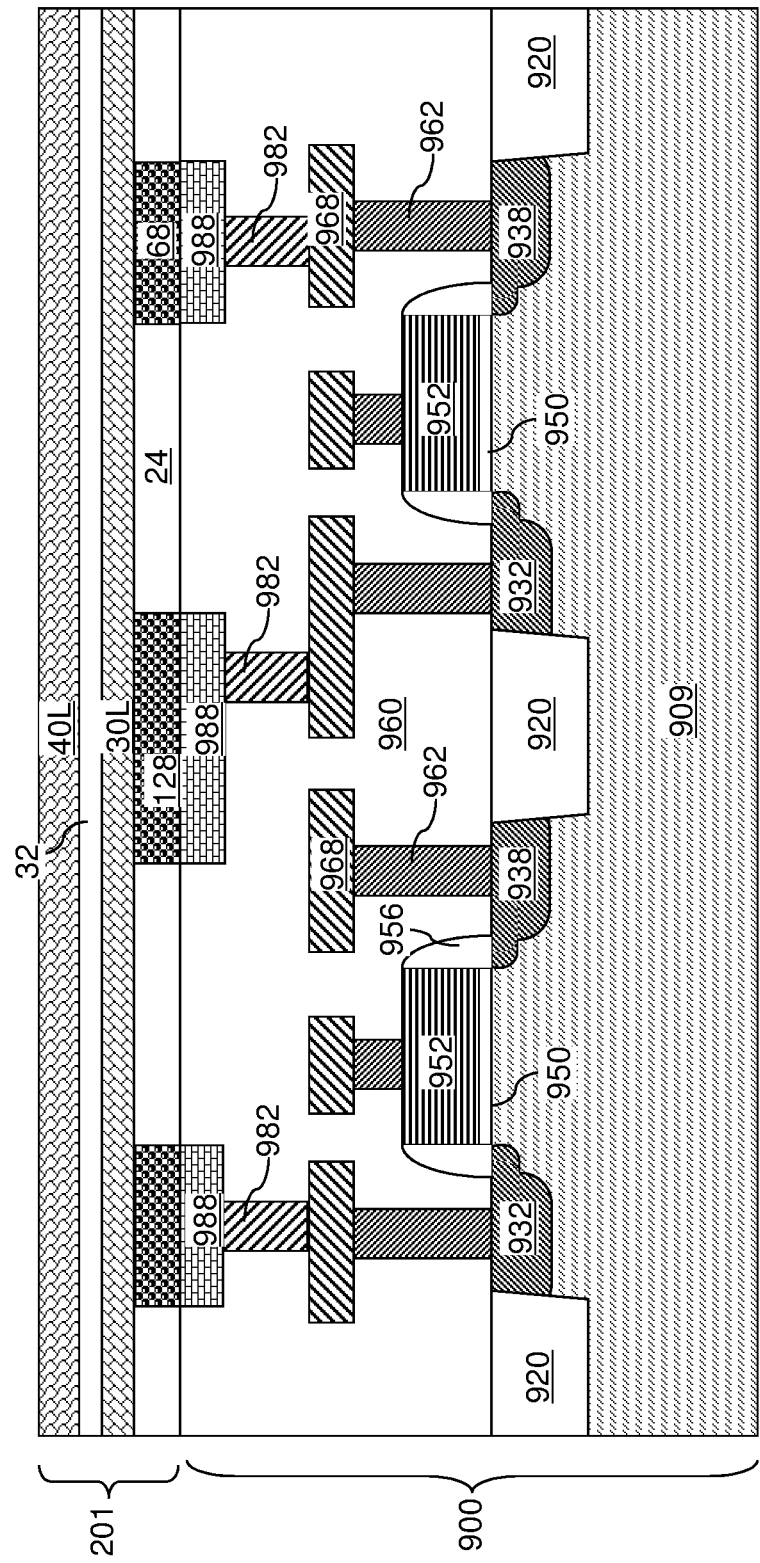
FIG. 33 is a vertical cross-sectional view of the third exemplary structure after formation of a gate dielectric layer and an active region semiconductor material layer according to the third embodiment of the present disclosure.

Referring to FIG. 33, the single crystalline III-nitride compound a semiconductor material layer 20L (and the optional single crystalline seed layer 29L, if present) can be removed to physically expose a top surface of the single crystalline III-nitride ferroelectric layer 30L. At least one of CMP, an anisotropic etch process and/or an isotropic etch process may be employed to remove the single crystalline III-nitride compound a semiconductor material layer 20L (and the optional single crystalline seed layer 29L, if present) from the single crystalline III-nitride ferroelectric layer 30L. The physically exposed top surface of the III-nitride single crystalline III-nitride ferroelectric layer 30L is a distal horizontal surface of the single crystalline III-nitride ferroelectric layer 30L that is a more distal from the bonding interface between the first semiconductor die 201 and the second semiconductor die 900 than a proximal horizontal surface of the single crystalline III-nitride ferroelectric layer 30L is from the bonding interface. Generally, the single crystalline carrier substrate 10L and the single crystalline III-nitride compound semiconductor material layer 20L may be removed from an assembly comprising the single crystalline III-nitride ferroelectric layer 30L, the electrically conductive gate electrode 28, and the support (such as the second semiconductor die 900) to physically expose a horizontal top surface of the single crystalline III-nitride ferroelectric layer 30L.

A gate dielectric layer 32 can be deposited on a horizontal top surface of the single crystalline III-nitride ferroelectric layer 30L by depositing a gate dielectric material. The gate dielectric material may comprise silicon oxide, silicon oxynitride, and/or at least one dielectric metal oxide (such as aluminum oxide, a transition metal oxide, or an oxide of a Lanthanide element). The gate dielectric layer 32 may be deposited by chemical vapor deposition, physical vapor deposition, atomic layer deposition, or a combination thereof. The thickness of the gate dielectric layer 32 may be in a range from 1 nm to 20 nm, such as from 1.5 nm to 12 nm and/or from 2 nm to 6 nm, although lesser and greater thicknesses may also be employed.

An active region semiconductor material layer 40L can be deposited over the gate dielectric layer 32. The active region semiconductor material layer 40L includes a semiconductor material that can be employed for an active region of a field effect transistor. In one embodiment, the active region semiconductor material layer 40L may have the same material composition as, and/or may have the same thickness range as, the active region semiconductor material layer 40L of the first and second exemplary structures. In one embodiment, the active region semiconductor material layer 40L may comprise a polycrystalline or amorphous semiconductor material, such as polysilicon.

Figure 34:
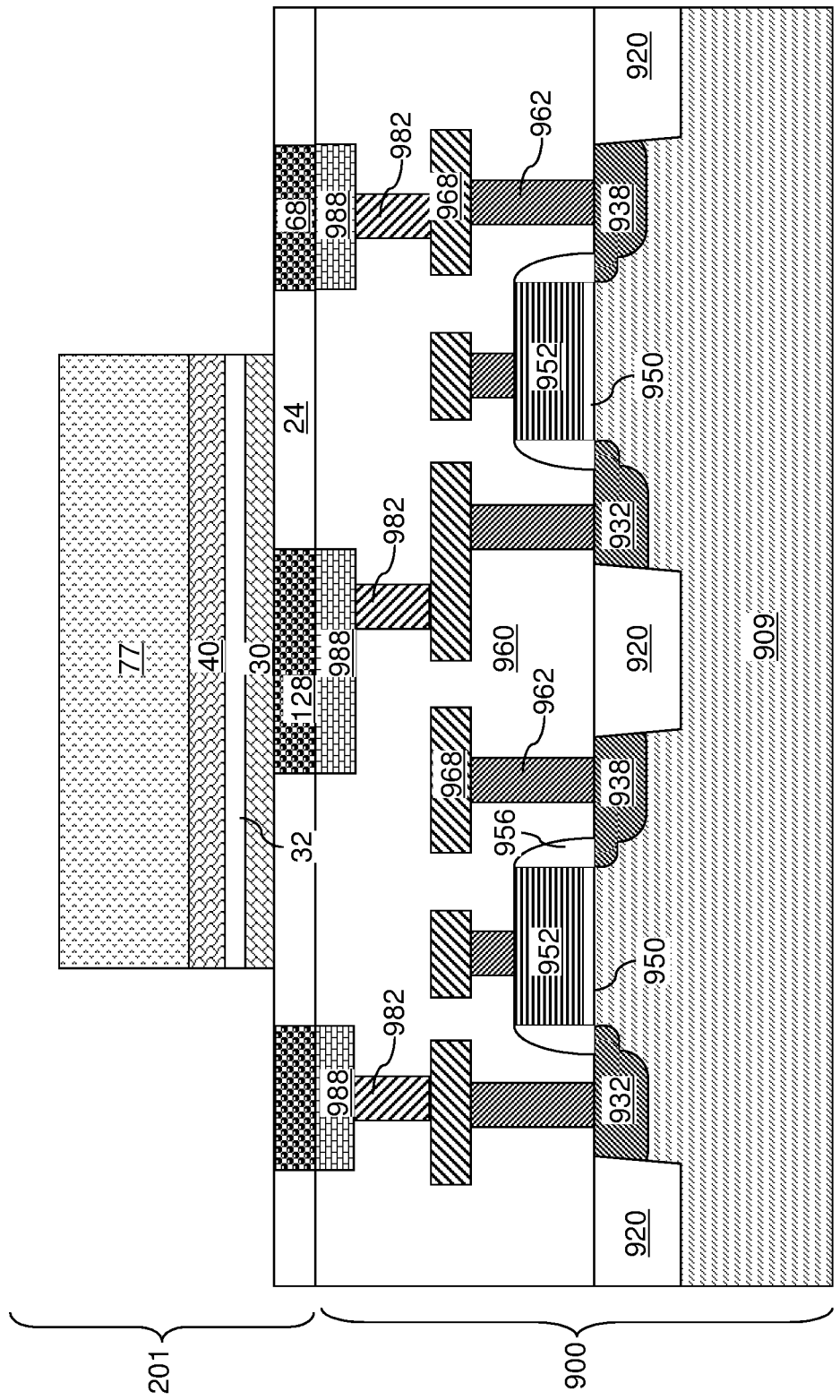
FIG. 34 is a vertical cross-sectional view of the third exemplary structure after formation of an active region, a gate dielectric, and a single crystalline III-nitride ferroelectric plate according to the third embodiment of the present disclosure.

Referring to FIG. 34, a photoresist layer 77 can be applied over the top surface of the active region semiconductor material layer 40L, and can be lithographically patterned to form at least one discrete patterned photoresist material portion. An anisotropic etch process can be performed to transfer the pattern in the photoresist layer through the active region semiconductor material layer 40L, the gate dielectric layer 32, and the single crystalline III-nitride ferroelectric layer 30L. A patterned portion of the active region semiconductor material layer 40L comprises an active region 40.

In one embodiment, the active region 40 may have a rectangular shape. The lateral dimensions of the active region 40 may be selected based on the length and the width of a field effect transistor to be subsequently formed. The gate dielectric layer 32 can be patterned into a shape having a same horizontal cross-sectional shape as the active region 40. A patterned portion of the single crystalline III-nitride ferroelectric layer 30L comprises a single crystalline III-nitride ferroelectric plate 30.

In one embodiment, sidewalls of the active region 40, sidewalls of the gate dielectric layer 32, and the sidewalls of the single crystalline III-nitride ferroelectric plate 30 may be vertically coincident with each other. In one embodiment, the sidewalls of the single crystalline III-nitride ferroelectric plate 30 are vertically coincident with sidewalls of the gate dielectric layer 32. In one embodiment, the sidewalls of the single crystalline III-nitride ferroelectric plate 30 are vertically coincident with sidewalls of the active region 40.

The active region 40 includes an active region semiconductor material, and can be formed over the gate dielectric layer 32 and the single crystalline III-nitride ferroelectric plate 30. Backside surfaces of the first bonding pads 68 and the gate-electrode-level dielectric layer 24 can be physically exposed after the anisotropic etch process. The photoresist layer 77 can be subsequently removed, for example, by ashing.

Figure 35:
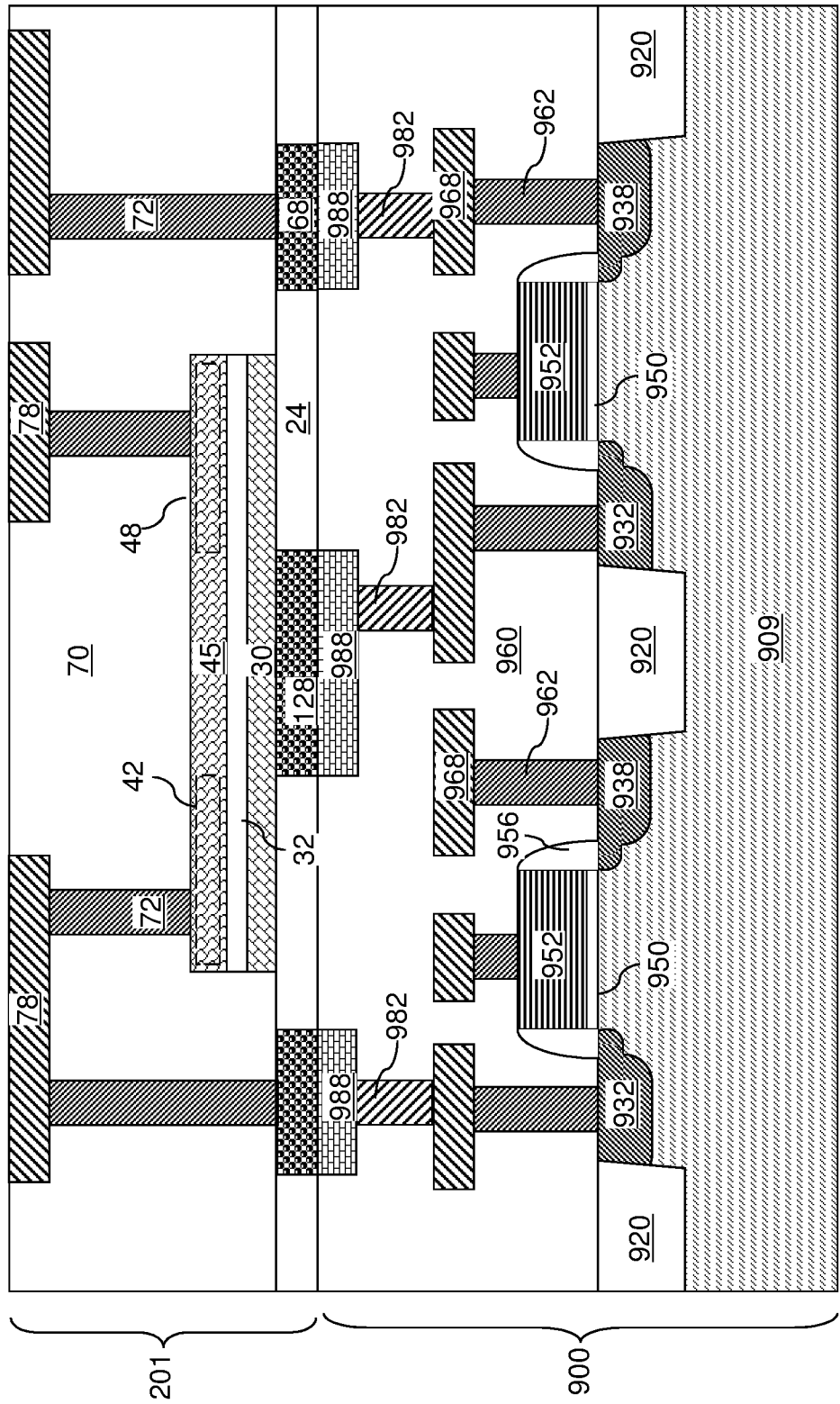
FIG. 35 is a vertical cross-sectional view of the third exemplary structure after formation of a contact-level dielectric layer and various metal interconnect structures according to the third embodiment of the present disclosure.

Referring to FIG. 35, a dielectric material layer can be deposited over the layer stack of the single crystalline III-nitride ferroelectric plate 30, the gate dielectric layer 32, and the active region 40 to form a contact-level dielectric layer 70. The contact-level dielectric layer 70 may comprise a self-planarizing semiconductor material such as flowable oxide (FOX), or may comprise a planarizable dielectric material such as undoped silicate glass or a doped silicate glass. The contact-level dielectric layer 70 may be formed with a planar horizontal surface (for example, employing a spin coating process), or may be planarized to provide a planar horizontal surface (for example, by performing a CMP process). The distance between the planar horizontal surface of the contact-level dielectric layer 70 and the top surface of the active region 40 may be in a range from 100 nm to 1,000 nm, such as from 200 nm to 600 nm, although lesser and greater distances may also be employed.

In one embodiment, a portion of the active region 40 having an areal overlap with the electrically conductive gate electrode 128 may comprise a channel region 45, and portions of the active region 40 that do not have an areal overlap with the electrically conductive gate electrode 128 may comprise a source region 42 and a drain region 48 to form a depletion mode ferroelectric transistor. In this case, the channel region 45, the source region 42, and the drain region 48 may have a same type of doping, and/or may include a doped lines of the same conductivity type and a same dopant concentration. Alternatively, areas of the source region 42 and the drain region 48 may be defined employing ion implantation processes. In this case, the channel region 45 may have a doping of a first conductivity type, and the source region 42 and the drain region 48 may have a doping of a second conductivity type that is the opposite of the first conductivity type to form an enhancement mode ferroelectric transistor.

Contact via structures 72 and metal lines 78 can be formed in the contact-level dielectric layer 70. For example, via cavities vertically extending through the contact-level dielectric layer 70 can be formed employing a combination of a first lithographic patterning process and a first anisotropic etch process, and line cavities adjoined to an upper portion of a respective via cavity may be formed employing a combination of a second lithographic patterning process and a second anisotropic etch process. In one embodiment, a subset of the via cavities may be formed such that top surfaces of the first bonding pads 68 are physically exposed at the bottom of each via cavity within the subset of the via cavities. At least one conductive material, such as at least one metallic material, can be deposited in the via cavities and the line cavities, and excess portions of the at least one conductive material can be removed from above the horizontal plane including the top surface of the contact-level dielectric layer 70. Each portion of the at least one conductive material filling a via cavity constitutes a contact via structure 72. Each portion of the at least one conductive material filling a line cavity constitutes a metal line 78. Contact via structures 72 and metal lines 78 may be formed in the contact-level dielectric layer 70. In one embodiment, the source region 42 and/or the drain region 48 may be electrically connected to a respective semiconductor device within the second semiconductor die 900 through the metal lines 78, the contact via structures 72, the first bonding pads 68, the second bonding pads 988, and the metal interconnect structures (962, 968, 982) within the second semiconductor die 900.

Generally, the contact-level dielectric layer 70 laterally surrounds the layer stack {30, 32, (42, 45, 48)} overlying the gate-electrode-level dielectric layer 24. In one embodiment, one of the first bonding pads 68 is electrically connected to one of the source region 42 and the drain region 48 via a subset of metal interconnect structures (such as a metal line 78 and contact via structures 72) embedded within the contact-level dielectric layer 70.

In one embodiment, the source region 42 and the drain region 48 are laterally spaced from each other along a first horizontal direction, and a lateral extent of the electrically conductive gate electrode 28 along the first horizontal direction is less than a lateral extent of the active region 40 along the first horizontal direction.

An electrically conductive gate electrode 28 can be embedded within a gate-electrode-level dielectric layer 24. In one embodiment, the layer stack includes a single crystalline III-nitride ferroelectric plate 30, a gate dielectric layer 32, and an active region (42, 48, 45) which overlies the electrically conductive gate electrode 28. In one embodiment, the active region (42, 48, 45) contains a source region 42, a drain region 48, and a channel region 45 extending between the source region 42 and the drain region 48. A support (such as the second semiconductor die 900) can be bonded to the gate-electrode-level dielectric layer 24.

Figure 36:
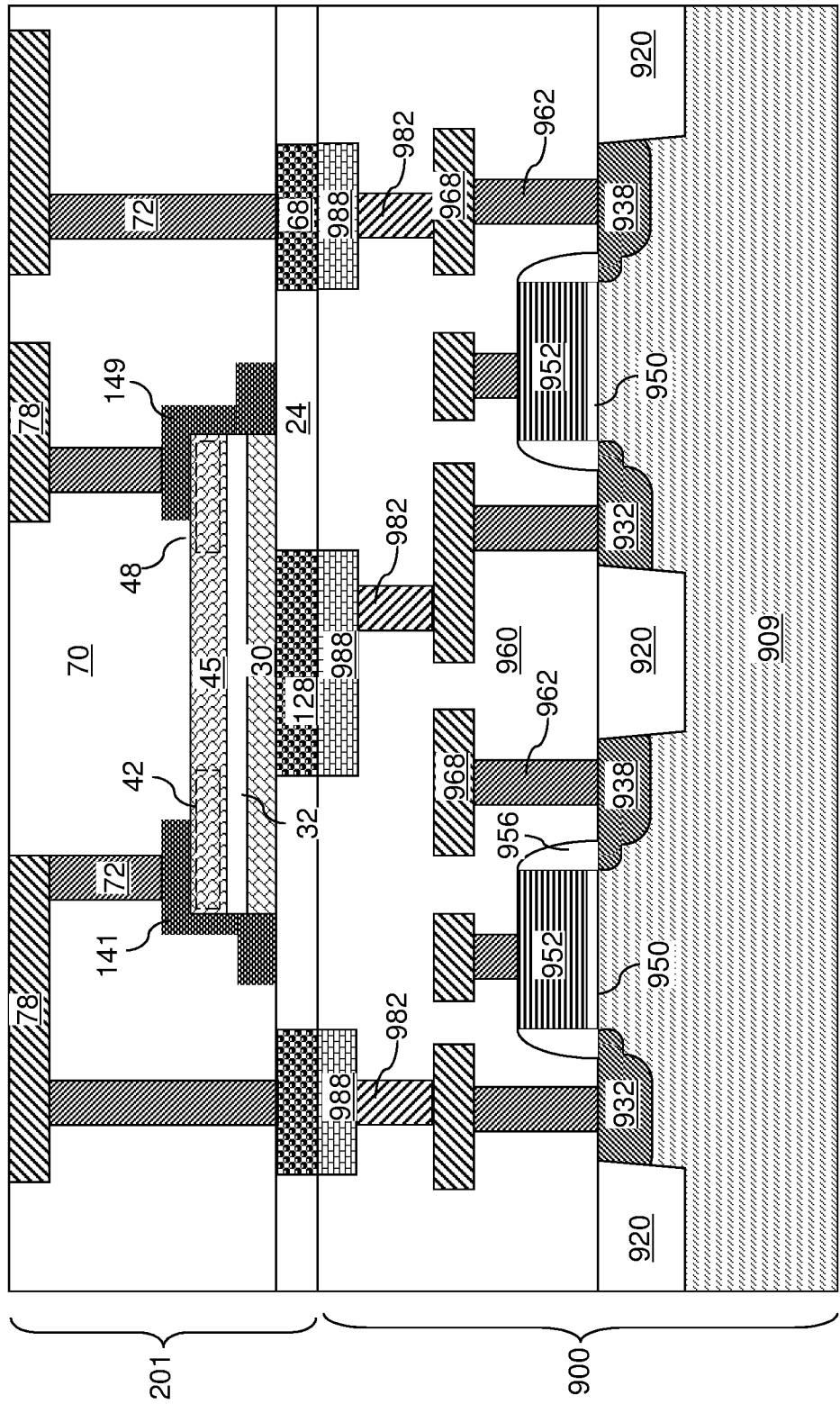
FIG. 36 is a vertical cross-sectional view of an alternative embodiment of the third exemplary structure after according to the third embodiment of the present disclosure.

Referring to FIG. 36, an alternative embodiment of the third exemplary structure can be derived from the third exemplary structure of FIG. 34 by forming a source-contact metallic structure 141 and a drain-contact metallic structure 149. The source-contact metallic structure 141 and the drain-contact metallic structure 149 may comprise a metallic material such as TiN, TaN, or WN, and they may be formed by depositing and patterning the metallic material. For example, a physical vapor deposition process may be employed to deposit the metallic material of the source-contact metallic structure 141 and the drain-contact metallic structure 149. The metallic material can be subsequently patterned to provide the source-contact metallic structure 141 and the drain-contact metallic structure 149. The thickness of the horizontally-extending portions of the source-contact metallic structure 141 and the drain-contact metallic structure 149 maybe in a range from 10 nm to 200 nm, such as from 20 nm to 100 nm, although lesser and greater thicknesses may also be employed.

Referring to FIG. 37, a fourth exemplary structure is illustrated, which may be the same as the third exemplary structure illustrated in FIG. 27. The fourth exemplary structure may comprise a first semiconductor die 201.

Referring to FIG. 38, the electrically conductive gate electrode 128 surrounded the gate-electrode-level dielectric layer 24 is formed as described above using a damascene or non-damascene process.

Referring to FIG. 39, the first semiconductor die 201 of FIG. 38 can be attached to a support comprising the handle substrate 600. In one embodiment, that handle substrate 600 may comprise, and/or may consist of, a handle substrate material layer 608, as described above. The first a semiconductor die 201 may be attached to the handle substrate 600 by dielectric-to-dielectric bonding, by dielectric-to-semiconductor bonding, or by dielectric-to-metal bonding.

Referring to FIG. 40, the processing steps of FIG. 11 may be performed with any needed changes to detach the single crystalline carrier substrate 10L from the single crystalline III-nitride compound semiconductor material layer 20L. As discussed above, a laser lift-off process or a sacrificial material etching process may be employed to separate the single crystalline III-nitride compound semiconductor material layer 20L from the carrier substrate 10L.

Figure 41:
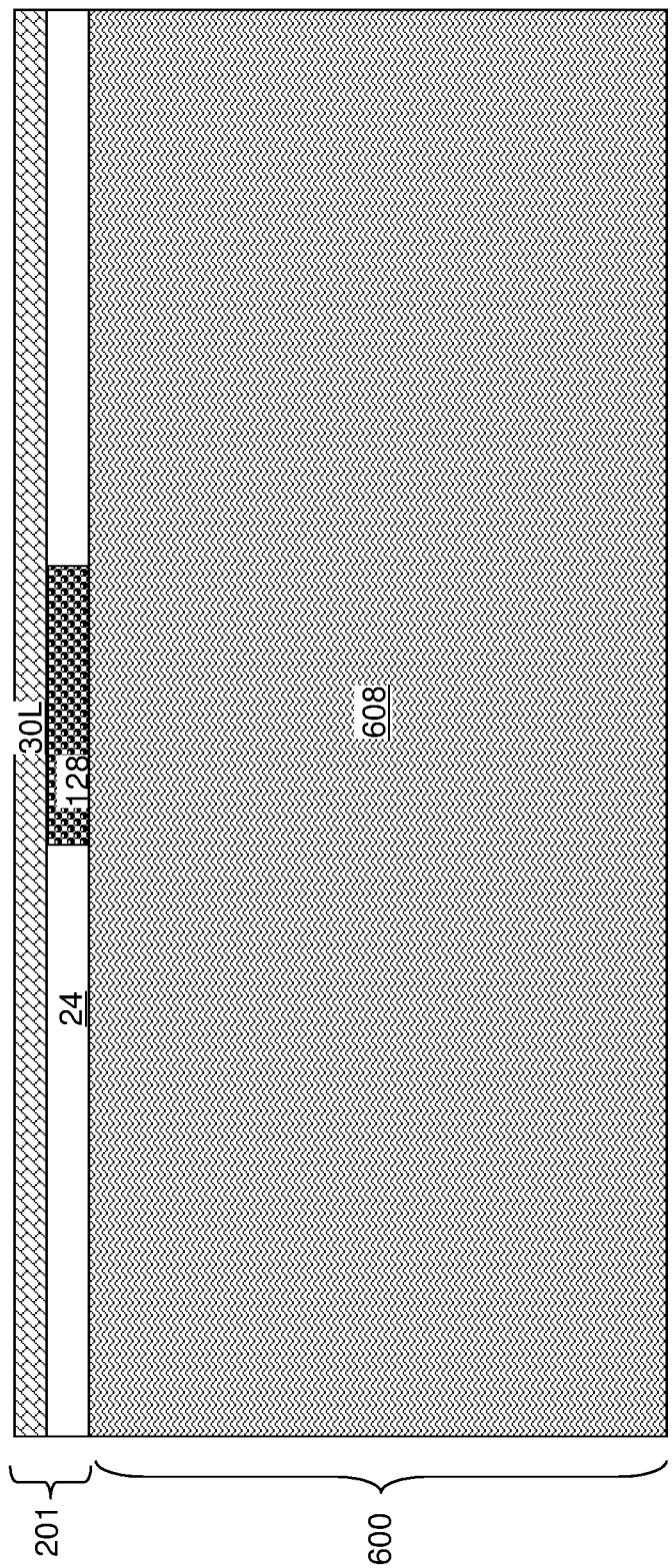
FIG. 41 is a vertical cross-sectional view of the fourth exemplary structure after removal of the single crystalline III-nitride compound semiconductor material layer according to the fourth embodiment of the present disclosure.

Referring to FIG. 41, the single crystalline III-nitride compound a semiconductor material layer 20L and the optional single crystalline seed layer 29L (if present) can be removed selective to the single crystalline III-nitride ferroelectric layer 30L, as described above.

Referring to FIG. 42, the processing steps of FIG. 33 may be performed to deposit a gate dielectric layer 32 and an active region semiconductor material layer 40L. The material composition and the thickness of the gate dielectric layer 32 may be the same as in the third exemplary structure of FIG. 33. The material composition and the thickness of the active region semiconductor material layer 40L may be the same as in the third exemplary structure of FIG. 33.

Figure 43A:
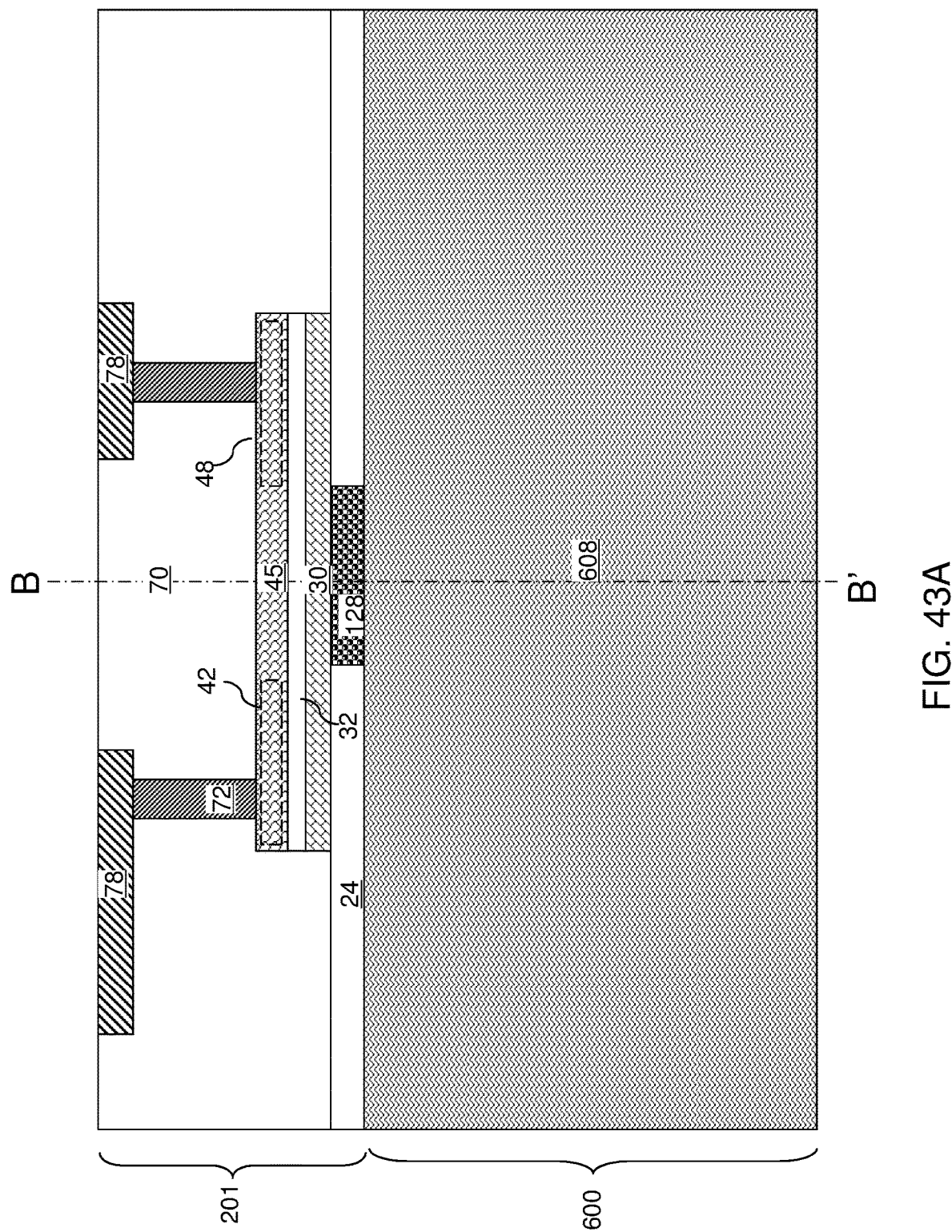
FIG. 43A is a vertical cross-sectional view of the fourth exemplary structure after formation of an active region, a gate dielectric, and a single crystalline III-nitride ferroelectric plate according to the fourth embodiment of the present disclosure.
Figure 43B:
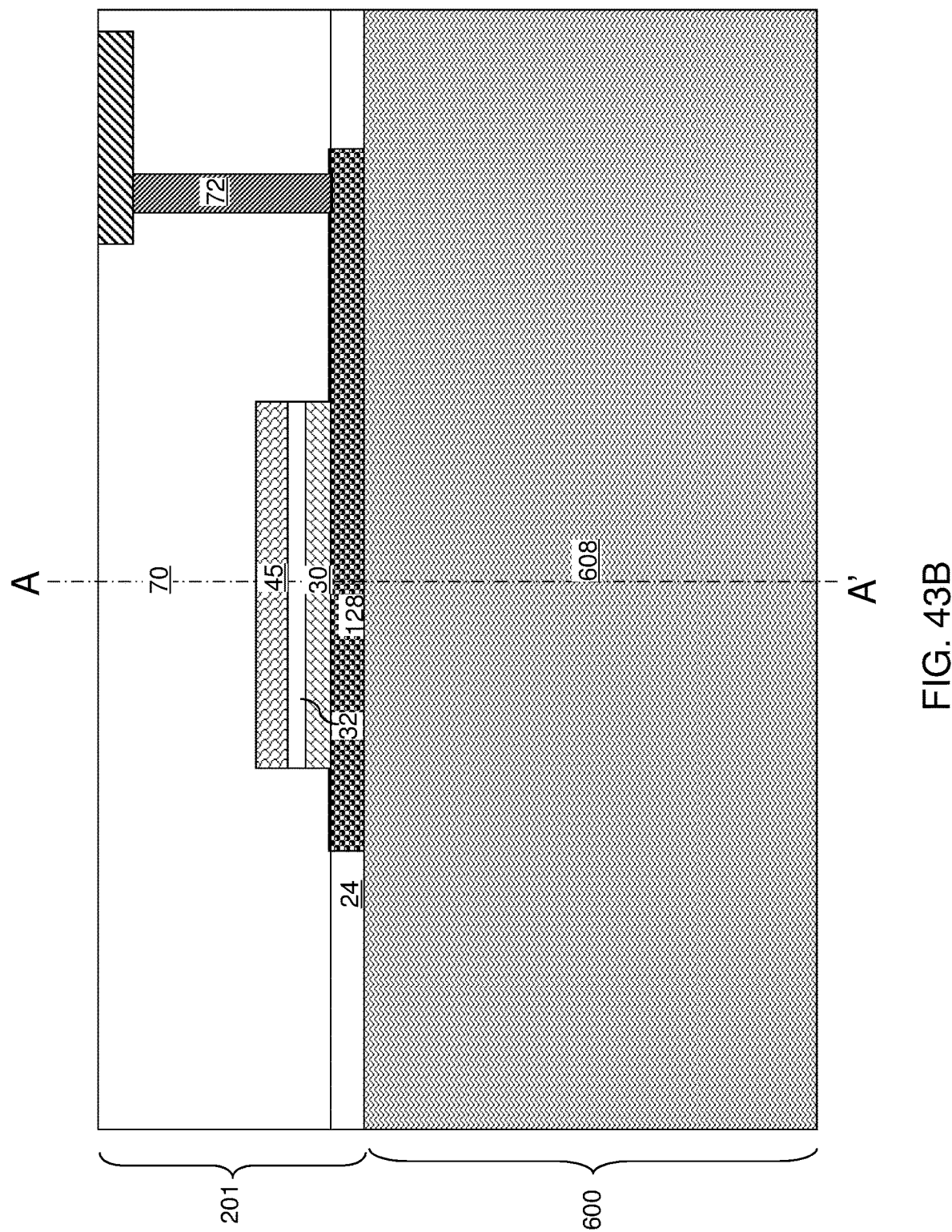
FIG. 43B is a vertical cross-sectional view of the fourth exemplary structure along the vertical plane B-B' of FIG. 43A.

Referring to FIGS. 43A-43B, the processing steps of FIG. 34 may be performed to pattern the combination of the active region semiconductor material layer 40L, the gate dielectric layer 32, and the single crystalline III-nitride ferroelectric layer 30L into a layer stack including, from top to bottom, an active region 40, a gate dielectric layer 32, and a single crystalline III-nitride ferroelectric plate 30. In one embodiment, sidewalls of the active region 40, sidewalls of the gate dielectric layer 32, and a sidewalls of the single crystalline III-nitride ferroelectric plate 30 may be vertically coincident with each other. In one embodiment, the sidewalls of the single crystalline III-nitride ferroelectric plate 30 are vertically coincident with sidewalls of the gate dielectric layer 32. In one embodiment, the sidewalls of the single crystalline III-nitride ferroelectric plate 30 are vertically coincident with sidewalls of the active region 40.

The source region 42 and the drain region 48 may be formed in the active region 40 as described above, such that the channel region 45 is located between the source and the drain regions. In one embodiment, a portion of the active region 40 having an areal overlap with the electrically conductive gate electrode 128 may comprise a channel region 45, and portions of the active region 40 that do not have an areal overlap with the electrically conductive gate electrode 128 may comprising the source region 42 and the drain region 48, as described above.

A dielectric material layer can be deposited over the layer stack of the single crystalline III-nitride ferroelectric plate 30, the gate dielectric layer 32, and the active region 40 to form a contact-level dielectric layer 70. The contact-level dielectric layer 70 may comprise a self-planarizing semiconductor material such as flowable oxide (FOX), or may comprise a planarizable dielectric material such as undoped silicate glass or a doped silicate glass. The contact-level dielectric layer 70 may be formed with a planar horizontal surface (for example, employing a spin coating process), or may be planarized to provide a planar horizontal surface (for example, by performing a CMP process). The distance between the planar horizontal surface of the contact-level dielectric layer 70 and the top surface of the active region 40 may be in a range from 100 nm to 1,000 nm, such as from 200 nm to 600 nm, although lesser and greater distances may also be employed.

Contact via structures 72 and metal lines 78 can be formed in the contact-level dielectric layer 70. For example, via cavities vertically extending through the contact-level dielectric layer 70 can be formed employing a combination of a first lithographic patterning process and a first anisotropic etch process, and line cavities adjoined to an upper portion of a respective via cavity may be formed employing a combination of a second lithographic patterning process and a second anisotropic etch process. At least one conductive material, such as at least one metallic material, can be deposited in the via cavities and the line cavities, and excess portions of the at least one conductive material can be removed from above the horizontal plane including the top surface of the contact-level dielectric layer 70. Each portion of the at least one conductive material filling a via cavity constitutes a contact via structure 72. Each portion of the at least one conductive material filling a line cavity constitutes a metal line 78. Contact via structures 72 and metal lines 78 may be formed in the contact-level dielectric layer 70. A contact via structure 72 can be embedded within the contact-level dielectric layer 70 and can contact a portion of the electrically conductive gate electrode 28 that laterally protrudes outside the area of the layer stack {30, 32, (42, 45, 48)} in a plan view, as shown in FIG. 43B.

Generally, the contact-level dielectric layer 70 laterally surrounds the layer stack {30, 32, (42, 45, 48)} overlying the gate-electrode-level dielectric layer 24. In one embodiment, the source region 42 and the drain region 48 are laterally spaced from each other along a first horizontal direction, and a lateral extent of the electrically conductive gate electrode 28 along the first horizontal direction is less than a lateral extent of the active region 40 along the first horizontal direction.

An electrically conductive gate electrode 28 can be embedded within the gate-electrode-level dielectric layer 24. In one embodiment, the layer stack includes a single crystalline III-nitride ferroelectric plate 30, a gate dielectric layer 32, and an active region (42, 48, 45) and overlies the electrically conductive gate electrode 28. In one embodiment, the active region (42, 48, 45) contains a source region 42, a drain region 48, and a channel region 45 extending between the source region 42 and the drain region 48. A support (e.g., handle substrate 600) is bonded to the gate-electrode-level dielectric layer 24.

Figure 44:
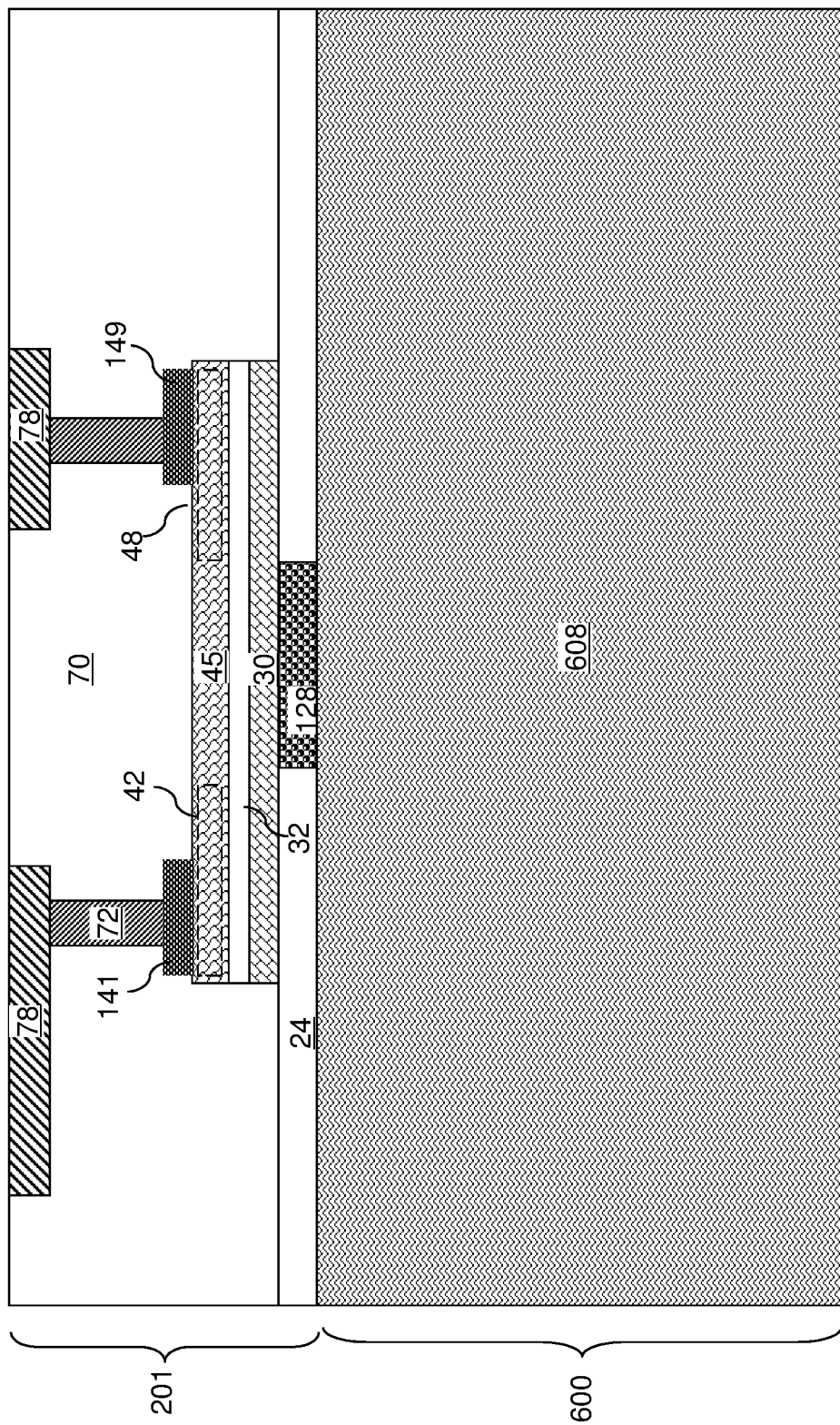
FIG. 44 is a vertical cross-sectional view of an alternative embodiment of the fourth exemplary structure.

Referring to FIG. 44, an alternative embodiment of the fourth exemplary structure can be derived from the third exemplary structure of FIGS. 43A and 43B by forming a source-contact metallic structure 141 and a drain-contact metallic structure 149 prior to formation of the contact-level dielectric layer 70. The source-contact metallic structure 141 and the drain-contact metallic structure 149 may comprise a metallic material such as TiN, TaN, or WN, and it may be formed by depositing and patterning the metallic material. For example, a physical vapor deposition process may be employed to deposit the metallic material of the source-contact metallic structure 141 and the drain-contact metallic structure 149. The metallic material can be subsequently patterned to provide the source-contact metallic structure 141 and the drain-contact metallic structure 149. The thickness of the horizontally-extending portions of the source-contact metallic structure 141 and the drain-contact metallic structure 149 maybe in a range from 10 nm to 200 nm, such as from 20 nm to 100 nm, although lesser and greater thicknesses may also be employed.

Referring to FIGS. 27-44 and according to various embodiments of the present disclosure, a semiconductor structure comprises an electrically conductive gate electrode 28 embedded within a gate-electrode-level dielectric layer 24, a layer stack including a single crystalline III-nitride ferroelectric plate 30, a gate dielectric layer 32, and an active region (42, 45, 48) overlying the electrically conductive gate electrode 28 and containing a source region 42, a drain region 48, and a channel region 45 extending between the source region 42 and the drain region 48, and a support (600 or 900) bonded to the gate-electrode-level dielectric layer 24.

In one embodiment, sidewalls of the single crystalline III-nitride ferroelectric plate 30 are vertically coincident with sidewalls of the gate dielectric layer 32. In one embodiment, the sidewalls of the single crystalline III-nitride ferroelectric plate 30 are vertically coincident with sidewalls of the active region (42, 45, 48).

In one embodiment, the source region 42 and the drain region 48 are laterally spaced from each other along a first horizontal direction, and a lateral extent of the electrically conductive gate electrode 28 along the first horizontal direction is less than a lateral extent of the active region (42, 45, 48) along the first horizontal direction.

In one embodiment, the single crystalline III-nitride ferroelectric plate 30 consists essentially of a single crystalline Wurtzite ferroelectric material comprising aluminum scandium nitride or aluminum boron nitride. In one embodiment, the single crystalline Wurtzite ferroelectric material consists essentially of aluminum scandium nitride having a formula $Al_{1-x}Sc_xN$, where $0.15<x<0.5$.

In one embodiment, the semiconductor structure comprises first bonding pads 68 embedded in the gate-electrode-level dielectric layer 24, wherein the support comprises a semiconductor die 900 containing: semiconductor devices located on a semiconductor substrate 909; and second bonding pads 988 embedded in dielectric material layers (such as interconnect-level dielectric material layers 960) located over the semiconductor devices and bonded to the first bonding pads 68.

In one embodiment, the gate-electrode-level dielectric layer 24 is in direct contact with the dielectric material layers (such as the interconnect-level dielectric material layers 960) and comprises a horizontal surface located within a horizontal plane including bonding interfaces between the first bonding pads 68 and the second bonding pads 988. In one embodiment, the semiconductor die 900 contains an additional second bonding pad 988 that is bonded to the electrically conductive gate electrode 28. In one embodiment, the additional second bonding pad 988 is electrically connected to one of the semiconductor devices in the semiconductor die 900 through a subset of metal interconnect structures (962, 968, 982) embedded within the dielectric material layers.

In one embodiment, the semiconductor structure comprises a contact-level dielectric layer 70 laterally surrounding the layer stack {30, 32, (42, 45, 48)} and overlying the gate-electrode-level dielectric layer 24, wherein one of the first bonding pads 68 is electrically connected to one of the source region 42 and the drain region 48 via a subset of metal interconnect structures (962, 968, 982) embedded within the contact-level dielectric layer 70.

In one embodiment, the active region (42, 45, 48) comprises a polycrystalline or amorphous semiconductor material. In one embodiment, the support comprises a handle substrate 600 that is bonded to the gate-electrode-level dielectric layer 24.

In one embodiment, the semiconductor structure comprises: a contact-level dielectric layer 70 laterally surrounding the layer stack and overlying the gate-electrode-level dielectric layer 24, and a contact via structure 72 embedded within the contact-level dielectric layer 70 and contacting a portion of the electrically conductive gate electrode 28 that laterally protrudes outside an area of the layer stack {30, 32, (42, 45, 48)} in a plan view, i.e., a see-though view along the vertical direction.

While the figures of the present disclosure illustrate single instance of a ferroelectric memory device (i.e., ferroelectric memory transistor) for each embodiment, it is understood that multiple instances, such as millions or billions of instances, of such ferroelectric memory devices may be manufactured on a same substrate or within a same semiconductor die.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A semiconductor structure, comprising:
an electrically conductive gate electrode embedded within a gate-electrode-level dielectric layer;
a layer stack including a single crystalline III-nitride ferroelectric plate, a gate dielectric layer, and an active region overlying the electrically conductive gate electrode, wherein the active region contains a source region, a drain region, and a channel region extending between the source region and the drain region;
first bonding pads embedded in the gate-electrode-level dielectric layer; and
a support bonded to the gate-electrode-level dielectric layer, wherein the support comprises a semiconductor die containing:
semiconductor devices; and second bonding pads embedded in dielectric material layers located over the semiconductor devices and bonded to the first bonding pads.

2. The semiconductor structure of claim 1, wherein sidewalls of the single crystalline III-nitride ferroelectric plate are vertically coincident with sidewalls of the gate dielectric layer.

3. The semiconductor structure of claim 2, wherein the sidewalls of the single crystalline III-nitride ferroelectric plate are vertically coincident with sidewalls of the active region.

4. The semiconductor structure of claim 1, wherein:
the source region and the drain region are laterally spaced from each other along a first horizontal direction; and
a lateral extent of the electrically conductive gate electrode along the first horizontal direction is less than a lateral extent of the active region along the first horizontal direction.

5. The semiconductor structure of claim 1, wherein the single crystalline III-nitride ferroelectric plate consists essentially of a single crystalline Wurtzite ferroelectric material comprising aluminum scandium nitride or aluminum boron nitride.

6. The semiconductor structure of claim 5, wherein the single crystalline Wurtzite ferroelectric material consists essentially of aluminum scandium nitride having a formula $A_{1-x}Sc_xN$, where $0.15<x<0.5$.

7. The semiconductor structure of claim 1, wherein the gate-electrode-level dielectric layer is in direct contact with the dielectric material layers and comprises a horizontal surface located within a horizontal plane including bonding interfaces between the first bonding pads and the second bonding pads.

8. The semiconductor structure of claim 7, wherein the semiconductor die contains an additional second bonding pad that is bonded to the electrically conductive gate electrode.

9. The semiconductor structure of claim 8, wherein the additional second bonding pad is electrically connected to one of the semiconductor devices in the semiconductor die through a subset of metal interconnect structures embedded within the dielectric material layers.

10. The semiconductor structure of claim 1, further comprising a contact-level dielectric layer laterally surrounding the layer stack and overlying the gate-electrode-level dielectric layer, wherein one of the first bonding pads is electrically connected to one of the source region and the drain region via a subset of metal interconnect structures embedded within the contact-level dielectric layer.

11. The semiconductor structure of claim 1, wherein the active region comprises a polycrystalline or amorphous semiconductor material.

12. A semiconductor structure, comprising:
an electrically conductive gate electrode embedded within a gate-electrode-level dielectric layer;
a layer stack including a single crystalline III-nitride ferroelectric plate, a gate dielectric layer, and an active region overlying the electrically conductive gate electrode, wherein the active region contains a source region, a drain region, and a channel region extending between the source region and the drain region;
a support bonded to the gate-electrode-level dielectric layer, wherein the support comprises a handle substrate that is bonded to the gate-electrode-level dielectric layer;
a contact-level dielectric layer laterally surrounding the layer stack and overlying the gate-electrode-level dielectric layer; and
a contact via structure embedded within the contact-level dielectric layer and contacting a portion of the electrically conductive gate electrode that laterally protrudes outside an area of the layer stack in a plan view.

13. The semiconductor structure of claim 12, wherein sidewalls of the single crystalline III-nitride ferroelectric plate are vertically coincident with sidewalls of the gate dielectric layer.

14. The semiconductor structure of claim 13, wherein the sidewalls of the single crystalline III-nitride ferroelectric plate are vertically coincident with sidewalls of the active region.

15. The semiconductor structure of claim 12, wherein:
the source region and the drain region are laterally spaced from each other along a first horizontal direction; and
a lateral extent of the electrically conductive gate electrode along the first horizontal direction is less than a lateral extent of the active region along the first horizontal direction.

16. The semiconductor structure of claim 12, wherein the single crystalline III-nitride ferroelectric plate consists essentially of a single crystalline Wurtzite ferroelectric material comprising aluminum scandium nitride or aluminum boron nitride.

17. The semiconductor structure of claim 16, wherein the single crystalline Wurtzite ferroelectric material consists essentially of aluminum scandium nitride having a formula $A_{1-x}Sc_xN$, where $0.15<x<0.5$.

* * * * *